United States Patent
Im et al.

(10) Patent No.: US 12,058,898 B2
(45) Date of Patent: Aug. 6, 2024

(54) DISPLAY DEVICE HAVING BANK WITH MAIN OPENING AND SUB-OPENINGS

(71) Applicant: Samsung Display Co., Ltd., Yongin-si (KR)

(72) Inventors: Hyun Deok Im, Seoul (KR); Jong Hyuk Kang, Suwon-si (KR); Buem Joon Kim, Hwaseong-si (KR); Eun A Cho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 368 days.

(21) Appl. No.: 17/493,714

(22) Filed: Oct. 4, 2021

(65) Prior Publication Data

US 2022/0130928 A1    Apr. 28, 2022

(30) Foreign Application Priority Data

Oct. 22, 2020    (KR) .......................... 10-2020-0137343

(51) Int. Cl.
*H10K 59/123* (2023.01)
*H10K 59/122* (2023.01)

(52) U.S. Cl.
CPC ......... *H10K 59/123* (2023.02); *H10K 59/122* (2023.02)

(58) Field of Classification Search
CPC ........................... H10K 59/123; H10K 59/122
USPC .......................................................... 257/79
See application file for complete search history.

(56) References Cited

U.S. PATENT DOCUMENTS

| | | | |
|---|---|---|---|
| 10,367,123 B2 | 7/2019 | Im et al. | |
| 10,580,946 B2 | 3/2020 | Im et al. | |
| 10,944,029 B2 | 3/2021 | Im et al. | |
| 2009/0079330 A1 | 3/2009 | Koyama | |
| 2020/0152835 A1* | 5/2020 | Ko | .......... G09G 3/3233 |
| 2021/0193885 A1 | 6/2021 | Im et al. | |
| 2021/0320231 A1 | 10/2021 | Kim et al. | |

(Continued)

FOREIGN PATENT DOCUMENTS

| | | |
|---|---|---|
| KR | 10-2004-0081783 A | 9/2004 |
| KR | 10-2007-0121829 A | 12/2007 |
| KR | 10-1490758 B1 | 2/2015 |

(Continued)

*Primary Examiner* — Xia L Cross
(74) *Attorney, Agent, or Firm* — Lewis Roca Rothgerber Christie LLP

(57) ABSTRACT

A display device includes: a substrate; a bank having a first main opening and sub-openings extending from the first main opening; a first electrode and a second electrode on the first substrate and being spaced apart from each other in a first direction and extending in a second direction; a plurality of light-emitting elements on the first electrode and the second electrode and being spaced apart from each other in the second direction; a first connection electrode on the first electrode and contacting first ends of the light-emitting elements; and a second connection electrode on the second electrode and contacting second ends of the light-emitting elements. The first connection electrode is connected to the first electrode through a first contact, and the second connection electrode is connected to the second electrode through a second contact on the second electrode. The first contact and the second contact overlap the sub-openings.

23 Claims, 31 Drawing Sheets

(56) References Cited

U.S. PATENT DOCUMENTS

2021/0375194 A1  12/2021  Kwag et al.

FOREIGN PATENT DOCUMENTS

| KR | 10-2017-0101334 A | 9/2017 |
| KR | 10-2018-005021 A | 5/2018 |
| KR | 10-2020-0013824 A | 2/2020 |
| KR | 10-2020-0042075 A | 4/2020 |
| KR | 10-2020-0053726 A | 5/2020 |
| KR | 10-2020-0088946 A | 7/2020 |

* cited by examiner

DISPLAY DEVICE HAVING BANK WITH MAIN OPENING AND SUB-OPENINGS

CROSS-REFERENCE TO RELATED APPLICATION

This application claims priority to and the benefit of Korean Patent Application No. 10-2020-0137343, filed in the Korean Intellectual Property Office on Oct. 22, 2020, the entire disclosure of which is incorporated herein by reference.

BACKGROUND

1. Field

Aspects of embodiments of the present disclosure relate to a display device.

2. Description of the Related Art

Display devices are becoming more and more important as multimedia technology evolves. Accordingly, a variety of types of display devices, such as organic light-emitting diode (OLED) display (often referred to as an organic light-emitting display) devices and liquid-crystal display (LCD) devices, are currently used.

Display devices display images and include a display panel, such as an organic light-emitting display panel or a liquid-crystal display panel. Among them, light-emitting display panel may include light-emitting elements. For example, light-emitting diodes (LEDs) may include an organic light-emitting diode using an organic material as a fluorescent material, and an inorganic light-emitting diode using an inorganic material as a fluorescent material.

SUMMARY

Embodiments of the present disclosure provide a display device that can prevent or substantially prevent light-emitting elements from deviating from an emission area during the process of aligning the light-emitting elements.

Embodiments of the present disclosure also provide a display device that can prevent or substantially prevent connection electrodes connected to electrodes from being disconnected or deposited improperly due to a level difference of a bank.

It should be noted that aspects and features of the present disclosure are not limited to those mentioned above, and other aspects and features of the present disclosure will be apparent to those skilled in the art from the following descriptions.

According to embodiments of the present disclosure, contacts where electrodes and connection electrodes are connected with each other are located outside an emission area of a display device and a metal layer is formed on the contacts so that an ink containing light-emitting elements does not spread out of the emission area onto the contacts. In this manner, it is possible to prevent or substantially prevent deviation of the light-emitting elements.

In addition, according to embodiments of the present disclosure, a bank having sub-openings extending (e.g., extended) from a main opening, which defines an emission area, are formed in a display device so that it is possible to prevent or substantially prevent a connection electrode from being disconnected or deposited improperly due to a level difference of the relatively thick bank.

It should be noted that aspects and features of the present disclosure are not limited to those described above and other aspects and features of the present disclosure will be apparent to those skilled in the art from the following descriptions.

According to an embodiment of the disclosure, the display device includes: a first substrate, a bank on the first substrate and having a first main opening defining an emission area and a plurality of sub-openings extending from the first main opening, a first electrode and a second electrode spaced apart from each other in a first direction and extending in a second direction on the first substrate, a plurality of light-emitting elements on the first electrode and the second electrode and spaced apart from each other (e.g., spaced apart from one another) in the second direction, a first connection electrode on the first electrode and contacting first ends of the light-emitting elements, and a second connection electrode on the second electrode and contacting second ends of the light-emitting elements. The first connection electrode is connected to the first electrode through a first contact on the first electrode, and the second connection electrode is connected to the second electrode through a second contact on the second electrode. The first contact and the second contact overlap the plurality of sub-openings.

In an embodiment, the plurality of sub-openings may include a first sub-opening overlapping the first contact and a second sub-opening overlapping the second contact.

In an embodiment, a width of the first sub-opening may be equal to or less than a width of the first electrode, and a width of the second sub-opening may be equal to or less than a width of the second electrode.

In an embodiment, the display device may further include: a first metal layer overlapping the first sub-opening and being between the first electrode and the first connection electrode; and a second metal layer overlapping the second sub-opening and being between the second electrode and the second connection electrode.

In an embodiment, a width of the first sub-opening may be equal to or less than a width of the first metal layer, and a width of the second sub-opening may be equal to or less than a width of the second metal layer.

In an embodiment, the display device may further include a first insulating layer between the first electrode and the first connection electrode and being between the second electrode and the second connection electrode. The first insulating layer may have a first contact opening overlapping the first sub-opening and exposing the first electrode and a second contact opening overlapping the second sub-opening and exposing the second electrode.

In an embodiment, the first metal layer and the first contact opening may overlap each other and may have a same width, and the second metal layer and the second contact opening may overlap each other and may have a same width.

In an embodiment, a width of the first contact may be equal to or less than the width of the first sub-opening, the width of the first metal layer, and a width of the first contact opening, and a width of the second contact may be equal to or less than the width of the second sub-opening, the width of the second metal layer, and a width of the second contact opening.

In an embodiment, each of the plurality of sub-openings may have a first region contacting the first main opening and a second region extending from the first region.

In an embodiment, a width of the first region may be smaller than a width of the second region.

In an embodiment, a width of the first region may be equal to or less than a width of the first electrode or the second electrode.

In an embodiment, the display device may further include a first connection opening spaced apart from the first main opening in the second direction and being between the first sub-opening and the second sub-opening to connect the first sub-opening with the second sub-opening.

In an embodiment, the first connection opening may be between the first contact and the second contact and may overlap neither the first contact nor the second contact.

According to an embodiment of the disclosure, a display device includes: a first substrate, a first electrode and a second electrode spaced apart from each other in a first direction and extending in a second direction on the first substrate, a plurality of light-emitting elements on the first electrode and the second electrode and spaced apart from each other in the second direction, a first connection electrode on the first electrode and contacting first ends of the light-emitting elements, a second connection electrode on the second electrode and contacting second ends of the light-emitting elements, a first metal layer between the first electrode and the first connection electrode and contacting each of the first electrode and the first connection electrode, and a second metal layer between the second electrode and the second connection electrode and contacting each of the second electrode and the second connection electrode.

In an embodiment, the first metal layer may overlap a first contact connecting the first electrode with the first connection electrode, and the second metal layer may overlap a second contact connecting the second electrode with the second connection electrode.

In an embodiment, the display device may further include a bank on the first substrate and having a first main opening defining an emission area and a plurality of sub-openings extending from the first main opening.

In an embodiment, the plurality of sub-openings may not overlap the emission area and may overlaps the first metal layer and the second metal layer.

In an embodiment, the bank may have a second main opening spaced apart from the first main opening in the second direction, and at least one of the plurality of sub-openings may connect the first main opening with the second main opening.

According to an embodiment of the disclosure, a display device includes: a first substrate, a first electrode and a second electrode on the first substrate, spaced apart from each other in a first direction, and extending in a second direction, a third electrode spaced apart from the first electrode and the second electrode in the second direction and being between the first electrode and the second electrode, a fourth electrode spaced apart from the first electrode in the first direction, a bank on the first substrate and having a first main opening defining an emission area and a plurality of sub-openings extending from the first main opening, light-emitting elements including a first light-emitting element having opposite ends thereof on the first electrode and the third electrode, respectively, and a second light-emitting element having one end on the second electrode, a first connection electrode on the first electrode and contacting the first light-emitting element, and a second connection electrode on the second electrode and contacting the second light-emitting element, and a third connection electrode on the third electrode and contacting the first light-emitting element. The first connection electrode is connected to the first electrode through a first contact on the first electrode, the second connection electrode is the second electrode through a second contact on the second electrode, and a third connection electrode is connected to the third electrode through a third contact on the third electrode and a fourth contact on the fourth electrode. The second contact, the third contact, and the fourth contact overlap the plurality of sub-openings.

In an embodiment, the plurality of sub-openings may not overlap the emission area and may have a first sub-opening overlapping the second contact, a second sub-opening overlapping the third contact, a fourth sub-opening overlapping the fourth contact, and a third sub-opening spaced apart from the first contact.

In an embodiment, the bank may have a second main opening spaced apart from the first main opening in the second direction, and the first contact may be located in the second main opening.

In an embodiment, the third sub-opening and the fourth sub-opening may continuously connect the first main opening with the second main opening.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
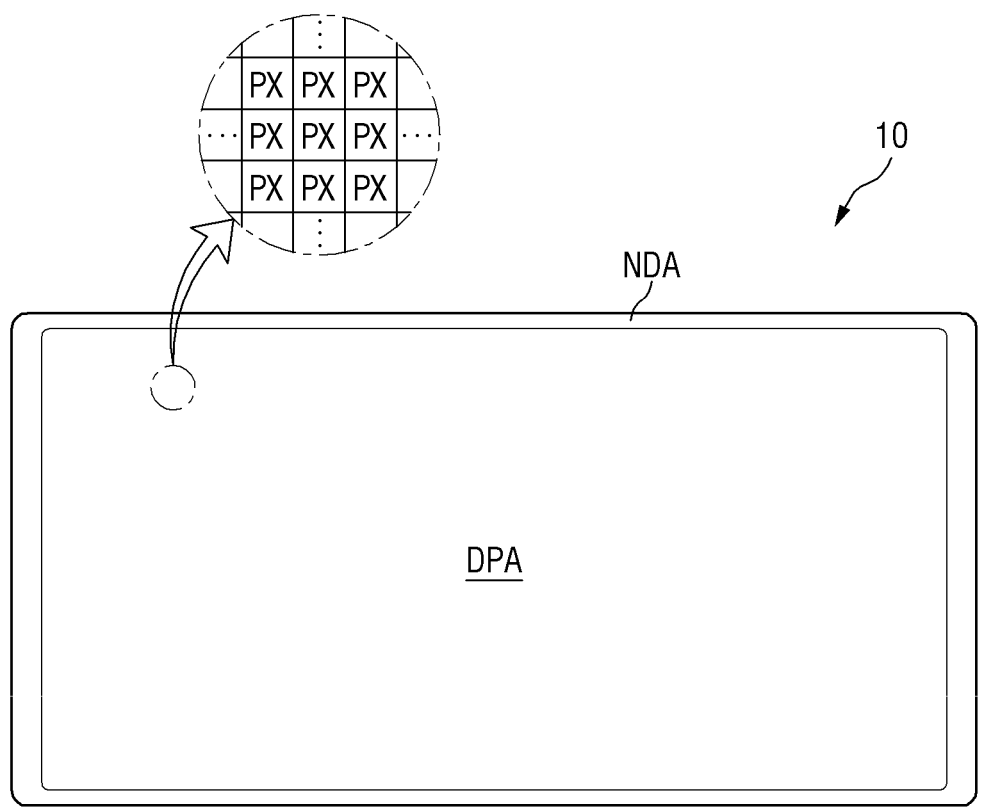
FIG. 1 is a plan view of a display device according to an embodiment of the present disclosure.
Figure 1:
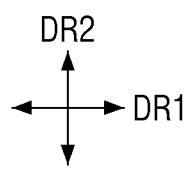

The present disclosure will now be described more fully hereinafter with reference to the accompanying drawings, in which example embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

The same reference numbers indicate the same components throughout the specification. In the figures, dimensions of the various elements, layers, etc. may be exaggerated for clarity of illustration. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that, although the terms "first," "second," etc. may be used herein to describe various elements, these elements should not be limited by these terms. These terms are used to distinguish one element from another element. For instance, a first element discussed below could be termed a second element without departing from the teachings of the present disclosure. Similarly, the second element could be termed the first element.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

FIG. 1 is a plan view of a display device according to an embodiment of the present disclosure.

Referring to FIG. 1, the display device 10 can display a moving image or a still image. The display device 10 may refer to any electronic device that provides (or includes) a display screen. For example, the display device 10 may be a television set, a laptop computer, a monitor, an electronic billboard, an Internet of Things (IoT) device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, the display device 10 is an inorganic light-emitting diode display panel as an example of, but the present disclosure is not limited thereto. Any other display panel may be employed as long as the technical idea of the present disclosure can be equally applied thereto.

The shape of the display device 10 may be modified in a variety of ways. For example, the display device 10 may have shapes, such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 shows the display device 10 in the shape of a rectangle with longer horizontal sides and the display area DPA being similar to the shape of the display device 10.

The display device 10 may include the display area DA and a non-display area NDA. In Images can be displayed in the display area DPA. Images are not displayed in the non-display area NDA. The display area DPA may be referred to as an active area, while the non-display area NDA may also be referred to as an inactive area. The display area DPA may generally occupy the center of the display device 10.

The display area DPA may include a plurality of pixels PX. The plurality of pixels PX may be arranged in a matrix. The shape of each pixel PX may be, but is not limited to, a rectangle or a square when viewed from the top. Each pixel may have a diamond shape having sides inclined with respect to a direction. The pixels PX may, however, be arranged in stripes and PenTile® (a registered trademark of Samsung Display Co., Ltd.) (also referred to as an RGBG pattern) pattern. Each of the pixels PX may include at least one light-emitting diode ED that emits light of a particular wavelength band to represent a color.

The non-display area NDA may be disposed around (e.g., may extend around) the display area DPA. The non-display area NDA may entirely or partially surround (e.g., may extend around a periphery of) the display area DPA. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in the non-display area NDA, or external devices may be mounted thereto.

Figure 2:
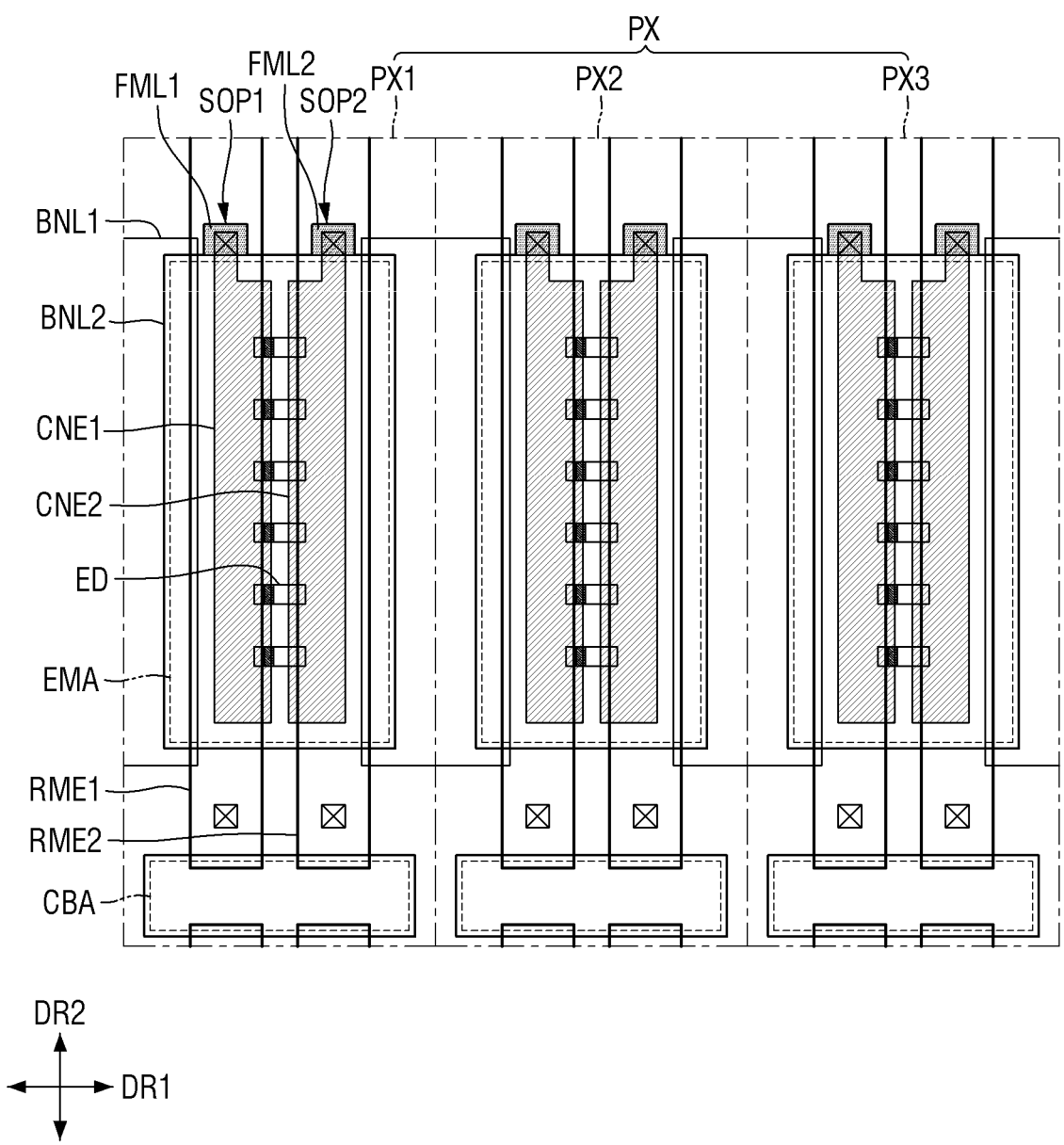
FIG. 2 is a plan view showing a pixel of a display device according to an embodiment of the present disclosure.

FIG. 2 is a plan view showing a pixel of a display device according to an embodiment of the present disclosure.

Referring to FIG. 2, each of the plurality of pixels PX may include a plurality of sub-pixels PXn, where n is an integer from one to three (or more). For example, a pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the present disclosure is not limited thereto. In another embodiment, all the sub-pixels PXn may emit light of the same color. For example, the sub-pixels PXn may emit light of the same color (e.g., blue light). Although the pixel PX includes three sub-pixels PXn in the example shown in FIG. 2, the present disclosure is not limited thereto. The pixel PX may include more than two sub-pixels PXn without limitation.

Each of the sub-pixels PXn of the display device 10 may include an emission area EMA and a non-emission area. In the emission area EMA, the light-emitting diodes ED may be disposed to emit light of a particular wavelength. In the non-emission area, no light-emitting diode ED is disposed and light emitted from the light-emitting diodes ED does not reach and, thus, no light exits from the non-emission area. The emission area may include an area in which the light-emitting diodes ED are disposed and may include an area adjacent to the light-emitting diodes ED where light emitted from the light-emitting diodes ED exits.

It is, however, to be understood that the present disclosure is not limited thereto. The emission area may also include an area in which light emitted from the light-emitting diodes ED is reflected or refracted by other elements to exit. The plurality of light-emitting diodes ED may be disposed in each of the sub-pixels PXn, and the emission area may include the area where the light-emitting elements are disposed and the adjacent area.

Each of the sub-pixels PXn may further include a cut area CBA in the non-emission area. The cut area CBA may be at on one side of the emission area EMA in the second direction DR2. The cut area CBA may be between the emission areas EMA of neighboring sub-pixels PXn in the second direction DR2. For example, in the display area DPA of the display device 10, a plurality of emission areas EMA and cut areas CBA may be arranged. For example, the plurality of emission areas EMA and the cut areas CBA may be arranged repeatedly in the first direction DR1 and may be arranged alternately in the second direction DR2. A second bank BNL2 may be disposed between the cut areas CBA and the emission areas EMA, and the distance between them may vary depending on the width of the second bank BNL2. No light-emitting diode ED is disposed in the cut area CBA and, thus, no light exits therefrom. The electrodes RME1 and RME2 disposed in each of the sub-pixels PXn may be partially disposed in the cut area CBA. The electrodes RME1 and RME2 disposed in some of the sub-pixels PXn may be disposed separately from one another in (e.g., may be separated from each other by) the cut area CBA. It is, however, to be understood that the present disclosure is not limited thereto. The electrodes RME1 and RME2 may not be disposed separately in the cut area CBA. In addition, the electrodes RME1 and RME2 may be separated from one another in the emission area EMA.

Figure 3:
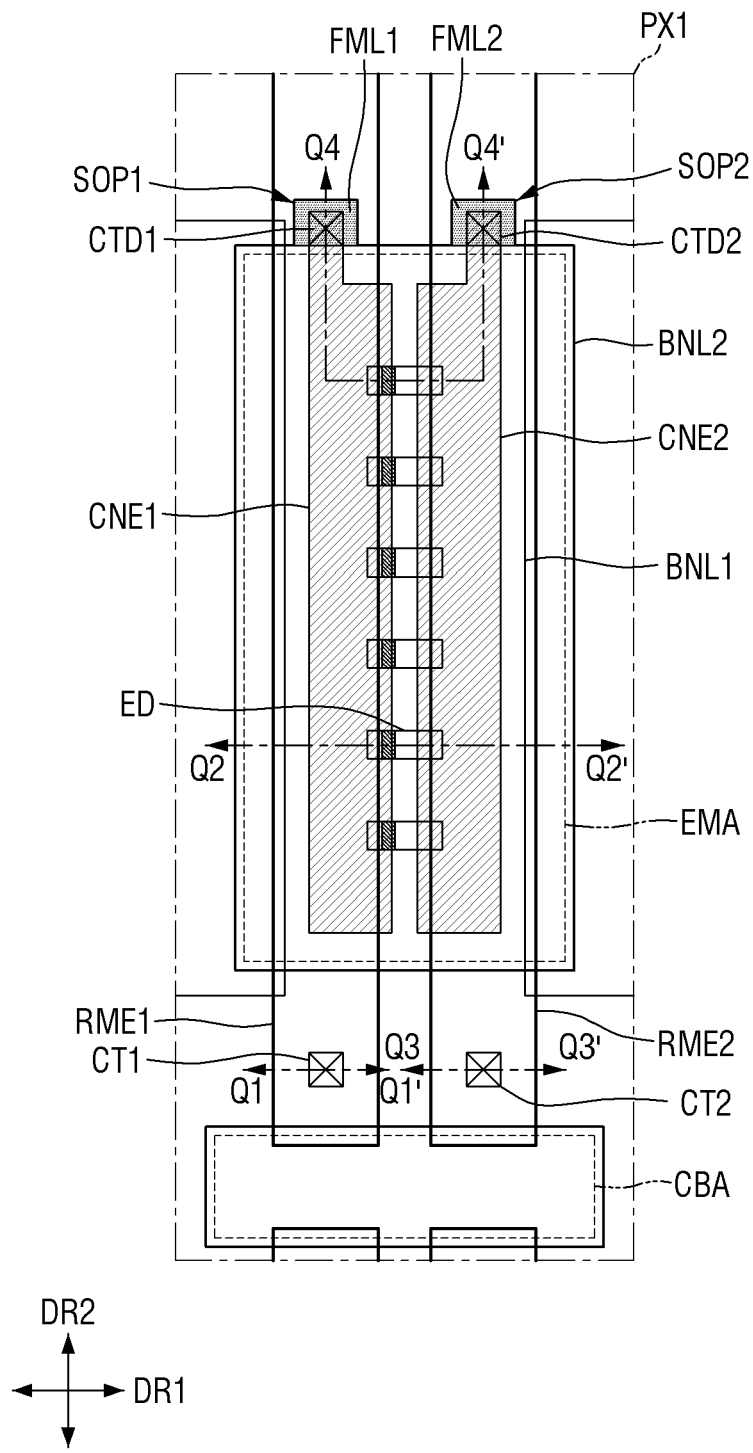
FIG. 3 is a plan view showing a first sub-pixel shown in FIG. 2.
Figure 4:
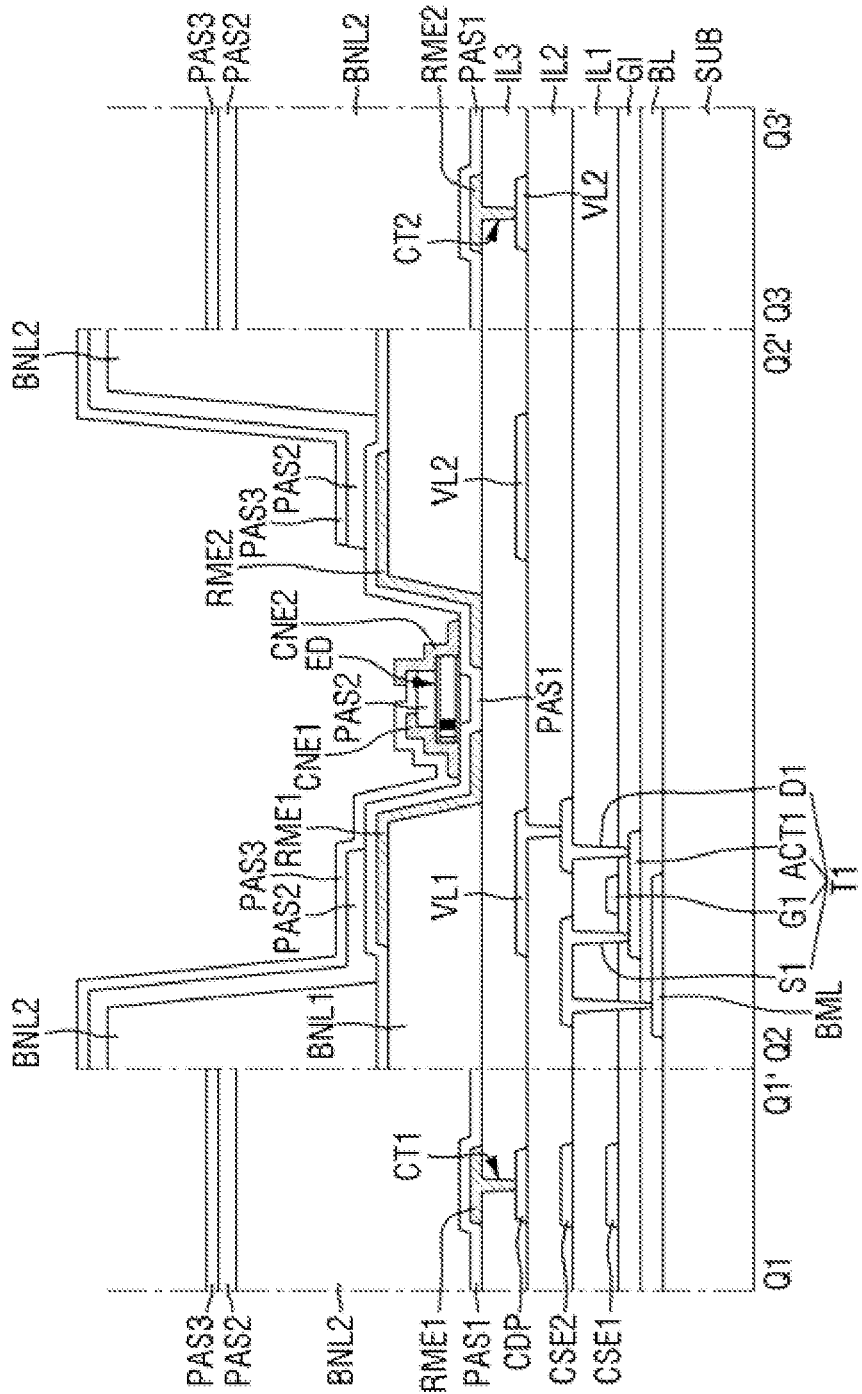
FIG. 4 is a cross-sectional view taken along the lines Q1-Q1', Q2-Q2', and Q3-Q3' of FIG. 3.

FIG. 3 is a plan view showing the first sub-pixel PX1 shown in FIG. 2, and FIG. 4 is a cross-sectional view taken along the lines Q1-Q1', Q2-Q2', and Q3-Q3' of FIG. 3. FIG. 4 is a view showing a cross section from one end to the other end of the light-emitting diode ED disposed in one sub-pixel PXn (e.g., in the first sub-pixel PX1).

The display device 10 will be described in more detail with reference to FIGS. 3 and 4 in conjunction with FIG. 2. The display device 10 may include a first substrate SUB and a semiconductor layer, a plurality of conductive layers, and a plurality of insulating layers disposed on the first substrate SUB. The semiconductor layer, the conductive layers, and the insulating layers may form a circuit layer and an emission material layer of the display device 10.

The first substrate SUB may be an insulating substrate. The first substrate SUB may include (or may be made of) an insulating material, such as glass, quartz, and a polymer resin. The first substrate SUB may be either a rigid substrate or a flexible substrate that can be bent, folded, or rolled.

The light-blocking layer BML may be disposed on the first substrate SUB. The light-blocking layer BML may overlap an active layer ACT1 of a first transistor T1. The light-blocking layer BML may include a material that blocks light and, thus, prevents or substantially prevents light from entering the active layer ACT1 of the first transistor T1. For example, the light-blocking layer BML may be formed of an opaque metal material that blocks light transmission. It is, however, to be understood that the present disclosure is not limited thereto. In some implementations, the light-blocking layer BML may be omitted.

A buffer layer BL may be disposed entirely on the first substrate SUB, including on the light-blocking layer BML. The buffer layer BL may be formed on the first substrate SUB to protect the first thin-film transistors T1 of the pixels PX from moisture permeating through the first substrate SUB, which may be susceptible to moisture permeation, and the buffer layer BL may also provide a flat surface.

The semiconductor layer is disposed on the buffer layer BL. The semiconductor layer may include the active layer ACT1 of the first transistor T1. The active layer ACT1 may be disposed to partially overlap with a gate electrode G1 of a first conductive layer, etc., which will be described in more detail below.

Although only the first transistor T1 from among the transistors included in the sub-pixels PXn of the display device 10 is depicted in the drawing, the present disclosure is not limited thereto. The display device 10 may have more transistors. For example, the display device 10 may include more than one transistors in addition to the first transistor T1, for example, two, three, four, or more transistors in each of the sub-pixels PXn.

The semiconductor layer may include polycrystalline silicon, monocrystalline silicon, an oxide semiconductor, etc. When the semiconductor layer includes an oxide semiconductor, each active layer ACT1 may include a plurality of conductive regions and a channel region therebetween. The oxide semiconductor may be an oxide semiconductor including (or containing) indium (In). For example, the oxide semiconductor may include (or may be) indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

In other embodiments, the semiconductor layer may include polycrystalline silicon. The polycrystalline silicon may be formed by crystallizing amorphous silicon, and in such an embodiment, the conductive regions of the active layer ACT1 may be doped regions doped with impurities.

A first gate insulator GI is disposed on the semiconductor layer and the buffer layer BL. The first gate insulator GI may be disposed on the buffer layer BL, including on the semiconductor layer. The first gate insulator GI may act as a gate insulator of each of the thin-film transistors.

The first conductive layer is disposed on the first gate insulator GI. The first conductive layer may include the gate electrode G1 of the first transistor T1 and a first capacitor electrode CSE1 of a storage capacitor. The gate electrode G1 may be disposed so that it overlaps the channel region of the active layer ACT1 in the thickness direction. The first capacitor electrode CSE1 may be disposed so that it overlaps a second capacitor electrode CSE2, described in more detail below, in the thickness direction. According to an embodiment of the present disclosure, the first capacitor electrode CSE1 may be integrated with the gate electrode G1. The first capacitor electrode CSE1 may be disposed so that it overlaps the second capacitor electrode CSE2 in the thickness direction, and the storage capacitor may be formed between them.

A first interlayer dielectric layer IL1 is disposed on the first conductive layer. The first interlayer dielectric layer IL1 may act as an insulating layer between the first conductive layer and other layers disposed thereon. In addition, the first interlayer dielectric layer IL1 may be disposed so that it covers the first conductive layer to protect it.

A second conductive layer is disposed on the first interlayer dielectric layer IL1. The second conductive layer may include a first source electrode S1 and a first drain electrode D1 of the first transistor T1 and the second capacitor electrode CSE2.

The first source electrode S1 and the first drain electrode D1 of the first transistor T1 may contact the doped regions (e.g., the doping regions) of the active layer ACT1, respectively, through contact openings (e.g., contact holes) penetrating through the first interlayer dielectric layer IL1 and the first gate insulator GI. In addition, the first source electrode S1 of the first transistor T1 may contact the light-blocking layer BML through another contact opening (e.g., another contact hole).

The second capacitor electrode CSE2 may be disposed to overlap the first capacitor electrode CSE1 in the thickness direction. According to an embodiment of the present disclosure, the second capacitor electrode CSE2 may be integrally connected to the first source electrode S1.

The second conductive layer may further include a data line that applies (or supplies) a data signal to another transistor. The data line may be connected to the source/drain electrodes of another transistor to transfer a signal thereto applied from the data line.

A second interlayer dielectric layer IL2 is disposed on the second conductive layer. The second interlayer dielectric layer IL2 may act as an insulating layer between the second conductive layer and other layers disposed thereon. In addition, the second interlayer dielectric layer IL2 may cover the second conductive layer to protect it.

A third conductive layer is disposed on the second interlayer dielectric layer IL2. The third conductive layer may include a first voltage line VL1, a second voltage line VL2, and a first conductive pattern CDP. A high-level voltage (e.g., a first supply voltage) may be applied to the first voltage line VL1 to be supplied to the first transistor T1, and a low-level voltage (e.g., a second supply voltage) may be applied to the second voltage line VL2 to be supplied to the second electrode RME2.

The first voltage line VL1 and the second voltage line VL2 of the third conductive layer may be extended in (e.g., may extend or may primarily extend in) the second direction DR2. The first voltage line VL1 may include a portion extended in the second direction DR2 and then bent in another direction between the second direction DR2 and the first direction DR1. On the other hand, the second voltage line VL2 may not be bent but may be extended in the second direction DR2. The first voltage line VL1 and the second voltage line VL2 may be disposed at locations such that they partially overlap the electrodes RME1 and RME2, described in more detail below, in the thickness direction. The first voltage line VL1 may be disposed such that it is extended in the second direction DR2 at the border of the sub-pixel PXn and is partially bent and located in the emission area EMA. The second voltage line VL2 may be disposed to pass through the emission area EMA.

The first conductive pattern CDP may be connected to the second capacitor electrode CSE2 through a contact opening (e.g., a contact hole) formed in the second interlayer dielectric layer IL2. The second capacitor electrode CSE2 may be integrated with the first source electrode S1 of the first transistor T1, and the first conductive pattern CDP may be electrically connected to the first source electrode S1. The first conductive pattern CDP may also contact the first electrode RME1, to be described in more detail below. The first transistor DT1 may transfer the first supply voltage VDD applied from the first voltage line VL1 to the first electrode RME1 through the first conductive pattern CDP. Although the third conductive layer includes one second voltage line VL2 and one first voltage line VL1 in the example shown in the drawings, the present disclosure is not limited thereto. The third conductive layer may include more than one first voltage lines VL1 and second voltage lines VL2.

The buffer layer BL, the first gate insulator GI, the first interlayer dielectric layer IL1, and the second interlayer dielectric layer IL2 may be made up of a plurality of inorganic layers stacked on one another alternately. For example, the buffer layer BL, the first gate insulator GI, the first interlayer dielectric layer IL1, and the second interlayer dielectric layer IL2 may be made up of a plurality of layers in which inorganic layers including at least one of silicon oxide ($SiO_x$), silicon nitride ($SiN_x$), and silicon oxynitride (SiON) are stacked on one another alternately.

The first conductive layer, the second conductive layer, and the third conductive layer may be a single layer or made up of a plurality of layers of one of molybdenum (Mo), aluminum (Al), chromium (Cr), gold (Au), titanium (Ti), nickel (Ni), neodymium (Nd), copper (Cu), or an alloy thereof. It is, however, to be understood that the present disclosure is not limited thereto.

The third interlayer dielectric layer IL3 is disposed on the third conductive layer. The third interlayer dielectric layer IL3 may include an organic insulating material, for example, an organic material, such as polyimide (PI), to provide a flat surface.

On the third interlayer dielectric layer IL3, a plurality of first banks BNL1, a plurality of electrodes RME1 and RME2, a light-emitting diode ED, a plurality of connection electrodes CNE1 and CNE2, and a second bank BNL2 are disposed, as a display element layer. In addition, a plurality of insulating layers PAS1, PAS2, and PAS3 may be disposed on the third interlayer dielectric layer IL3.

The plurality of first banks BNL1 may be disposed directly on the third interlayer dielectric layer IL3. One first bank BNL1 may have a shape extended in the first direction DR1 and may be disposed across other neighboring sub-pixels PXn. In addition, the first bank BNL1 may have a shape extended in the second direction DR2 and may be spaced apart from another first bank BNL1 disposed in the same sub-pixel PXn. For example, each of the first banks BNL1 may be formed to have a width in the first direction DR1 and a length in the second direction DR2. A portion of each of the first banks BNL1 may be disposed in the emission area EMA, and the other portion thereof may be disposed at the border of another sub-pixel PXn adjacent thereto in the first direction DR1. The length of the first banks BNL1 measured in the second direction DR2 may be larger than the length of the emission area EMA measured in the second direction DR, so that a portion of the first banks BNL1 may overlap the second bank BNL2 in the non-emission area.

A plurality of first banks BNL1 may be disposed in one sub-pixel PXn. For example, two first banks BNL1 may be partially disposed in the emission area EMA of one sub-pixel PXn. The two first banks BNL1 may be spaced apart from each other in the first direction DR1. The light-emitting diode ED may be disposed between the first banks BNL1, which are spaced apart from each other in the first direction DR1. Two first banks BNL1 are disposed in the emission area EMA of each of the sub-pixels PXn to form an island-like pattern in the drawings, but the present disclosure is not limited thereto. The number of first banks BNL1 disposed in the emission area EMA of each sub-pixel PXn may vary depending on the number of the electrodes RME1 and RME2 or the arrangement of light-emitting diodes ED.

The first banks BNL1 may have a structure that at least partly protrudes from the upper surface of the third interlayer dielectric layer IL3. The protrusions of the first banks BNL1 may have inclined side surfaces. The light emitted from the light-emitting diodes ED may be reflected by the electrodes RME disposed on the first banks BNL1 so that the light may exit toward the upper side of the third interlayer dielectric layer IL3. The first banks BNL1 may provide the area in which the light-emitting diode ED is disposed and may also act as reflective walls that reflect light emitted from the light-emitting diode ED upwardly. The side surfaces of the first banks BNL1 may be inclined in a linear shape, but the present disclosure is not limited thereto. The first banks BNL1 may have a semicircle or semi-ellipse shape with a curved outer surface. The first banks BNL1 may include, but are not limited to, an organic insulating material, such as polyimide (PI).

The plurality of electrodes RME1 and RME2 have a shape extended in one direction and are disposed in each of the sub-pixels PXn. The plurality of electrodes RME1 and RME2 may have a shape extended in the second direction DR2 and spaced apart from each other in the first direction DR1 to be disposed in each of the sub-pixels PXn. The first electrode RME1 and the second electrode RME2 spaced apart from it in the first direction DR1 may be disposed in each of the sub-pixels PXn. A plurality of light-emitting diodes ED may be disposed on the first electrode RME1 and the second electrode RME2. It is, however, to be understood that the present disclosure is not limited thereto. The positions of the electrodes RME1 and RME2 disposed in each of the sub-pixels PXn may vary depending on their number or the number of light-emitting diodes ED disposed in the sub-pixel PXn.

The first electrode RME1 and the second electrode RME2 may be disposed in the emission area EMA of each of the sub-pixels PXn, and a portion thereof may be extended beyond the emission area EMA to overlap the second bank BNL2 in the thickness direction. The plurality of electrodes RME1 and RME2 may be extended in the second direction DR2 within the sub-pixel PXn and may be spaced apart from the electrodes RME1 and RME2 of another sub-pixel PXn in the cut area CBA in the second direction DR2.

The electrodes RME1 and RME2 may be formed by forming an electrode line extended in the second direction DR2 and then separating them from one another during a subsequent process after the light-emitting diodes ED have been disposed (e.g., aligned). The electrode line may be used to generate an electric field in the sub-pixel PXn to align the light-emitting diodes ED during the process of fabricating the display device 10. The light-emitting diodes ED may be ejected onto electrode lines via an inkjet printing process. Once an ink containing the light-emitting diodes ED is ejected onto the electrode lines, an alignment signal is applied to the electrode lines to generate an electric field. The light-emitting diodes ED may be arranged on the electrodes by the electric field formed between the electrode lines. The light-emitting diodes ED dispersed in the ink may receive an electrophoretic force caused by the generated electric field so that they may be aligned on the electrodes RME1 and RME2. The plurality of electrodes RME1 and RME2 may be formed by disconnecting a portion of the electrode line after aligning the light-emitting diodes ED.

The plurality of electrodes RME1 and RME2 may be connected to the third conductive layer so that a signal for allowing the light-emitting diode ED to emit light may be applied. The first electrode RME1 may contact the first conductive pattern CDP through a first contact opening (e.g., a first contact hole) CT1 penetrating through the third interlayer dielectric layer IL3 thereunder. The second electrode RME2 may contact the second voltage line VL2 through a second contact opening (e.g., a second contact hole) CT2 penetrating through the third interlayer dielectric layer IL3 thereunder. The first electrode RME1 may be electrically connected to the first transistor T1 through the first conductive pattern CDP to receive the first supply voltage. The second electrode RME2 may be electrically connected to the second voltage line VL2 to receive the second supply voltage. The plurality of electrodes RME1 and RME2 may be electrically connected to the light emitting element ED. The electrodes RME1 and RME2 may be connected to both ends of the light emitting element ED through the connection electrodes CNE1 and CNE2, described in more detail below, and may transmit an electric signal applied from the third conductive layer to the light emitting element ED. Because the electrodes RME1 and RME2 are disposed separately in each of the sub-pixels PXn, the light-emitting diodes ED of different sub-pixels PXn may emit light individually.

The first contact opening CT1 and the second contact opening CT2 may be spaced apart from the emission area EMA and overlap the second bank BNL2. The electric field may be strongly generated in the first contact opening CT1 and the second contact opening CT2. When voltage is applied to the electrodes RME1 and RME2 through the first contact opening CT1 and the second contact opening CT2, an alignment signal is applied to the electrodes RME1 and RME2 to generate an electric field. If the first contact opening CT1 and the second contact opening CT2 are located in the emission area EMA, when the ink containing the light-emitting diodes ED is injected onto the emission area EMA, most of the light-emitting diodes ED are aligned between the electrodes RME1 and RME2 but some of them may deviate toward the first contact opening CT1 and the second contact opening CT2 where the electric field is strongly applied. For this reason, according to embodiments of the present disclosure, the first contact opening CT1 and the second contact opening CT2 are located at positions spaced apart from the emission area EMA, for example, such that they overlap the second bank BNL2, and thus, it is possible to prevent or substantially prevent the light-emitting diodes ED from deviating. It is, however, to be understood that the present disclosure is not limited thereto. The first contact opening CT1 and the second contact opening CT2 may be located in the cut area CBA.

The electrodes RME1 and RME2 disposed in each of the sub-pixels PXn may be disposed on a plurality of first banks BNL1 spaced apart from one another, respectively. The electrodes RME1 and RME2 may be disposed on one side of the first banks BNL1 in the first direction DR1 and may be disposed on the inclined side surfaces of the first banks BNL1. According to an embodiment of the present disclosure, the width of the plurality of electrodes RME1 and RME2 measured in the first direction DR1 may be smaller than the width of the first banks BNL1 measured in the first direction DR1. Each of the electrodes RME1 and RME2 may be disposed to cover at least one side of the first banks BNL1 to reflect light emitted from the light emitting element ED.

The spacing between the electrodes RME1 and RME2, which are spaced apart in the first direction DR1, may be smaller than the spacing between the first banks BNL1. At least a portion of each of the electrodes RME1 and RME2 may be disposed directly on the third interlayer dielectric layer IL3 so that they may be disposed on the same plane.

According to an embodiment of the present disclosure, the plurality of electrodes RME1 and RME2 may transmit an electrical signal for allowing the light-emitting diode ED to emit light and may also be used to generate an electric field within the sub-pixels PXn to align the light-emitting diode ED during the process of fabricating the display device 10. The light-emitting diodes ED may be sprayed onto the electrodes RME1 and RME2 through an inkjet printing process. Once an ink containing the light-emitting diodes ED is sprayed, an alignment signal is applied to each of the electrodes RME1 and RME2 to generate an electric field. The light-emitting diodes ED dispersed in the ink may receive an electrophoretic force caused by the generated electric field so that they may be aligned on the electrodes RME1 and RME2.

Each of the electrodes RME1 and RME2 may include a conductive material having high reflectance. For example, each of the electrodes RME1 and RME2 may include a metal, such as silver (Ag), copper (Cu), and aluminum (Al) as the material having high reflectance, and may be an alloy including aluminum (Al), nickel (Ni), lanthanum (La), etc. Each of the electrodes RME1 and RME2 may reflect light that is emitted from the light-emitting diode ED and travels toward the side surfaces of the first banks BNL1 toward the upper side of each of the sub-pixels PXn.

It is, however, to be understood that the present disclosure is not limited thereto. Each of the electrodes RME1 and RME2 may further include a transparent conductive material. For example, each of the electrodes RME1 and RME2 may include a material, such as ITO, IZO, and ITZO. In some embodiments, each of the electrodes RME1 and RME2 may have a structure in which one or more layers of a transparent conductive material and one or more metal layers having high reflectivity are stacked on one another or may be a single layer including them. For example, each of the electrodes RME1 and RME2 may have a stacked structure, such as ITO/Ag/ITO/, ITO/Ag/IZO, or ITO/Ag/ITZO/IZO.

The first insulating layer PAS1 is disposed on the electrodes RME1 and RME2 and the first banks BNL1. The first insulating layer PAS1 may be disposed to cover the first banks BNL1, the first electrode RME1, and the second electrode RME2 while exposing a portion of the upper surface of each of the first electrode RME1 and the second electrode RME2. Openings may be formed in the first insulating layer PAS1, via which a portion of the upper surface of each of the electrodes RME1 and RME2 may be exposed. The connection electrodes CNE1 and CNE2 may respectively contact the electrodes RME1 and RME2 through the openings.

In an embodiment, the first insulating layer PAS1 may have steps so that a portion of the upper surface is recessed between the first electrode RME1 and the second electrode RME2. As the first insulating layer PAS1 is disposed to cover the first electrode RME1 and the second electrode RME2, steps may be formed therebetween. It is, however, to be understood that the present disclosure is not limited thereto. The first insulating layer PAS1 can protect the first electrode RME1 and the second electrode RME2 and insulate them from each other. In addition, the first insulating layer PAS1 can prevent or substantially prevent the light-emitting diode ED disposed on the first insulating layer PAS1 from contacting other elements and being damaged.

The second bank BNL2 may be disposed on the first insulating layer PAS1. The second bank BNL2 may be disposed in a lattice pattern including portions extended in the first direction DR1 and the second direction DR2 when viewed from the top. The second bank BNL2 may be disposed along the border of each of the sub-pixels PXn to distinguish adjacent sub-pixels PXn from one another. In addition, the second bank BNL2 may be disposed to surround (e.g., to extend around a periphery of) the emission area EMA and the cut area CBA disposed in each of the sub-pixels PXn to distinguish them. The portion of the second bank BNL2 extended in the second direction DR2 may have a larger width between the emission areas EMA than between the cut areas CBA. The distance between the cut areas CBA may be smaller than the distance between the emission areas EMA.

The second bank BNL2 may have a height greater than a height of the first banks BNL1. The second bank BNL2 can prevent or substantially prevent the ink in which different light-emitting diodes ED are dispersed from overflowing into adjacent sub-pixels PXn during the inkjet printing process from among the processes of fabricating the display device 10 so that different sub-pixels PXn can be separated from one another without the ink being mixed. As one first bank BNL1 is disposed across the sub-pixels PXn adjacent to each other in the first direction DR1, a portion of the second bank BNL2 extended in the second direction DR2 may be disposed on the first bank BNL1. The second bank BNL2 may include, but is not limited to, polyimide (PI), similar to the first banks BNL1.

The light-emitting diodes ED may be disposed on the first insulating layer PAS1. The light-emitting diodes ED may be spaced apart from one another in the second direction DR2 in which the electrodes RME1 and RME2 are extended and may be aligned substantially parallel to one another. The light-emitting diodes ED may have a shape extended in one direction. The direction in which the electrodes RME1 and RME2 are extended may be substantially perpendicular to the direction in which the light-emitting diodes ED are extended. It is, however, to be understood that the present disclosure is not limited thereto. The light-emitting diodes ED may be oriented obliquely to the direction in which the electrodes RME1 and RME2 are extended.

The light-emitting diodes ED may include semiconductor layers doped to have different conductivity types. The light-emitting diodes ED may include a plurality of semiconductor layers and may be aligned so that their ends are directed in a particular orientation depending on the direction of the electric field generated between the electrodes RME1 and RME2. In addition, each of the light-emitting diodes ED may include an emissive layer to emit light of a particular wavelength range. The light-emitting diodes ED disposed in each of the sub-pixels PXn may emit light of different wavelength ranges depending on the material of the emissive layer. It is, however, to be understood that the present disclosure is not limited thereto. The light-emitting diodes ED disposed in each of the sub-pixels PXn may emit light of the same color.

The light-emitting diodes ED may be disposed on the electrodes RME1 and RME2 between the first banks BNL1. For example, one end of each of the light-emitting diodes ED may be located on the first electrode RME1, while the other end thereof may be located on the second electrode RME2. The length of the light-emitting diodes ED may be larger than the distance between the first electrode RME1 and the second electrode RME2, and opposite ends of the light-emitting diodes ED may be disposed on the first electrode RME1 and the second electrode RME2, respectively.

The light-emitting diodes ED may include a plurality of layers stacked on each other in a direction perpendicular to the upper surface of the first substrate SUB. The light-emitting diodes ED of the display device 10 may be arranged such that they are extended in parallel to the first substrate SUB. The semiconductor layers included in the light-emitting diodes ED may be disposed sequentially in the direction parallel to the upper surface of the first substrate SUB. It is, however, to be understood that the present disclosure is not limited thereto. In some implementations, when the light-emitting diodes ED have a different structure, a plurality of layers thereof may be disposed in a direction perpendicular to the first substrate SUB.

Both ends (e.g., the opposite ends) of each of the light-emitting diodes ED may contact the connection electrodes CNE1 and CNE2, respectively. As a portion of the semiconductor layer or the electrode layer of each of the light-emitting diodes ED is exposed at the end surface on one side of the direction in which the light-emitting diodes ED are extended, the exposed portion of the semiconductor layer or the electrode layer may contact the connection electrodes CNE1 and CNE2. It is, however, to be understood that the present disclosure is not limited thereto. In some implementations, at least a portion of the insulating film of each of the light-emitting diodes ED may be removed, and accordingly, the end surfaces of the semiconductor layers may be partially exposed. The exposed side surfaces of the semiconductor layer may contact the connection electrodes CNE1 and CNE2.

The second insulating layer PAS2 may be partially disposed on the first insulating layer PAS1 and the light-emitting diodes ED. In addition, the second insulating layer PAS2 may be disposed on the second bank BNL2. For example, the second insulating layer PAS2 may be disposed on a partial surface of the outer surfaces of the light-emitting diode ED so that the end and the other end of the light-emitting diode ED are not covered. In addition, a portion of the second insulating layer PAS2 may be disposed on the first insulating layer PAS1 disposed over the first electrode RME1 and the second electrode RME2 disposed on the first bank BNL1. For example, the second insulating layer PAS2 may be disposed on the first insulating layer PAS1 and the second bank BNL2 including the light-emitting diodes ED in the emission area EMA such that parts thereof where the electrodes RME1 and RME2 are disposed and the both ends of the light-emitting diodes ED are exposed. The second insulating layer PAS2 may have such a shape that it is formed entirely on the first insulating layer PAS1 and the second bank BNL2 during the process of fabricating the display device 10 and is then removed (e.g., partially removed or patterned) during the process of exposing both ends of the light-emitting diodes ED. The portion of the second insulating layer PAS2 which is disposed on the light-emitting diode ED may be extended in the second direction DR2 on the first insulating layer PAS1 when viewed from the top, thereby forming a linear or island-like pattern in each of the sub-pixels PXn. The second insulating layer PAS2 protects the light-emitting diodes ED and fixes the light-emitting diodes ED during the process of fabricating the display device 10. In addition, the second insulating layer PAS2 may be disposed to fill the space between light-emitting diodes ED and the first insulating layer PAS1 thereunder.

A portion of the second insulating layer PAS2 may be disposed in the cut area CBA. The electrodes RME1 and RME2 disposed in the plurality of sub-pixels PXn may be formed as continuous electrodes extended in the second direction DR2 and may be separated into parts (e.g., into individual electrodes RME1 and RME2) at the cut area CBA after the light-emitting diodes ED have been aligned and the second insulating layer PAS2 has been formed. During the process of separating the electrodes RME1 and RME2, the first insulating layer PAS1 and the second insulating layer PAS2 may be removed together. A third insulating layer PAS3 may be directly disposed on the third interlayer dielectric layer IL3 in place of the first insulating layer PAS1 and the second insulating layer PAS2. It is, however, to be understood that the present disclosure is not limited thereto. The third insulating layer PAS3 may also be removed where the electrodes RME1 and RME2 are separated at the cut area CBA so that a portion of the third interlayer dielectric layer IL3 may be exposed. In another embodiment, another insulating layer disposed on the third insulating layer PAS3 to cover the elements may be disposed directly on the third interlayer dielectric layer IL3.

A plurality of connection electrodes CNE1 and CNE2 and the third insulating layer PAS3 may be disposed on the second insulating layer PAS2. The first connection electrode CNE1 and the second connection electrode CNE2 may be disposed on portions of the first electrode RME1 and the second electrode RME2, respectively. The first connection electrode CNE1 may be formed on the first electrode RME1, the second connection electrode CNE2 may be disposed on the second electrode RME2, and each of the first connection electrode CNE1 and the second connection electrode CNE2 may have a shape extended in the second direction DR2. The first connection electrode CNE1 and the second connection electrode CNE2 may be spaced apart from each other in the first direction DR1, and they may form a linear pattern inside the emission area EMA of each of the sub-pixels PXn.

The connection electrodes CNE1 and CNE2 may contact the light-emitting diodes ED and the electrodes RME1 and RME2, respectively. The semiconductor layer or the electrode layer is exposed at the both end surfaces of the light-emitting diodes ED on the side in the extending direction, and the first connection electrode CNE1 and the second connection electrode CNE2 may contact the light-emitting diodes ED at the exposed end surfaces where the semiconductor layer or the electrode layer is exposed. One end of the light-emitting diode ED may be electrically connected to the first electrode RME1 through the first connection electrode CNE1, and the other end thereof may be electrically connected to the second electrode RME2 through the second connection electrode CNE2.

Although one first connection electrodes CNE1 and one second connection electrode CNE2 are disposed in one sub-pixel PXn in the drawings, the present disclosure is not limited thereto. The numbers of the first connection electrodes CNE1 and the second connection electrode CNE2 may vary depending on the numbers of the first electrode RME1 and the second electrode RME2 disposed in each of the sub-pixels PXn.

The connection electrodes CNE1 and CNE2 may include a conductive material. For example, the connection electrodes CNE may include ITO, IZO, ITZO, aluminum (Al), etc. For example, the connection electrodes CNE1 and CNE2 may include a transparent conductive material, and light emitted from the light-emitting diodes ED may transmit through the connection electrodes CNE1 and CNE2 to propagate toward the electrodes RME1 and RME2. It is, however, to be understood that the present disclosure is not limited thereto.

Incidentally, light is generated in the emissive layer of each of the light-emitting diodes ED, and most of the light may exit through both ends thereof, which contact the connection electrodes CNE1 and CNE2, respectively. The light emitted from the light-emitting diodes ED may pass through the transparent connection electrodes CNE1 and CNE2, may be reflected off the electrodes RME1 and RME2 on the inclined side surfaces of the first bank BNL1, and may exit toward the upper side of the first substrate SUB. However, some of the light may be incident on the first insulating layer PAS1 disposed under the light-emitting diodes ED. The first insulating layer PAS1 and the connection electrodes CNE1 and CNE2 may have different refractive indices. Some of the light incident on the first insulating layer PAS1 may be reflected at the interface with the connection electrodes CNE1 and CNE2 and, thus, may not exit.

In the display device 10, the interface between the first insulating layer PAS1 and the connection electrodes CNE1 and CNE2 having different refractive indices is reduced, and thus, the amount of light emitted from the light-emitting diodes ED that cannot exit out of the first insulating layer PAS1 may be reduced. For example, the first contact electrode CNE1 and the second contact electrode CNE2 may contact first ends and second ends of the light-emitting diodes ED, respectively, and may cover only parts of the upper surfaces of the first electrode RME1 and the second electrode RME2, which are disposed on the third interlayer dielectric layer IL3. For example, the connection electrodes CNE1 and CNE2 may not be disposed on the inclined side surfaces of the first bank BNL1, and the light reflected by the electrodes RME1 and RME2 on the inclined side surfaces can readily pass through the first insulating layer PAS1 to exit.

The first connection electrode CNE1 and the second connection electrode CNE2 may contact the electrodes RME1 and RME2 through contacts CTD1 and CTD2, which penetrate through the first insulating layer PAS1 to expose parts of the upper surfaces of the electrodes RME1 and RME2, respectively. The first insulating layer PAS1 may expose upper portions of the electrodes RME1 and RME2 to form the contacts CTD1 and CTD2. When an electric field is generated after the ink containing the light-emitting diodes ED has been ejected (or deposited), the electric field is generated very strongly at the contacts CTD1 and CTD2, which are not covered by the insulating layer PAS1 but are exposed. As a result, the light-emitting diodes ED may deviate from their intended position and may gather at the contacts CTD1 and CTD2.

In the display device 10 according to an embodiment, the contacts CTD1 and CTD2, at where the connection electrodes CNE1 and CNE2 contact the electrodes RME1 and RME2, may be located to avoid (e.g., may be outside of) the emission area EMA. In an embodiment, the contacts CTD1 and CTD2 may be located outside the emission area EMA and may be located in sub-openings SOP of the second bank BNL2. A more detailed description thereof will be provided below with reference to other drawings.

The third insulating layer PAS3 may be disposed between the first connection electrode CNE1 and the second connection electrode CNE2. The third insulating layer PAS3 may also be disposed on the second insulating layer PAS2 except for a part where the second connection electrode CNE2 is disposed, including the first connection electrode CNE1.

The third insulating layer PAS3 may be disposed entirely on the first insulating layer PAS1 except for a part where the second connection electrode CNE2 is disposed on the electrodes RME1 and RME2. The third insulating layer PAS3 may insulate the first connection electrode CNE1 and the second connection electrode CNE2 from each other so that they are not in direct contact with each other. For example, according to an embodiment of the present disclosure, the first connection electrode CNE1 and the second connection electrode CNE2 may be disposed on different layers. The first connection electrode CNE1 may be disposed directly on the second insulating layer PAS2, and the second connection electrode CNE2 may be disposed directly on the third insulating layer PAS3. However, the first connection electrode CNE1 and the second connection electrode CNE2 may directly contact the first insulating layer PAS1 where the second insulating layer PAS2 and the third insulating layer PAS3 are not disposed and the both ends of the light-emitting diodes ED are exposed.

Although the third insulating layer PAS3 may be disposed between the first connection electrode CNE1 and the second connection electrode CNE2 to insulate them from each other, in other embodiments, the third insulating layer PAS3 may be omitted as described above. In such an embodiment, the first connection electrode CNE1 and the second connection electrode CNE2 may be disposed on the same layer.

An insulating layer may be disposed on third insulating layer PAS3, the connection electrodes CNE1 and CNE2, and the second bank BNL2 to cover them. The insulating layer may be disposed entirely on the first substrate SUB to protect the elements disposed thereon against the external environment.

Each of the above-described first insulating layer PAS1, second insulating layer PAS2, and third insulating layer PAS3 may include an inorganic insulating material or an organic insulating material. According to an embodiment of the present disclosure, the first insulating layer PAS1, the second insulating layer PAS2, and the third insulating layer PAS3 may include an inorganic insulating material, such as silicon oxide ($SiO_x$), silicon nitride ($SiN_x$), silicon oxynitride ($SiO_xN_y$), aluminum oxide ($Al_xO_y$) and aluminum nitride (AlN). In some embodiments, these layers may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene (BCB), a cardo resin, a siloxane resin, a silsesquioxane resin, polymethyl methacrylate, polycarbonate, a polymethyl methacrylate-polycarbonate synthetic resin, etc. It is, however, to be understood that the present disclosure is not limited thereto.

As described above, the positions of the contacts CTD1 and CTD2 in the display device 10 according to an embodiment may be designed so that the light-emitting diodes ED do not deviate during the process of aligning the light-emitting diodes ED. Hereinafter, the positions of the contacts CTD1 and CTD2 and the configuration of the second bank BNL2 will be described in more detail with reference to other drawings.

Figure 5:
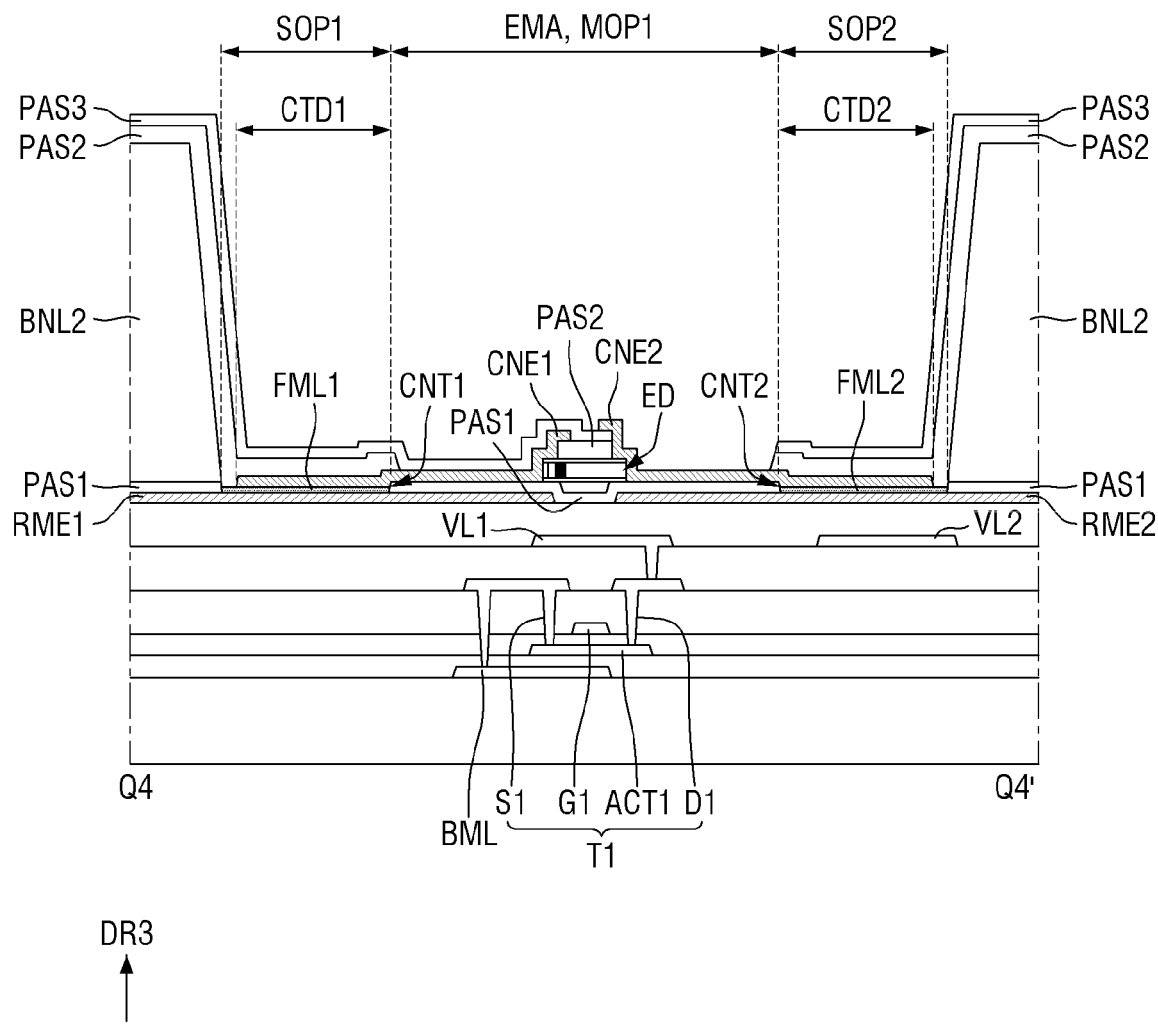
FIG. 5 is a cross-sectional view taken along the line Q4-Q4' of FIG. 3.
Figure 6:
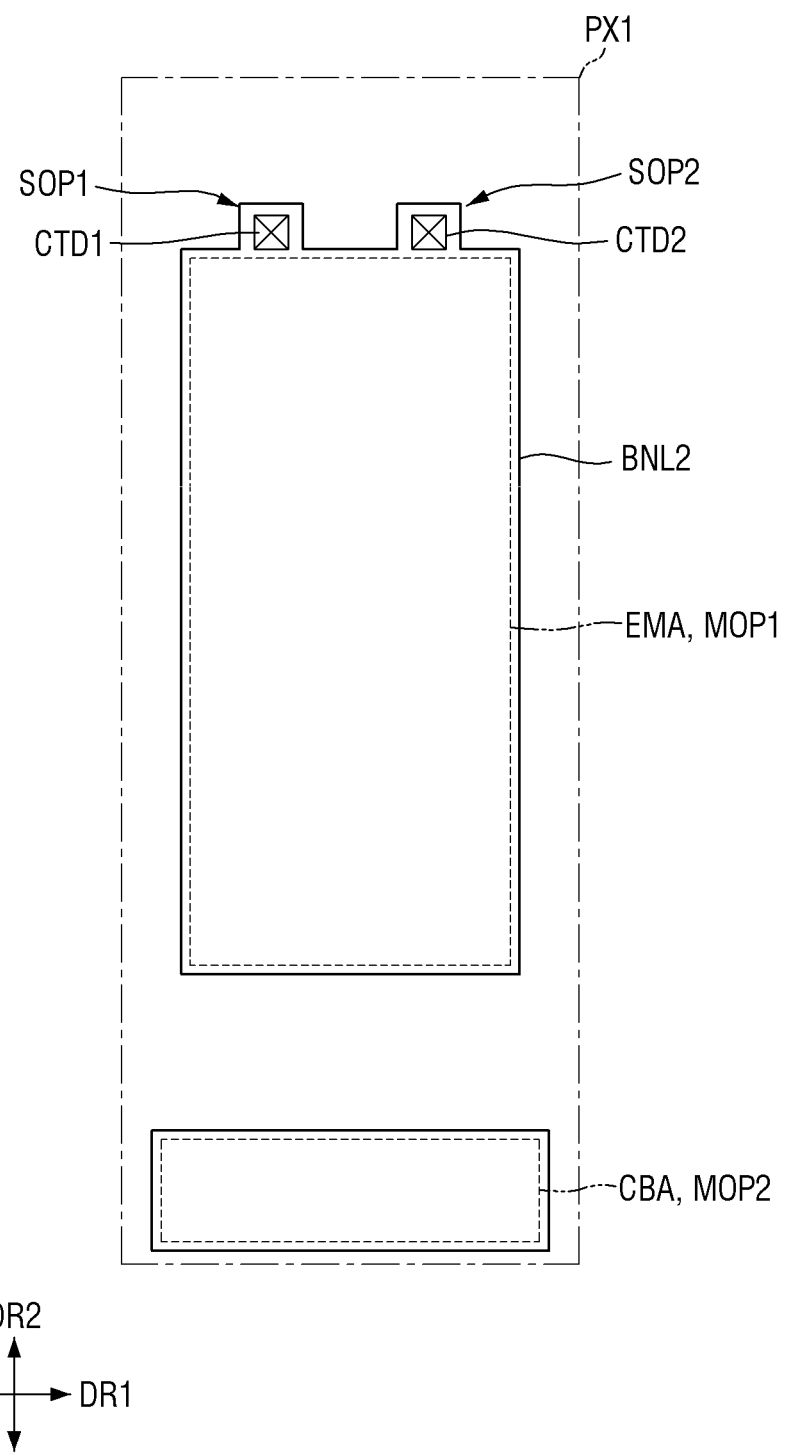
FIG. 6 is a plan view showing a second bank of a display device according to an embodiment.
Figure 7:
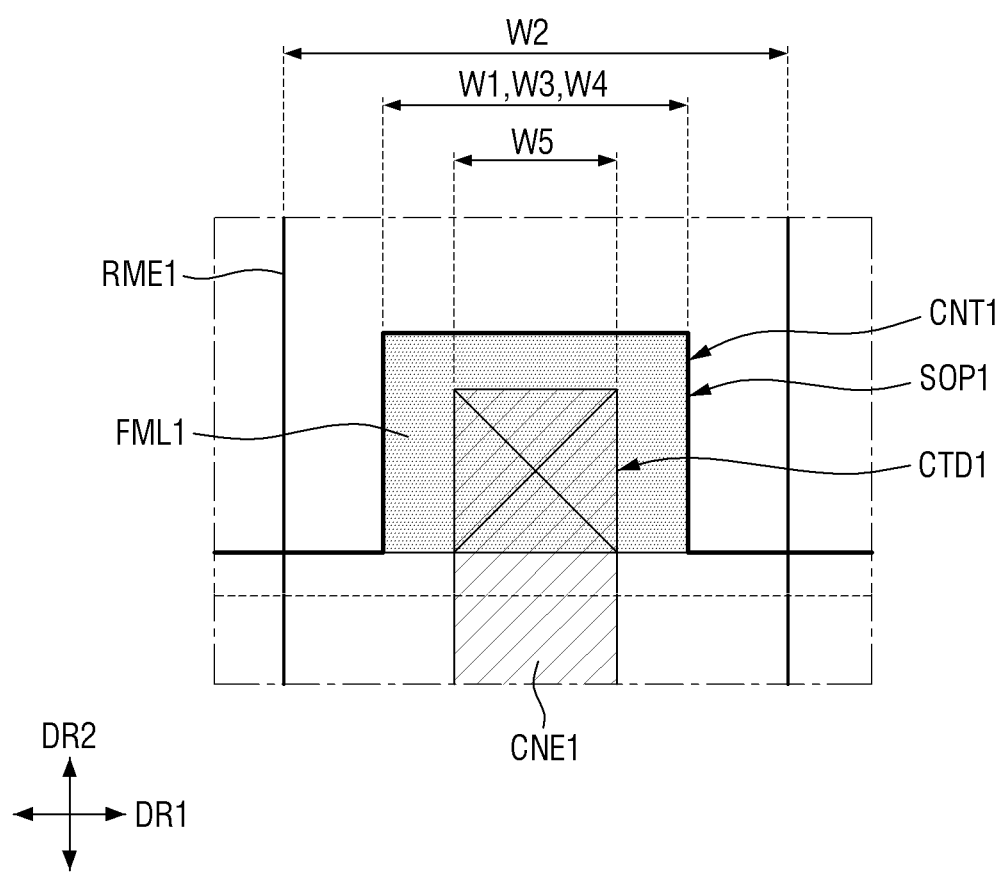
FIG. 7 is an enlarged plan view of a first sub-opening of a display device according to an embodiment.
Figure 8:
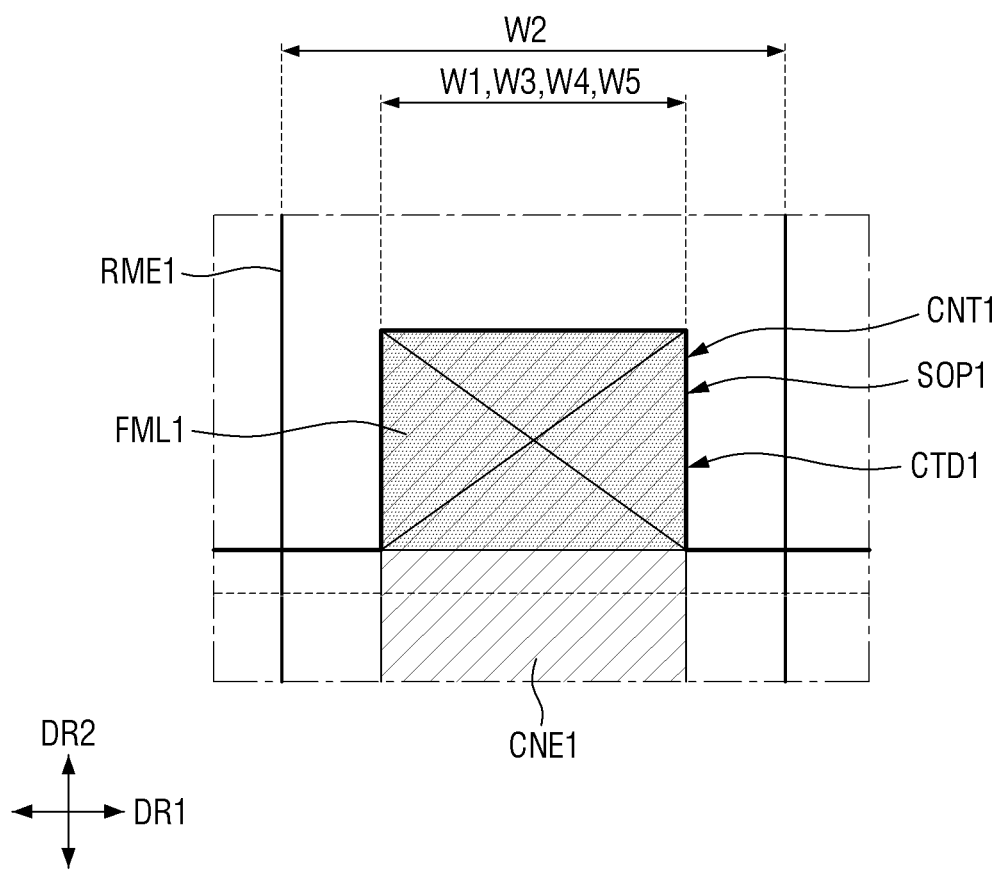
FIG. 8 is an enlarged plan view of a first sub-opening of a display device according to an embodiment.

FIG. 5 is a cross-sectional view taken along the line Q4-Q4' of FIG. 3, FIG. 6 is a plan view showing a second bank of a display device according to an embodiment, FIG. 7 is an enlarged plan view of a first sub-opening of a display device according to an embodiment, and FIG. 8 is an enlarged plan view of a first sub-opening of a display device according to an embodiment. FIG. 5 shows a cross section passing through the first contact CTD1 and the second contact CTD2, and FIG. 6 shows the first contact CTD1, the second contact CTD2, and the second bank BNL2 shown in FIG. 3.

Referring to FIGS. 5 to 8 in conjunction with FIGS. 3 and 4, the first electrode RME1 and the second electrode RME2 may be extended in the second direction DR2. The first connection electrode CNE1 and the second connection electrode CNE2 may overlap and may be connected to the first electrode RME1 and the second electrode RME2, respectively.

The second bank BNL2 may include a first main opening MOP1 defining the emission area EMA and a second main opening MOP2 defining the cut area CBA. The second bank BNL2 is not formed in the first main opening MOP1 and the second main opening MOP2, and the first insulating layer PAS1 and the first bank BNL1 disposed on the first substrate SUB may be exposed. The first main opening MOP1 may be substantially identical to the emission area EMA, and the second main opening MOP2 may be substantially identical to the cut area CBA. The descriptions of the first main opening MOP1 and the second main opening MOP2 will be replaced with the above descriptions on the emission area EMA and the cut area CBA.

According to an embodiment of the present disclosure, the second bank BNL2 may include a plurality of sub-openings SOP1 and SOP2 extended from the first main opening MOP1. The plurality of sub-openings SOP1 and SOP2 may be extended from the first main opening MOP1 in the second direction DR2 and may be spaced apart from each other in the first direction DR1. The plurality of sub-openings SOP1 and SOP2 may be spaced apart from another sub-pixel adjacent to the sub-pixel in the second direction DR2 and may have a closed shape except for one side at where they extend from the first main opening MOP1.

The plurality of sub-openings SOP1 and SOP2 may expose electrodes RME1 and RME2 disposed on the first substrate SUB, respectively. In the plurality of sub-openings SOP1 and SOP2, the first contact CTD1 where the first electrode RME1 is connected to the first connection electrode CNE1, and the second contact CTD2 where the second electrode RME2 is connected to the second connection electrode CNE2 may be located, respectively.

The plurality of sub-openings SOP1 and SOP2 may be located to overlap the first electrode RME1, the second electrode RME2, the first connection electrode CNE1, and the second connection electrode CNE2. For example, the plurality of sub-openings SOP1 and SOP2 may include the first sub-opening SOP1 overlapping the first electrode RME1 and the first connection electrode CNE1, and the second sub-opening SOP2 overlapping the second electrode RME2 and the second connection electrode CNE2. The first sub-opening SOP1 may overlap the first contact CTD1, and the first contact CTD1 may be located in the first sub-opening SOP1. The second sub-opening SOP2 may overlap the second contact CTD2, and the second contact CTD2 may be located in the second sub-opening SOP2.

According to an embodiment of the present disclosure, metal layers FML1 and FML2 may be disposed between the first electrode RME1 and the first connection electrode CNE1 disposed in the first contact CTD1, and between the second electrode RME2 and the second connection electrode CNE2 disposed in the second contact CTD2. The first metal layer FML1 may overlap the first electrode RME1, the first connection electrode CNE1, and the first contact CTD1, and the second metal layer FML2 may overlap the second electrode RME2, the second connection CNE2, and the second contact CTD2. The metal layers FML1 and FML2 may be disposed on the surfaces of the electrodes RME1 and RME2, respectively, to impart hydrophobicity to the surfaces of the electrodes RME1 and RME2.

The metal layers FML1 and FML2 may be formed by performing plasma treatment on the entire first substrate SUB after the first insulating layer PAS2 exposing the electrodes RME1 and RME2 has been formed and the second bank BNL2 having the sub-openings SOP1 and SOP2 has been formed. Fluorine (F) may be injected onto the exposed surfaces of the electrodes RME1 and RME2 by the plasma treatment so that the metal layers FML1 and FML2 may be formed. The metal layers FML1 and FML2 may be metal fluoride layers including (or containing) fluorine. Although the metal layers FML1 and FML2 are disposed on the surfaces of the electrodes RME1 and RME2 according to an embodiment of the present disclosure, the present disclosure is not limited thereto. Parts of the surfaces of the electrodes RME1 and RME2 in the thickness direction of the electrodes RME1 and RME2 may be formed as the metal layers FML1 and FML2.

When the ink containing the light-emitting diodes ED is applied to the emission area EMA, the ink spreads in the emission area EMA, and the ink may spread to the plurality of sub-openings SOP1 and SOP2 extended from the second bank BNL2. According to an embodiment of the present disclosure, the metal layers FML1 and FML2 having hydrophobicity is formed on the surfaces of the electrodes RME1 and RME2 exposed at the plurality of sub-openings SOP1 and SOP2 prevent or substantially prevent the ink from spreading into the plurality of sub-openings SOP1 and SOP2. By doing so, even if an electric field is strongly applied at the contacts CTD1 and CTD2, the ink containing the light-emitting diodes ED may not spread to the sub-openings SOP1 and SOP2 in which the contacts CTD1 and CTD2 are located, thereby preventing or substantially preventing the light-emitting diodes ED from deviating.

The metal layers FML1 and FML2 may have different thicknesses depending on the process conditions. According to an embodiment of the present disclosure, the metal layers FML1 and FML2 may have a thickness in a range from about 0.1 nm to about 10 nm in order to exhibit hydrophobic properties effectively.

According to an embodiment of the present disclosure, the plurality of sub-openings SOP1 and SOP2 may have a shape extended from the first main opening MOP1. As described above, the contacts CTD1 and CTD2 may be located in the plurality of sub-openings SOP1 and SOP2, respectively, in order to prevent or substantially prevent deviation of the light-emitting diodes ED. The connection electrodes CNE1 and CNE2 may be extended to the sub-openings SOP1 and SOP2 to be connected to the electrodes RME1 and RME2 in the contacts CTD1 and CTD2, respectively. When the plurality of sub-openings SOP1 and SOP2 have a shape extended from the first main opening MOP1, it is possible to prevent or substantially prevent the connection electrodes CNE1 and CNE2 from being disconnected because there is no level difference due to the very thick second bank BNL2.

According to an embodiment of the present disclosure, a width W1 of each of the plurality of sub-openings SOP1 and SOP2 may be less than or equal to a width W2 of the electrodes RME1 and RME2. For example, the width W1 of the first sub-opening SOP1 may be less than or equal to the width W2 of the first electrode RME1, and the width W1 of the second sub-opening SOP2 may be less than or equal to the width W2 of the second electrode RME2. The metal layers FML1 and FML2 may be disposed at the bottom of the plurality of sub-openings SOP1 and SOP2 to prevent or substantially prevent the spread of the ink including the light-emitting diodes ED. To this end, the plurality of sub-openings SOP1 and SOP2 may completely overlap the electrodes RME1 and RME2 to form the metal layers FML1 and FML2 in the plurality of sub-openings SOP1 and SOP2, respectively. In addition, the width W1 of each of the plurality of sub-openings SOP1 and SOP2 may be equal to or smaller than the width W3 of the metal layers FML1 and FML2. For example, the width W1 of the first sub-opening SOP1 may be equal to or smaller than the width W3 of the first metal layer FML1, and the width W1 of the second sub-opening SOP2 may be equal to or smaller than the width W3 of the second metal layer FML2.

The first insulating layer PAS1 may include a plurality of contact openings (e.g., contact holes) CNT1 and CNT2 exposing the electrodes RME1 and RME2 thereunder in the first sub-opening SOP1 and the second sub-opening SOP2, respectively. The plurality of contact openings CNT1 and CNT2 may include a first contact opening CNT1 overlapping the first electrode RME1 and a second contact opening CNT2 overlapping the second electrode RME2. A width W4 of the plurality of contact openings CNT1 and CNT2 may be equal to or less than the width W1 of the plurality of sub-openings SOP1 and SOP2 to form the metal layers FML1 and FML2 on the electrodes RME1 and RME2 under the first insulating layer PAS1. For example, the width W4 of the first contact opening CNT1 may be less than or equal to the width W1 of the first sub-opening SOP1, and the width W4 of the second contact opening CNT2 may be less than or equal to the width W1 of the second sub-opening SOP2.

In addition, because the metal layers FML1 and FML2 are formed on the electrodes RME1 and RME2 exposed via the plurality of contact openings CNT1 and CNT2, respectively, the width W4 of the plurality of contact openings CNT1 and CNT2 may be substantially equal to the width W3 of the metal layers FML1 and FML2. For example, the width W4 of the first contact opening CNT1 may be equal to the width W3 of the first metal layer FML1, and the width W4 of the second contact opening CNT2 may be equal to the width W3 of the second metal layer FML2.

The width W5 of the contacts CTD1 and CTD2 may be less than each of the width W1 of the sub-openings SOP1 and SOP2, the width W3 of the metal layers FML1 and FML2, and the width W4 of the contact openings CNT1 and CNT2. For example, the width W5 of the first contact CTD1 may be less than the width W1 of the first sub-opening SOP1, the width W3 of the first metal layer FML1, and the width W4 of the first contact opening CNT1, and the width W5 of the second contact CTD2 may be less than the width W1 of the second sub-opening SOP2, the width W3 of the second metal layer FML2, and the width W4 of the second contact opening CNT2. Even though the width W5 of the contacts CTD1 and CTD2 may be less than each of the width W1 of the sub-openings SOP1 and SOP2, the width W3 of the metal layers FML1 and FML2 and the width W4 of the contact openings CNT1 and CNT2, the exposed metal layers FML1 and FML2 are covered by the second insulating layer PAS2 and the third insulating layer PAS3 and can be protected against from the outside.

As shown in FIG. 8, the width W5 of the contacts CTD1 and CTD2 may be equal to each of the width W1 of the sub-openings SOP1 and SOP2, the width W3 of the metal layers FML1 and FML2, and the width W4 of the contact openings CNT1 and CNT2.

In the display device 10 according to an embodiment of the present disclosure, in order to locate the contacts CTD1 and CTD2, which may cause a deviation of the light-emitting diodes ED, outside the emission area EMA, the plurality of sub-openings SOP1 and SOP2 extend from the first main opening MOP1 to be located in the second bank BNL2. In order to prevent or substantially prevent the ink containing the light-emitting diodes ED from spreading to the sub-openings SOP1 and SOP2, the metal layers FML1 and FML2 may be formed on the electrodes RME1 and RME2 exposed via the sub-openings SOP1 and SOP2. Thus, it is possible to prevent or substantially prevent the light-emitting diodes ED from deviating out of the emission area EMA during the process of applying the ink containing the light-emitting diodes ED and aligning the light-emitting diodes ED.

Figure 9:
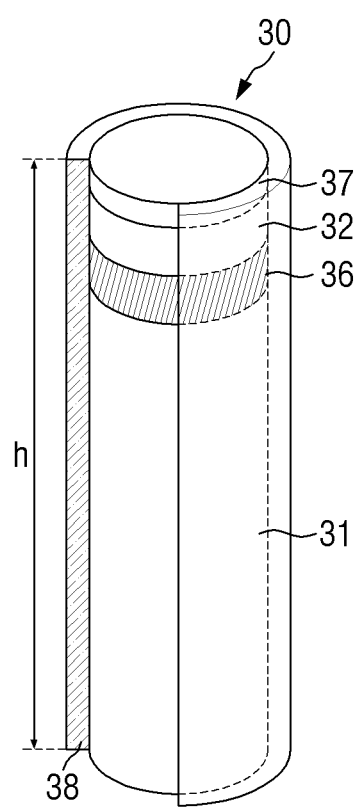
FIG. 9 is a view showing a light-emitting element according to an embodiment of the present disclosure.

FIG. 9 is a view showing a light-emitting element according to an embodiment of the present disclosure.

The light-emitting element ED may be a light-emitting diode. For example, the light-emitting element ED may be an inorganic light-emitting diode that has a size in micrometers or nanometers and includes (or is made of) an inorganic material. Inorganic light-emitting diodes may be aligned between two electrodes facing each other as polarities are created by forming an electric field in a particular direction between the two electrodes. For example, the light-emitting diode ED may be aligned between two electrodes by an electric field formed over the two electrodes.

The light-emitting diode ED according to an embodiment may have a shape extended in one direction. The light-emitting diode ED may have a shape of a cylinder, a rod, a wire, a tube, etc. It is to be understood that the shape of the light-emitting diode ED is not limited thereto. The light-emitting diode ED may have a variety of shapes including a polygonal column shape, such as a cube, a cuboid, and a hexagonal column, or a shape that is extended in a direction with partially inclined outer surfaces. The plurality of semiconductors included in the light-emitting diode ED, to be described in more detail below, may have a structure sequentially arranged or stacked along the one direction.

The light-emitting diode ED may include semiconductor layers doped with impurities of a conductive type (e.g., p-type or n-type). The semiconductor layers may emit light of a certain wavelength band by transmitting an electric signal applied from an external power source.

Referring to FIG. 9, the light-emitting diode ED may include a first semiconductor layer 31, a second semiconductor layer 32, an emissive layer 36, an electrode layer 37, and an insulating film 38.

The first semiconductor layer 31 may be an n-type semiconductor. When the light-emitting diode ED emits light of a blue wavelength band, the first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN, and InN. The first semiconductor layer 31 may be doped with an n-type dopant, and the n-type dopant may be Si, Ge, Sn, etc. For example, the first semiconductor layer 31 may be n-GaN doped with n-type Si. The length of the first semiconductor layer 31 may be in a range from about 1.5 μm to about 5 μm but is not limited thereto. A first end of the light-emitting diode ED may be a portion where the first semiconductor layer 31 is disposed with respect to the emissive layer (e.g., the light emitting layer) 36.

The second semiconductor layer 32 is disposed on the emissive layer 36. The second semiconductor layer 32 may be a p-type semiconductor. When the light-emitting diode ED emits light of a blue or green wavelength band, the second semiconductor layer 32 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Se, Ba, etc. For example, the second semiconductor layer 32 may be p-GaN doped with p-type Mg. The length of the second semiconductor layer 32 may be in a range from about 0.05 μm to about 0.10 μm but is not limited thereto. A second end of the light-emitting diode ED may refer to the other side of the emissive layer 36 where the second semiconductor layer 32 is disposed.

Although each of the first semiconductor layer 31 and the second semiconductor layer 32 is implemented as a single layer in the drawings, the present disclosure is not limited thereto. Depending on the material of the emissive layer 36, the first semiconductor layer 31 and the second semiconductor layer 32 may include a greater number of layers, for example, a clad layer or a tensile strain barrier reducing (TSBR) layer.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs that are combined therein in response to an electrical signal applied through the first semiconductor layer 31 and the second semiconductor layer 32. When the emissive layer 36 emits light of the blue wavelength band, it may include a material, such as AlGaN and AlGaInN. For example, when the emissive layer 36 has a multiple quantum well structure in which quantum layers and well layers are alternately stacked on one another, the quantum layers may include AlGaN or AlGaInN and the well layers may include a material, such as GaN and AlGaN. For example, the emissive layer 36 includes AlGaInN as the quantum layer and AlInN as the well layer, and, as described above, the emissive layer 36 may emit blue light having a center wavelength band in a range from about 450 nm to about 495 nm.

It is, however, to be understood that the present disclosure is not limited thereto. The emissive layer 36 may have a structure in which a semiconductor material having a large band gap energy and a semiconductor material having a small band gap energy are alternately stacked on one another and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some embodiments. The length of the emissive layer 36 may be in a range from about 0.05 μm to about 0.10 μm.

The light emitted from the emissive layer 36 may exit not only through the outer surfaces of the light-emitting diode ED in the longitudinal direction but also through the both side surfaces. The direction in which the light emitted from the emissive layer 36 propagates is not limited to one direction.

The electrode layer 37 may be an ohmic contact electrode. It is, however, to be understood that the present disclosure is not limited thereto. The element electrode layer may be Schottky contact electrode. The light-emitting diode ED may include at least one electrode layer 37. Although the light-emitting diode ED includes one electrode layer 37 in the embodiment shown in FIG. 9, the present disclosure is not limited thereto. In some implementations, the light-emitting diode ED may include a greater number of electrode layers 37, or the electrode layer may be omitted. The following description of the light-emitting diode ED may be equally applied even if the number of electrode layers 37 is different or it further includes other structures.

The electrode layer 37 can reduce the resistance between the light-emitting diode ED and the electrodes or the contact electrodes when the light-emitting diode ED is electrically connected to the electrodes or the contact electrodes in the display device 10 according to an embodiment of the present disclosure. The electrode layer 37 may include a conductive metal. For example, the electrode layer 37 may include at least one of aluminum (Al), titanium (Ti), indium (In), gold (Au), silver (Ag), ITO, IZO, and ITZO. In addition, the electrode layer 37 may include a semiconductor material doped with n-type or p-type impurities. The electrode layer 37 may include the same material or may include different materials. It is, however, to be understood that the present disclosure is not limited thereto.

The insulating film 38 is disposed to surround (e.g., to extend around a periphery of) the outer surfaces of the plurality of semiconductor layers and electrode layers described above. For example, the insulating film 38 may be disposed to surround at least the outer surface of the emissive layer 36 and may be extended in a direction in which the light-emitting diode ED is extended. The insulating film 38 may protect the above-described elements. The insulating film 38 may be formed to surround the side surfaces of the elements, and both ends of the light-emitting diode ED in the longitudinal direction may be exposed.

Although the insulating film 38 is extended in the longitudinal direction of the light-emitting diode ED to cover from the first semiconductor layer 31 to the side surface of the electrode layer 37 in the embodiment shown in the drawing, the present disclosure is not limited thereto. The insulating film 38 may cover only the outer surface of a portion of the semiconductor layer, including the light emitting layer 36, or may cover only a portion of the outer surface of the electrode layer 37 to partially expose the outer surface of the electrode layer 37. In addition, a portion of the upper surface of the insulating film 38 which is adjacent to at least one end of the light-emitting diode ED in cross section may be rounded.

The thickness of the insulating film 38 may be in a range from about 10 nm to about 1.0 μm but is not limited to. In one embodiment, the thickness of the insulating film 38 may be approximately 40 nm.

The insulating film 38 may include materials having insulating properties, such as silicon oxide ($SiO_x$), silicon nitride ($SiN_x$), silicon oxynitride ($SiO_xN_y$), aluminum nitride (AlN), and aluminum oxide (AlxOy). Although the insulating film 38 is shown as a single layer in the drawings, the present disclosure is not limited thereto. In some embodiments, the insulating film 38 may have a multilayer structure in which a plurality of layers are stacked on one another. Accordingly, it is possible to prevent or substantially prevent an electrical short-circuit that may occur when the emissive layer 36 contacts an electrode through which an electric signal is transmitted to the light-emitting diode ED. In addition, because the insulating film 38 includes the emissive layer 36 to protect the outer surface of the light-emitting diode ED, it is possible to prevent or at least reduce a decrease in luminous efficiency.

In addition, the outer surface of the insulating film 38 may be subjected to surface treatment (e.g., may be surface treated). The light-emitting diodes ED may be dispersed in an ink, and the ink may be sprayed onto the electrodes. In doing so, a surface treatment may be applied to the insulating film 38 so that it becomes hydrophobic or hydrophilic to keep the light-emitting diodes ED that are dispersed in the ink from aggregating with one another. For example, the outer surface of the insulating film 38 may be subjected to surface treatment with a material, such as stearic acid and 2,3-naphthalene dicarboxylic acid.

The length h of the light-emitting diodes ED may be in a range from about 1 μm to about 10 μm, from about 2 μm to about 6 μm, or from about 3 μm to about 5 μm. In addition, the diameter of the light-emitting diodes ED may be in range from about 30 nm to about 700 nm, and the aspect ratio of the light-emitting diodes ED may be in a range from about 1.2 to about 100. It is, however, to be understood that the present disclosure is not limited thereto. The plurality of light-emitting diodes ED included in the display device 10 may have different diameters depending on compositional difference of the emissive layer 36. In one embodiment, the diameter of the light-emitting diodes ED may be about 500 nm.

Hereinafter, display devices according to other embodiments of the present disclosure will be described reference to other drawings.

Figure 10:
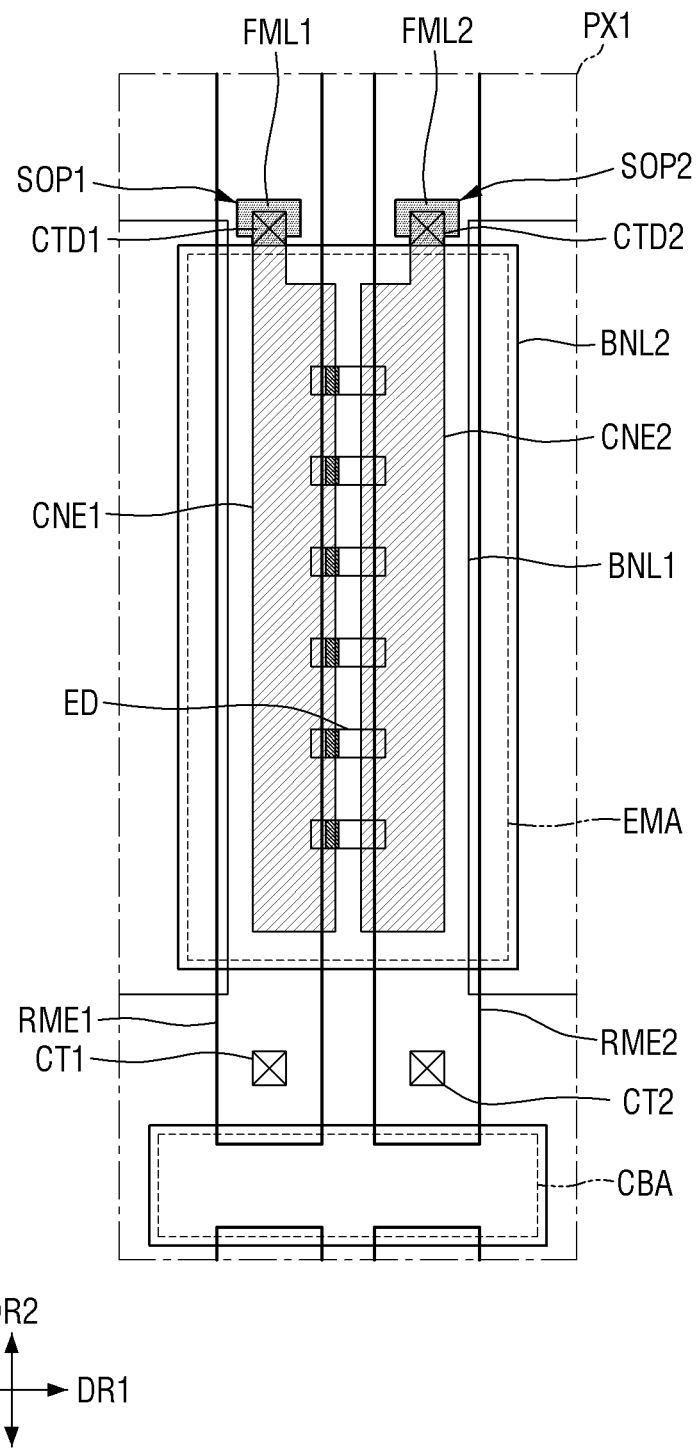
FIG. 10 is a plan view showing a sub-pixel of a display device according to an embodiment of the present disclosure.
Figure 11:
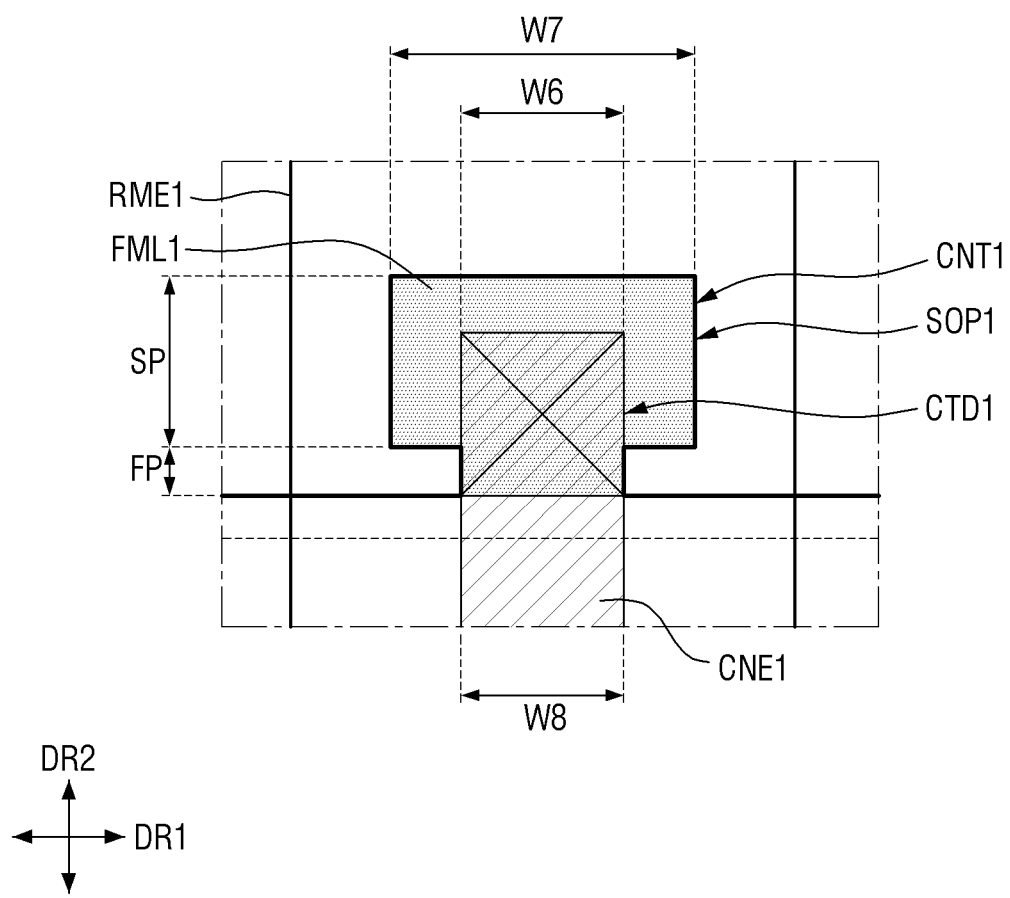
FIG. 11 is an enlarged plan view of a first sub-opening shown in FIG. 10.
Figure 12:
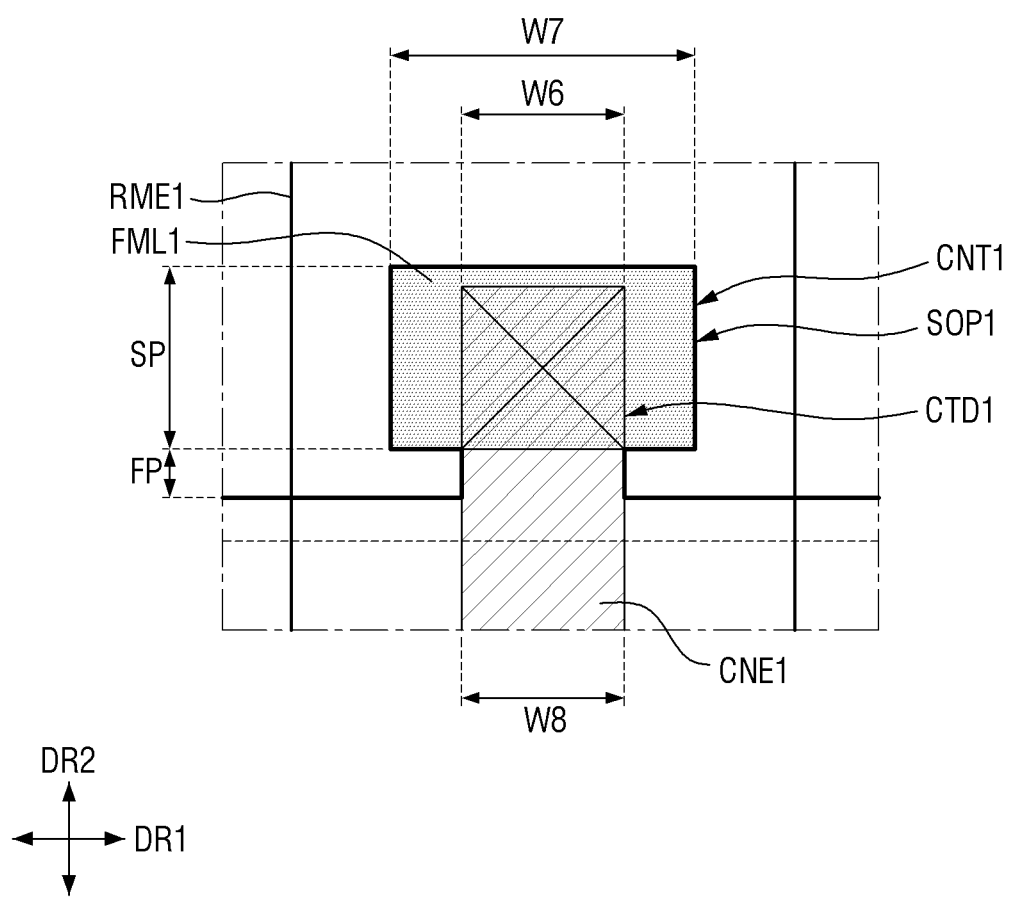
FIG. 12 is a plan view showing a first sub-opening according to an example.

FIG. 10 is a plan view showing a sub-pixel of a display device according to another embodiment of the present disclosure, FIG. 11 is an enlarged plan view of a first sub-opening shown in FIG. 10, and FIG. 12 is a plan view showing a first sub-opening according to another example.

Referring to FIGS. 10 and 11, a display device according to another embodiment is different from the display device 10 according to the embodiment shown in FIGS. 3 to 8 in that the shapes of sub-openings SOP1 and SOP2 are different when viewed from the top. In the following description, redundant descriptions of components will be omitted and the different sub-openings SOP1 and SOP2 will be primarily described.

According to an embodiment of the present disclosure, the sub-openings SOP1 and SOP2 may be extended from the first main opening MOP1 in the second direction DR2. Each of the sub-openings SOP1 and SOP2 may have a first region FP in contact with (e.g., open to) the first main opening MOP1 and a second region SP extended from the first region FP in the second direction DR2. The first region FP may correspond to the inlet of each of the sub-openings SOP1 and SOP2, and the second region SP may correspond to the inner space of each of the sub-openings SOP1 and SOP2.

Each of the first region FP and the second region SP may have a width in the first direction DR1. The width W6 of the first region FP may be less than the width W7 of the second region SP. As described above, the metal layers FML1 and FML2 may be formed in the sub-openings SOP1 and SOP2, respectively, to prevent or substantially prevent the spread of the ink containing the light-emitting diodes ED. According to an embodiment of the present disclosure, it is possible to prevent or substantially prevent the spread of the ink by reducing the width of the sub-openings SOP1 and SOP2 in contact with the first main opening MOP1. To this end, the width W6 of the first region FP may be smaller than the width W7 of the second region SP.

In addition, each of the first region FP and the second region SP may have a length in the second direction DR2, and the length of the first region FP may be less than the length of the second region SP. The first region FP may have a length sufficient to prevent or substantially prevent the spread of the ink. In another embodiment, the length of the first region FP may be larger than the length of the second region SP. When the length of the first region FP having the narrow width W6 increases, it is possible to further prevent the spread of the ink. It is, however, to be understood that the present disclosure is not limited thereto. The length of the first region FP may be equal to the length of the second region SP.

The sub-openings SOP1 and SOP2 may overlap the connection electrodes CNE1 and CNE2, respectively. The width W6 of the first region FP may be substantially equal to the width W8 of the connection electrodes CNE1 and CNE2. As the width W6 of the first region FP is equal to the width W8 of the connection electrodes CNE1 and CNE2, it is possible to prevent or substantially prevent the connection electrodes CNE1 and CNE2 from being disconnected or deposited improperly due to the level difference of the second bank BNL2.

The first contact CTD1 may be disposed to overlap each of the first region FP and the second region SP of the first sub-opening SOP1. It is, however, to be understood that the present disclosure is not limited thereto. For example, the first contact CTD1 may be disposed to overlap the second region SP of the first sub-opening SOP1 but not overlap the first region FP.

Referring to FIG. 12, the first contact CTD1 may be disposed to overlap the second region SP of the first sub-opening SOP1. For example, the first contact CTD1 may be disposed in the second region SP. The first contact CTD1 may not overlap the first region FP. In this embodiment, because the first insulating layer covers the first electrode RME1 in the first region FP, the first metal layer FML1 may be disposed to overlap the second region SP. Accordingly, the first connection electrode CNE1 may contact the first metal layer FML1 in the second region SP of the first sub-opening SOP1 and, accordingly, be connected to the first electrode RME1.

Figure 13:
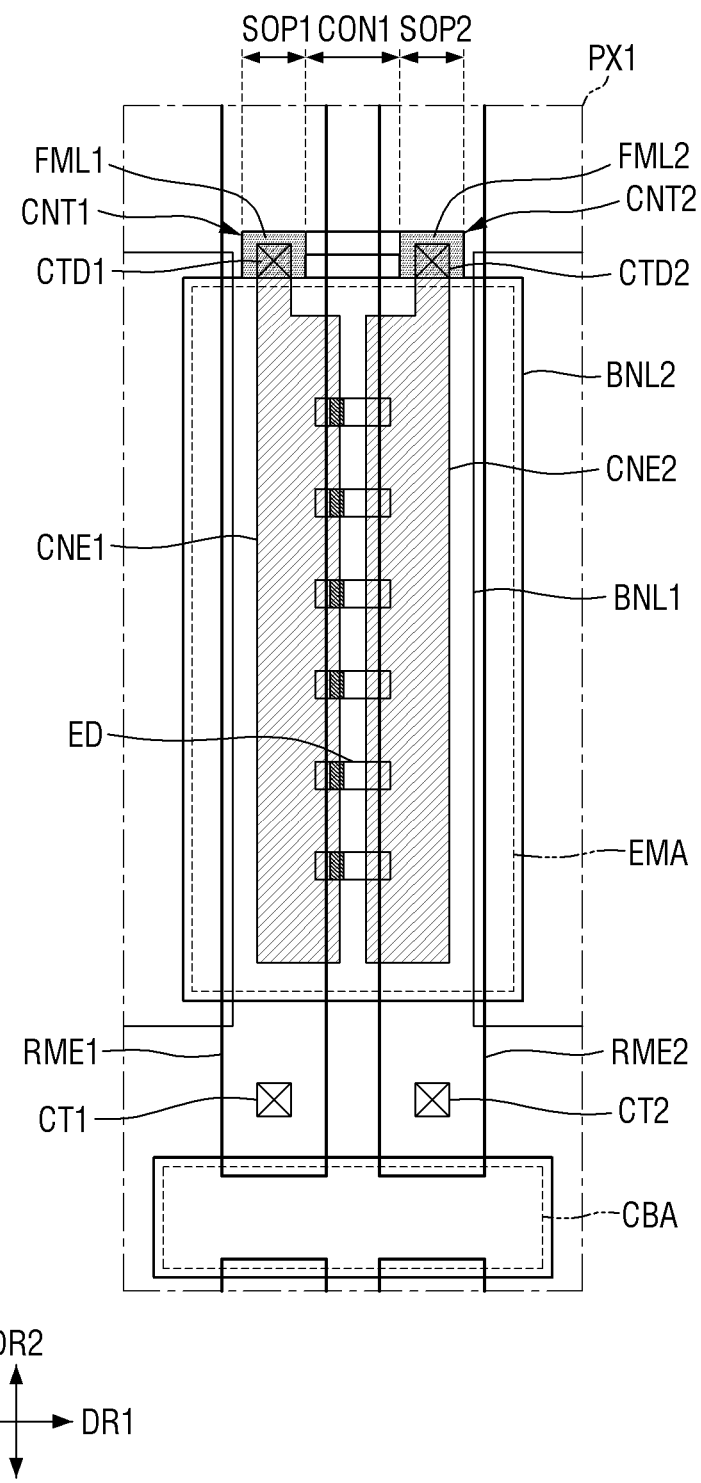
FIG. 13 is a plan view showing a sub-pixel of a display device according to an embodiment of the present disclosure.
Figure 14:
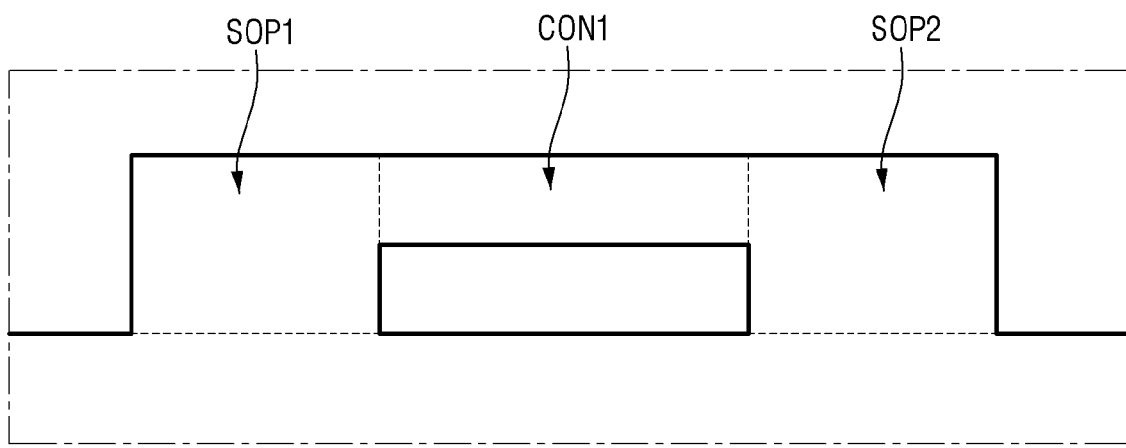
FIG. 14 is an enlarged plan view of a first sub-opening shown in FIG. 13.

FIG. 13 is a plan view showing a sub-pixel of a display device according to another embodiment of the present disclosure, and FIG. 14 is an enlarged plan view of a first sub-opening shown in FIG. 13.

Referring to FIGS. 13 and 14, a display device according to another embodiment is different from the display devices according to the embodiments shown in FIGS. 3 to 12 in that the shapes of sub-openings SOP1 and SOP2 are different when viewed from the top. In the following description, redundant description of components will be omitted and the different sub-openings SOP1 and SOP2 will be primarily described.

According to an embodiment of the present disclosure, the sub-openings SOP1 and SOP2 may be connected with each other by (e.g., may communicate with each other via) a first connection opening CON1 at a position spaced apart from the first main opening MOP1. The first connection opening CON1 may be disposed to be spaced apart from the first main opening MOP1 in the second direction DR2 and may be extended in the first direction DR1. The first connection opening CON1 may be formed by removing a portion of the second bank BL2 and may expose the first insulating layer PAS1 thereunder.

The first sub-opening SOP1 may overlap the first contact opening CNT1 in the first insulating layer PAS1, and the second sub-opening SOP2 may overlap the second contact opening CNT2 in the first insulating layer PAS1. In other embodiments, however, the first connection opening CON1 may overlap the first insulating layer PAS1 and may be spaced apart from the first contact opening CNT1 and the second contact hole CNT2. The first connection opening CON1 may be located between the first contact opening CNT1 and the second contact opening CNT2.

In addition, the metal layers FML1 and FML2 may be disposed in the contact openings CNT1 and CNT2 of the sub-openings SOP1 and SOP2, respectively. No contact opening is formed in the first connection opening CON1 but the first insulating layer PAS1 is disposed therein, and thus, it may not overlap the metal layers FML1 and FML2. Because the ink containing the light-emitting diodes ED may be prevented or substantially prevented from spreading by the metal layers FML1 and FML2 in the sub-openings SOP1 and SOP2, the ink does not spread to the first connection opening CON1. Accordingly, the metal layers FML1 and FML2 may be omitted from (e.g., may not extend into) the first connection opening CON1.

According to an embodiment of the present disclosure, by connecting the sub-openings SOP1 and SOP2 with the first connection opening CON1, the patterning size of the sub-openings SOP1 and SOP2 can be increased so that the process can be easier. Although only one first electrode RME1 and only one second electrode RME2 are included in each of the sub-pixels PXn in the above embodiments, the present disclosure is not limited thereto. The display device 10 may include greater numbers of electrodes and light-emitting diodes in each of the sub-pixels PXn.

Figure 15:
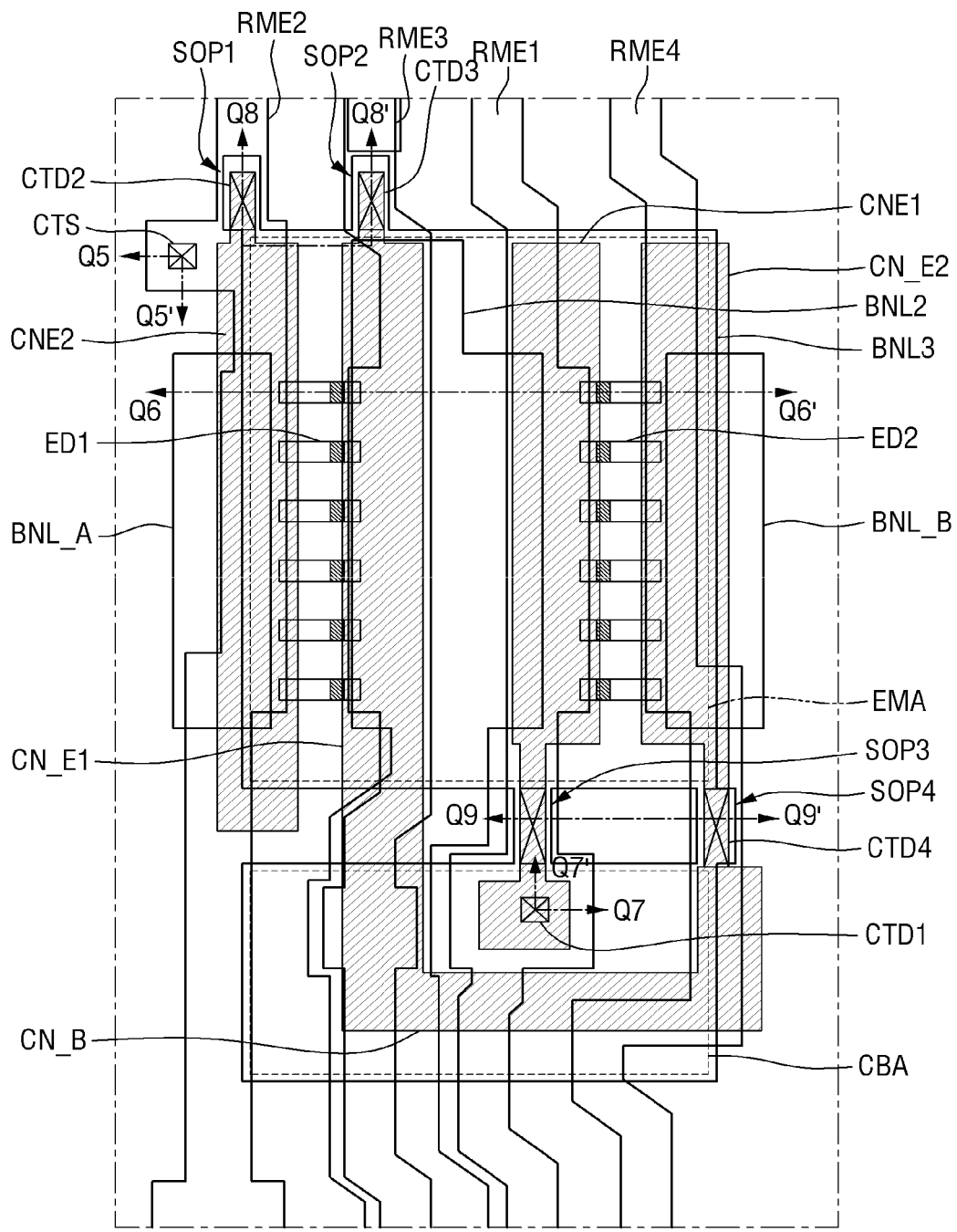
FIG. 15 is a plan view showing a sub-pixel of a display device according to an embodiment of the present disclosure.
Figure 16:
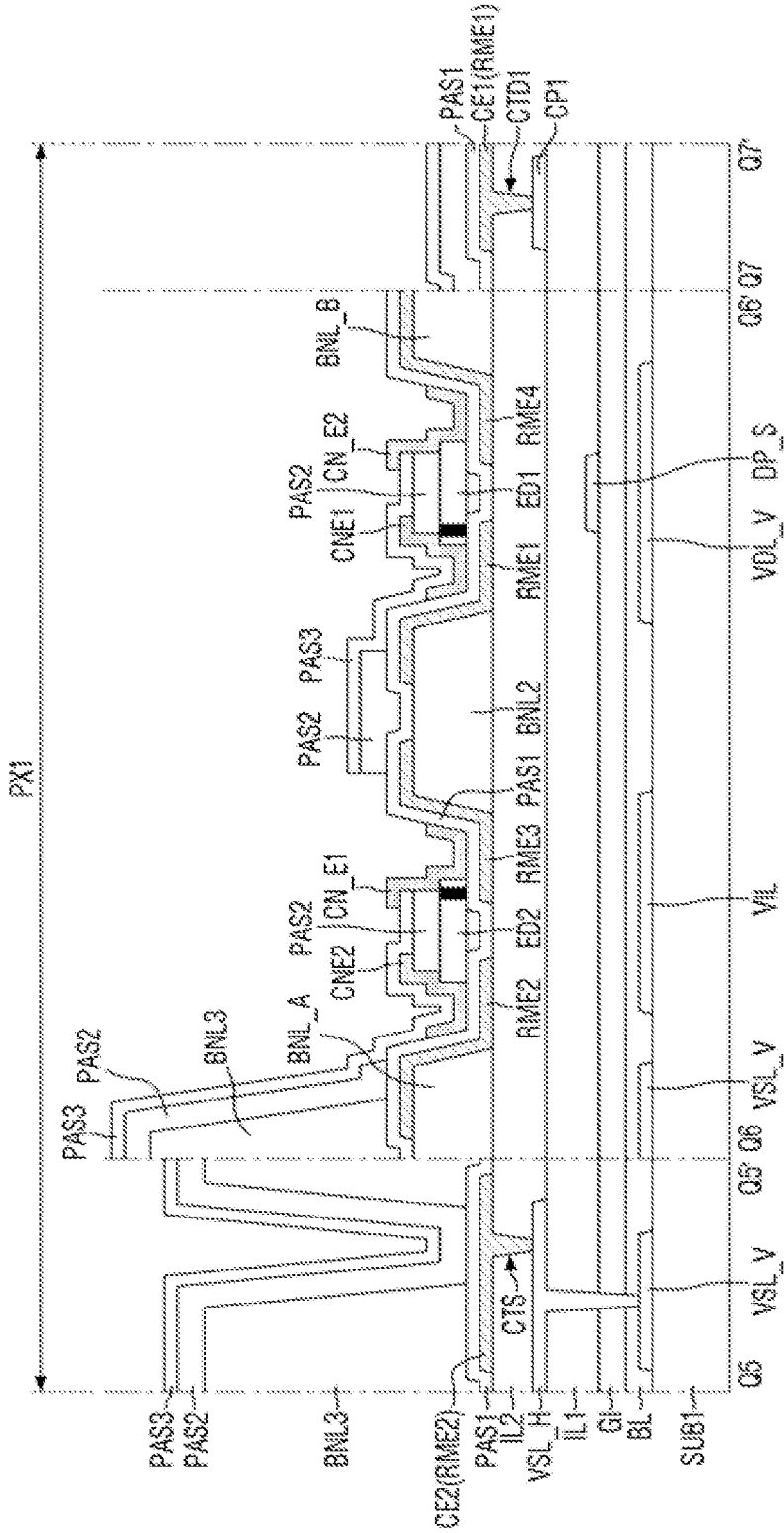
FIG. 16 is a cross-sectional view taken along the lines Q5-Q5', Q6-Q6', and Q7-Q7' of FIG. 15.

FIG. 15 is a plan view showing a sub-pixel of a display device according to another embodiment of the present disclosure, and FIG. 16 is a cross-sectional view taken along the lines Q5-Q5', Q6-Q6', and Q7-Q7' of FIG. 15. For brevity, descriptions will focus on differences from the above embodiments and the redundant descriptions will be omitted.

Referring to FIGS. 15 and 16, a plurality of transistors and a plurality of lines may be disposed on a first substrate SUB1. A first conductive layer may be disposed on the first substrate SUB1. The first conductive layer may include vertical line portions VDL_V and VSL_V of voltage lines VDL and VSL, and an initializing voltage line VIL. The first conductive layer may further include a plurality of data lines.

The vertical line portions VDL_V and VSL_V of the first voltage line VDL and the second voltage line VSL may be extended in the second direction DR2, and a first supply voltage and a second supply voltage may be applied thereto. The first vertical line portion VDL_V of the first voltage line VDL may be connected to a drain electrode of a transistor. The initializing voltage line VIL may be extended in the second direction DR2 and may be disposed between the vertical line portions VDL_V and VSL_V. The initializing voltage line VIL may transfer an initializing voltage to the transistor of each of the sub-pixels PXn.

A buffer layer BL may be disposed entirely on the first conductive layer and the first substrate SUB1. A first gate insulator GI may be disposed on the buffer layer BL and may be disposed to cover the buffer layer BL entirely. A first interlayer dielectric layer IL1 may be disposed on the first gate insulator GI.

A horizontal line portion VSL_H and a first extended electrode portion CP1 of the second voltage line VSL may be disposed on the first interlayer dielectric layer IL1. The horizontal line portion VSL_H of the second voltage line VSL may be connected to the vertical line portion VSL_V of the second voltage line VSL to receive the second supply voltage. The first extended electrode portion CP1 may directly contact the first electrode RME1 through the first contact CTD1. A second interlayer dielectric layer IL2 may be disposed on the horizontal line portion VSL_H and the first extended electrode portion CP1 of the second voltage line VSL.

On the second interlayer dielectric layer IL2, a plurality of first banks BNL1, a plurality of electrodes RME, light-emitting diodes ED (e.g., ED1 and ED2), a second bank BNL2, a third bank BNL3, and a plurality of connection electrodes CNE1, CNE2, and CNE3 may be disposed. In addition, a plurality of insulating layers PAS1, PAS2, and PAS3 may be further disposed on the second interlayer dielectric layer IL2.

The plurality of first banks BNL1 and the second bank BNL2 may be disposed directly on the second interlayer dielectric layer IL2. A portion of each of the plurality of first banks BNL1 may be disposed in the emission area EMA of each of the sub-pixels PXn and may be spaced apart from one another. For example, the first bank BNL1 may include a plurality of sub-banks BNL_A and BNL_B spaced apart from each other in the first direction DR1 in each emission area EMA. The first sub-bank BNL_A may be disposed on the left side of the center of the emission area EMA, and the second sub-bank BNL_B may be disposed on the right side thereof. A portion of each of the first sub-bank BNL_A and the second sub-bank BNL_B may overlap a portion of the third bank BNL3 extended in the second direction DR2. The first banks BNL1 may have a shape extended in the second direction DR2 and may have a length smaller than the length of the open area surrounded by the third bank BNL3 in the second direction DR2. The first banks BNL1 may form an island-like pattern extended in one direction on the front surface of the display area DPA.

The second bank BNL2 may be disposed between the first banks BNL1 and may be extended in the second direction DR2. Different from the first banks BNL1, the second bank BNL2 may be extended in the second direction DR2 beyond the emission area EMA and the cut area CBA, and may be disposed in a plurality of adjacent pixels PX in the second direction DR2. According to an embodiment of the present disclosure, a width of the portion of the second bank BNL2 that is disposed between the first banks BNL1 may be larger than the widths of the other parts, and a plurality of electrodes RME may be disposed on the part between the first banks BNL1. The second bank BNL2 may be generally extended in the second direction DR2 but may include parts having larger widths, to form a linear or stripe pattern in the display area DPA.

The first banks BNL1 and the second bank BNL2 may have a structure that at least partly protrudes from the upper surface of the second interlayer dielectric layer IL2. The first banks BNL1 and the second bank BNL2 may define an inner region therebetween and an outer region on the second interlayer dielectric layer IL2. A plurality of light-emitting diodes ED may be disposed between the first sub-bank BNL_A and the second bank BNL2 and between the second bank BNL2 and the second sub bank BNL_B. The protruding parts of the first banks BNL1 and the second bank BNL2 may have inclined side surfaces. The light emitted from the light-emitting diodes ED may be reflected by the electrodes RME disposed on the first banks BNL1 and the second bank BNK2 so that the light may exit toward the upper side of the first substrate SUB1. The first banks BNL1 may provide the area in which the light-emitting diodes ED are disposed and may also act as reflective walls that reflect light emitted from the light-emitting diodes ED upwardly. The side surfaces of the first banks BNL1 may be inclined in a linear shape, but the present disclosure is not limited thereto. The first banks BNL1 may have a semicircle or semi-ellipse shape with curved outer surface.

The electrodes RME have a shape extended in a direction and are spaced apart from one another to be disposed in each of the sub-pixels PXn. For example, a first electrode RME1, a second electrode RME2, a third electrode RME3, and a fourth electrode RME4 may be disposed in a single sub-pixel PXn, and they may be extended in the second direction DR2 and may be spaced apart from one another in the first direction DR1. The first electrode RME1 and the third electrode RME3 may be partially disposed on the second bank BNL2, the second electrode RME2 may be partially disposed on the first sub-bank BNL_A, and the fourth electrode RME4 may be partially disposed on the second sub-bank BNL_B.

The first electrode RME1 may be extended in the second direction DR2 and disposed beyond the emission area EMA and may be separated from the first electrode RME1 of another pixel PX adjacent thereto in the second direction DR2 at the cut area CBA. The first electrode RME1 may have been extended in the second direction DR2 and disposed across the plurality of pixels PX before a part thereof is removed at the cut area CBA so that it is disposed separately in each of the sub-pixels PXn. For example, the first electrode RME1 may be partially disposed at the boundary with another pixel PX adjacent thereto in the second direction DR2. In addition, according to an embodiment of the present disclosure, the first electrode RME1 may include a first electrode contact portion CE1 disposed at the cut area CBA. The first electrode contact portion CE1 may be electrically connected to a transistor through a first electrode contact opening (e.g., a first electrode contact hole) FCT penetrating through the second interlayer dielectric layer CE1 so that the first supply voltage may be applied thereto. Because the first electrode RME1 is disposed separately in each of the pixels PX or in each of the sub-pixels PXn, the light-emitting diodes ED of different sub-pixels PXn can emit light individually.

The third electrode RME3 may be disposed on one of the side surfaces of the second bank BNL2 that faces the first sub-bank BNL_A. The third electrode RME3 may be disposed on the second bank BNL2 and may be extended in the second direction DR2. The third electrode RME3 may be disposed on the second bank BNL2 so that it is spaced apart from the first electrode RME1 in the first direction DR1. One side of the third electrode RME3 in the second direction DR2 may be disposed in the emission area EMA while the opposite side thereof may be disposed in the cut area CBA. Different from the first electrode RME1, the third electrode RME3 may be disposed across the emission area EMA and the cut area CBA in each of the sub-pixels PXn, and may not be disposed at the boundary with an adjacent pixel PX in the second direction DR2.

The second electrode RME2 may be disposed on one of the side surfaces of the first sub-bank BNL_A that faces the second bank BNL2. The second electrode RME2 may be disposed in the emission area EMA, and another portion thereof may be disposed to overlap the third bank BNL3 and may be substantially extended in the second direction DR2 under the third bank BNL3. According to an embodiment of the present disclosure, the second electrode RME2 may be extended in the second direction DR2 beyond the emission area EMA and the cut area CBA. One second electrode RME2 may be disposed across a plurality of pixels PX adjacent to each other in the second direction DR2. Different from the first electrode RME1, the second electrode RME2 may not be separated at the cut area CBA. In addition, according to an embodiment of the present disclosure, the second electrode RME2 may include a second electrode contact portion CE2 that is disposed at the boundary with an adjacent pixel PX in the second direction DR2 and overlaps the second horizontal line portion VSL_H in the thickness direction. The second electrode contact portion CE2 may be electrically connected to the second horizontal line portion VSL_H of the third conductive layer through a second electrode contact opening (e.g., a second electrode contact hole) CTS penetrating through the second interlayer dielectric layer IL2. Because the second electrode RME2 is disposed in the sub-pixels PXn adjacent to each other in the second direction DR2 across the plurality of pixels PX, they may receive the second supply voltage through the same second electrode RME2. Because the first supply voltage is individually applied to each of the sub-pixels PXn through the first electrode RME1, the sub-pixels PXn can be driven individually even though the second electrode RME2 is disposed across the plurality of sub-pixels PXn.

The fourth electrode RME4 may be disposed on one of the side surfaces of the second sub-bank BNL_B that faces the second bank BNL2. Similar to the second electrode RME2, the fourth electrode RME4 may also be extended in the second direction DR2 and may be disposed beyond the emission area EMA and the cut area CBA. However, different from the second electrode RME2, the fourth electrode RME4 may be separated from the fourth electrode RME4 of another pixel PX adjacent thereto at the cut area CBA. The fourth electrode RME4 may be substantially symmetrical with the second electrode RME2 except that the fourth electrode RME4 includes no electrode contact portion and is separated at the cut area CBA.

According to an embodiment of the present disclosure, a plurality of electrodes RME may be formed by forming a plurality of electrode lines extended in the second direction DR2 on which light-emitting diodes ED are disposed during the process of fabricating the display device 10, and then by separating them at the cut area CBA. The second electrode RME2 may not be separated at the cut area CBA but may remain as an electrode line, whereas the electrode lines may be partially removed at the cut area CBA to form the first electrode RME1, the third electrode RME3, and the fourth electrode RME4. The plurality of electrode lines may be utilized to generate an electric field for disposing the light-emitting diodes ED during the process of fabricating the display device 10. After disposing the light-emitting diodes ED, the electrode lines are separated at the cut area CBA to form the electrodes RME, and then a driving signal for driving the light-emitting diodes may be applied to the electrodes RME.

A plurality of light-emitting diodes ED may be disposed on the plurality of electrodes RME. The plurality of electrodes RME may be disposed on the inclined side surfaces of the first banks BNL1 or the second bank BNL2. Each of the electrodes RME may be disposed to cover at least one side of the first banks BNL1 or the second bank BNK2 to reflect light emitted from the light-emitting diodes ED.

The first insulating layer PAS1 is disposed entirely on the second interlayer dielectric layer IL2. For example, the first insulating layer PAS1 may be disposed to cover the plurality of electrodes RME, the first banks BNL1, and the second bank BNL2. The first insulating layer PAS1 may include openings via which portions of the upper surfaces of the electrodes RME1 and RME2 are exposed. The connection electrodes CNE1, CNE2, and the CNE3 may contact the electrodes RME exposed through the openings.

In an embodiment, the first insulating layer PAS1 may have a step so that a portion of the upper surface is recessed between the electrodes RME spaced apart from each other in the first direction DR1. As the first insulating layer PAS1 is disposed to cover the electrodes RME, it may have the step between them. The first insulating layer PAS1 can protect the electrodes RME and insulate them from one another. In addition, it can prevent or substantially prevent the light-emitting diodes ED disposed on the first insulating layer PAS1 from contacting other elements and being damaged.

The third bank BNL3 may be disposed on the first insulating layer PAS1. The third bank BNL3 may be disposed in a lattice pattern, including portions extended in the first direction DR1 and the second direction DR2 when viewed from the top. The third bank BNL3 may be disposed along the border of each of the sub-pixels PXn to distinguish adjacent sub-pixels PXn from one another. In addition, the third bank BNL3 may be disposed to surround the emission area EMA and the cut area CBA disposed in each of the sub-pixels PXn to distinguish them. The portion of the third bank BNL3 extended in the second direction DR2 may have the same width between the emission areas EMA and between the cut areas CBA. Accordingly, the distance between the cut areas CBA may be equal or substantially equal to the distance between the emission areas EMA. It is, however, to be understood that the present disclosure is not limited thereto.

The third bank BNL3 may be disposed so that it partially overlaps the electrodes RME thereunder in the thickness direction. For example, the third bank BNL3 may be disposed at the boundary of the sub-pixel PXn, and a portion thereof extended in the second direction DR2 may overlap the second electrode RME2 and the fourth electrode RME4. In addition, a portion of the third bank BNL3 that surrounds the cut area CBA may overlap the plurality of electrodes RME, and a portion thereof that is extended in the first direction DR1 may overlap the first electrode RME1, the second electrode RME2, and the fourth electrode RME4 at the boundary with a pixel PX adjacent thereto in the second direction DR2.

The third bank BNL3 may have a height greater than that of each of the first bank BNL1 and the second bank BNL2. The third bank BNL3 can prevent or substantially prevent the ink in which different light-emitting diodes ED are dispersed from overflowing to adjacent sub-pixels PXn during the inkjet printing process of the processes of fabricating the display device 10 so that different sub-pixels PXn can be separated from one another and the ink is not mixed. A portion of the third bank BNL3 extended in the second direction DR2 may be disposed on the first banks BNL1. Although the third bank BNL3 is disposed on a different layer from the first bank BNL1 in the drawings, the present disclosure is not limited thereto. In some embodiments, the third bank BNL3 may be formed via the same process and disposed on the same layer as the first banks BNL1.

The light-emitting diodes ED may be disposed on the first insulating layer PAS1. The light-emitting diodes ED may be spaced apart from one another in the second direction DR2 in which the electrodes RME are extended and may be aligned substantially parallel to one another. The light-emitting diodes ED may have a shape extended in one direction. The direction in which the electrodes RME are extended may be substantially perpendicular to the direction in which the light-emitting diodes ED are extended. It is, however, to be understood that the present disclosure is not limited thereto. The light-emitting diodes ED may be oriented obliquely to the direction in which the electrodes RME are extended.

The light-emitting diodes ED may be disposed on the electrodes RME between the first banks BNL1 and the second bank BNL2. The length of the light-emitting diodes ED may be larger than the distance between the electrodes RME spaced apart from each other in the first direction DR1, and the both ends (e.g., the opposite ends) of the light-emitting diodes ED may be disposed on different electrodes RME, respectively.

The light-emitting diodes ED may include a first light-emitting diode ED1 disposed such that a first end is on the first electrode RME1 and a second end is on the fourth electrode RME4, and a second light-emitting diode ED2 disposed such that a first end is on the third electrode RME3 and a second end is on the second electrode RME2. The first light-emitting diode ED1 may be disposed between the second bank BNL2 and the second sub-bank BNL_B such that the first end is placed on the first electrode RME1 and the second end is placed on the fourth electrode RME4. The second light-emitting diode ED2 may be disposed between the second bank BNL2 and the first sub-bank BNL_A such that the first end is placed on the third electrode RME3 and the second end is placed on the second electrode RME2. The light-emitting diodes ED disposed in a single sub-pixel PXn may include the first and second light-emitting diodes ED1 and ED2 having the first ends facing in the opposite directions.

The light-emitting diodes ED may be electrically connected to the electrodes RME through the connection electrodes CNE1, CNE2, and CNE3. The second end of the first light-emitting diode ED1 and the first end of the second light-emitting diode ED2 may be electrically connected to each other through the same connection electrode, and accordingly, the first light-emitting diode ED1 and the second light-emitting diode ED2 may be connected with each other in series.

The second insulating layer PAS2 may be partially disposed on the first insulating layer PAS1 and the light-emitting diodes ED. In addition, the second insulating layer PAS2 may also be disposed on the third bank BNL3 and in the cut area CBA. For example, the second insulating layer PAS2 may be disposed to partially surround the outer surfaces of the light-emitting diodes ED so that the ends and the opposite ends of the light-emitting diodes ED are not covered. In addition, a portion of the second insulating layer PAS2 may overlap the second bank BNL2 and may be disposed on the first insulating layer PAS1. For example, the second insulating layer PAS2 may be disposed on the light-emitting diodes ED, the first insulating layer PAS1, and the third bank BNL3 in the emission area EMA such that portions thereof where the electrodes RME are disposed and the both ends of the light-emitting diodes ED are exposed. The second insulating layer PAS2 may have such a shape as it is formed entirely on the first insulating layer PAS1 and the third bank BNL3 during the process of fabricating the display device 10 and is then removed during the process of exposing both ends of the light-emitting diodes ED.

The portion of the second insulating layer PAS2 which is disposed on the light-emitting diode ED may be extended in the second direction DR2 on the first insulating layer PAS1 when viewed from the top, thereby forming a linear or island-like pattern in each of the sub-pixels PXn. The second insulating layer PAS2 protects the light-emitting diodes ED and fixes the light-emitting diodes ED during the process of fabricating the display device 10. In addition, the second insulating layer PAS2 may be disposed to fill the space between light-emitting diodes ED and the first insulating layer PAS1 thereunder.

During the process of fabricating the display device 10, a process of separating the electrode lines at the cut area CBA to form the electrodes RME may be performed after the second insulating layer PAS2 has been formed. The second insulating layer PAS2 may be disposed entirely in the cut area CBA and the emission area EMA and may be partially removed during the processes of exposing the both ends of the light-emitting diodes ED and separating the electrodes. In the cut area CBA, the first insulating layer PAS1 and the second insulating layer PAS2 may be removed between separated the electrode lines, and a third insulating layer PAS3 to be described below may be disposed directly on the second interlayer dielectric layer IL2.

A plurality of connection electrodes CNE1, CNE2, and CNE3 and the third insulating layer PAS3 may be disposed on the second insulating layer PAS2. The connection electrodes CNE1, CNE2, and CNE3 include a first connection electrode CNE1 and a second connection electrode CNE2 disposed on the same layer and a third connection electrode CNE3 disposed on a different layer from them. The third insulating layer PAS3 may be disposed between the first connection electrode CNE1 and the third connection electrode CN_E2 and between the second connection electrode CNE2 and the third connection electrode CN_E1.

The plurality of connection electrodes CNE1, CNE2, and CNE3 may contact the light-emitting diodes ED and the electrodes RME. The plurality of connection electrodes CNE1, CNE2, and CNE3 may directly contact the semiconductor layer exposed at the both end surfaces of the light-emitting diodes ED and may contact the exposed upper surfaces of the electrodes RME where the first insulating layer PAS1 is not disposed. The both ends of the light-emitting diodes ED may be electrically connected to the electrodes RME through the plurality of connection electrodes CNE1, CNE2, and CNE3.

The first connection electrode CNE1 may be disposed on the first electrode RME1, and the second connection electrode CNE2 may be disposed on the second electrode RME2. The first connection electrode CNE1 may include a first contact CTD1, and the first contact CTD1 may contact the first electrode RME1 exposed by the first insulating layer PAS1. The first contact CTD1 may not be located in the emission area EMA. A more detailed description thereon will be given below. The first connection electrode CNE1 may contact the first end of the first light-emitting diode ED1 and the first electrode RME1, and the first light-emitting diode ED1 may be electrically connected to the first electrode RME1 through the first connection electrode CNE1.

The second connection electrode CNE2 may be disposed on the second electrode RME2 and may have a shape extended in the second direction DR2. In addition, the second connection electrode CNE2 may be disposed on the second electrode RME2 and may include a second contact CTD2. The second contact CTD2 may contact the second electrode RME2 exposed by the first insulating layer PAS1. In some embodiments, the second contact CNT2 may be disposed on a second electrode contact portion CE2 of the second electrode RME2. The second connection electrode CNE2 may contact the second end of the second light-emitting diode ED2 and the second electrode RME2, and the second light-emitting diode ED2 may be electrically connected to the second electrode RME2 through the second connection electrode CNE2. The first connection electrode CNE1 and the second connection electrode CNE2 may be disposed directly on the second insulating layer PAS2.

The third insulating layer PAS3 may be disposed on the first connection electrode CNE1 and the second connection electrode CNE2. The third insulating layer PAS3 may cover the first connection electrode CNE1 and the second connection electrode CNE2, and a portion thereof may also be disposed on the second insulating layer PAS2. In some embodiments, the third insulating layer PAS3 may be disposed entirely on the first insulating layer PAS1 except for a portion where the third connection electrode CNE3 is disposed on the electrodes RME. The third insulating layer PAS3 may insulate the first connection electrode CNE1, the second connection electrode CNE2, and the third connection electrode CNE3 from one another so that they are not in direct contact with one another. The third insulating layer PAS3 may be disposed between the first connection electrode CNE1 and the third connection electrode CN_E2 and between the second connection electrode CNE2 and the third connection electrode CN_E1 to insulate them from one another. In some embodiments, the third insulating layer PAS3 may be omitted. In such an embodiment, the first connection electrode CNE1, the second connection electrode CNE2, and the third connection electrode CNE3 may be disposed on the same layer.

The third connection electrode CNE3 may include a first extended portion CN_E1 disposed on the third electrode RME3, a second extended portion CN_E2 disposed on the fourth electrode RME4, and a plurality of bridge portions CN_B connecting between the first extended portion CN_E1 and the second extended portion CN_E2. The first extended portion CN_E1 and the second extended portion CN_E2 may have a substantially similar shape to the first connection electrode CNE1. The first extended portion CN_E1 and the second extended portion CN_E2 may have a shape extended in the second direction DR2. The length of the first extended portion CN_E1 and the second extended portion CN_E2 measured in the second direction DR2 may be larger than the length of the first connection electrode CNE1. The first extended portion CN_E1 and the second extended portion CN_E2 may be connected to each other through the bridge portions CN_B extended in the first direction DR1. The third connection electrode CNE3 may have a shape surrounding the first connection electrode CNE1 when viewed from the top.

In addition, the first extended portion CN_E1 and the second extended portion CN_E2 may include a third contact CTD3 located on the third electrode RME3 and a fourth contact CTD4 located on the fourth electrode RME4. The third and fourth contacts CTD3 and CTD4 may contact the third and fourth electrodes RME3 and RME4 exposed by the first insulating layer PAS1. The third contact CTD3 and the fourth contact CTD4 may be located so that they do not overlap the emission area EMA.

The first extended portion CN_E1 of the third connection electrode CNE3 may contact the second end of the first light-emitting diode ED1, and the second extended portion CN_E2 thereof may contact the first end of the second light-emitting diode ED2. The first light-emitting diodes ED1 and the second light-emitting diodes ED2 may be connected to each other in series through the third connection electrode CNE3.

Another insulating layer may be disposed on the connection electrodes CNE1, CNE2, and CNE3 and the third insulating layer PAS3 to cover them. The insulating layer may be disposed entirely on the first substrate SUB1 to protect the elements disposed thereon against the external environment.

As described above, in the display device 10 according to an embodiment, the positions of the contacts CTD1, CTD2, CTD3, and CTD4 may be determined to prevent or substantially prevent the light-emitting diodes ED from deviating during the process aligning the light-emitting diodes ED. Hereinafter, the positions of the contacts CTD1, CTD2, CTD3, and CTD4 and the configuration of the second bank BNL2 and the third bank BNL3 for them will be described in more detail with reference to other drawings.

Figure 17:
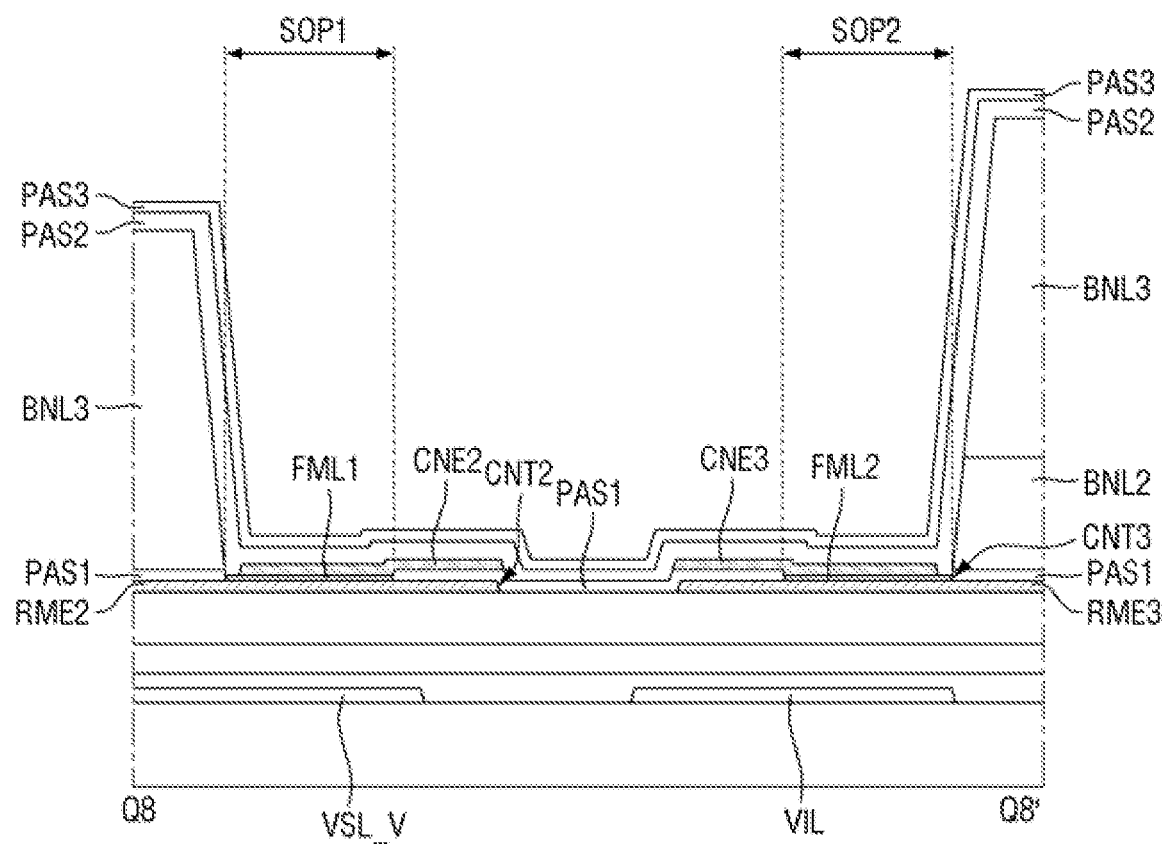
FIG. 17 is a cross-sectional view taken along the line Q8-Q8' of FIG. 15.
Figure 18:
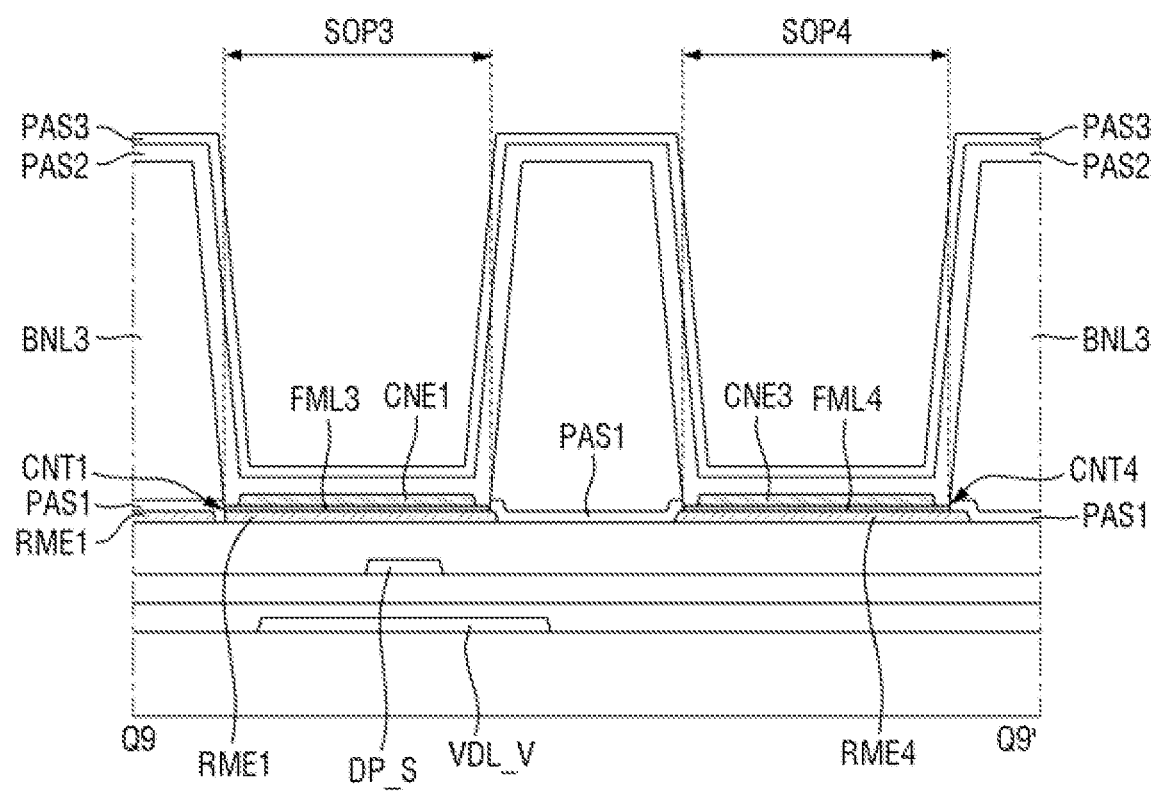
FIG. 18 is a cross-sectional view taken along the line Q9-Q9' of FIG. 15.
Figure 19:
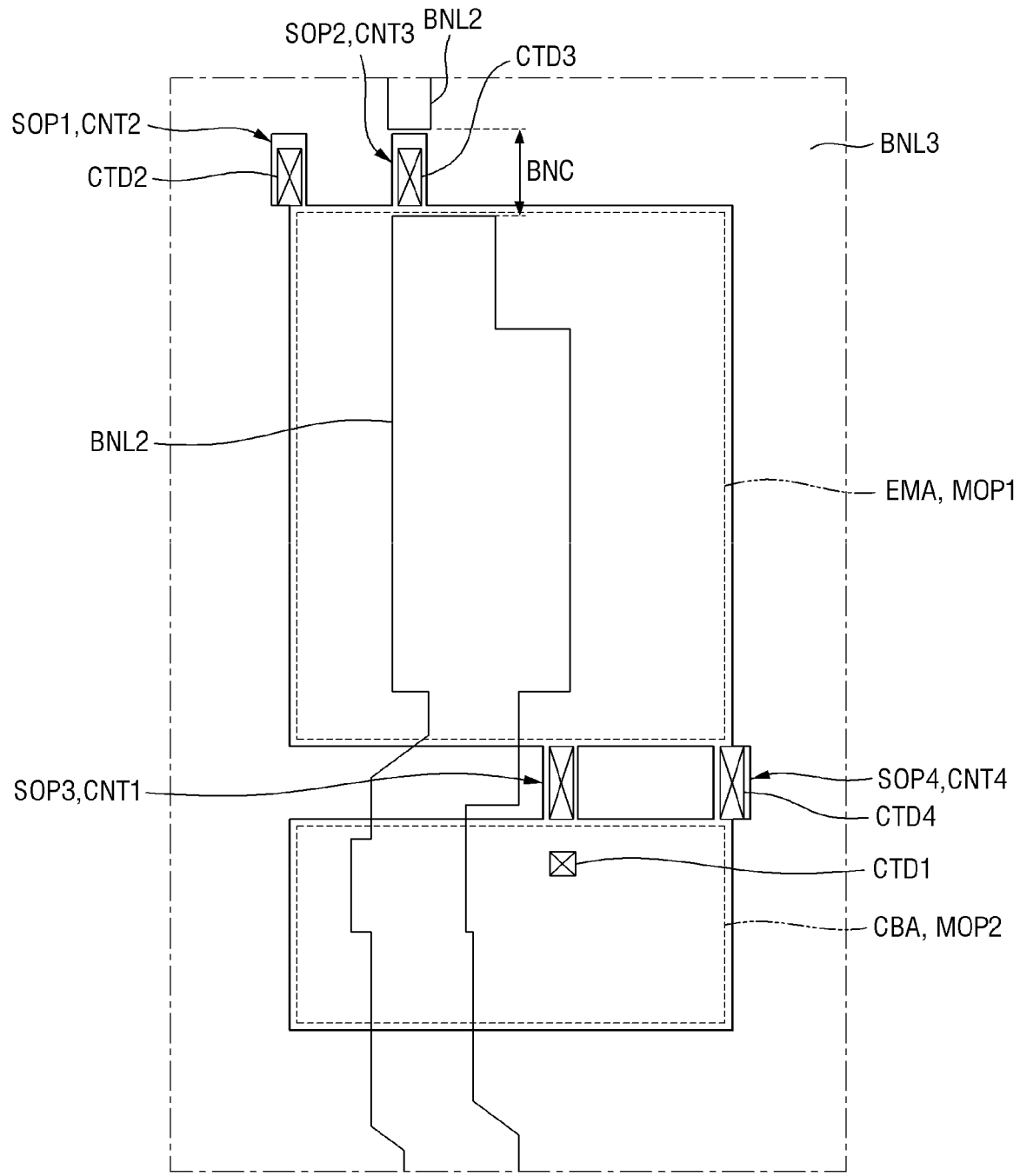
FIG. 19 is a plan view showing a second bank and a third bank of a display device according to an embodiment.
Figure 20:
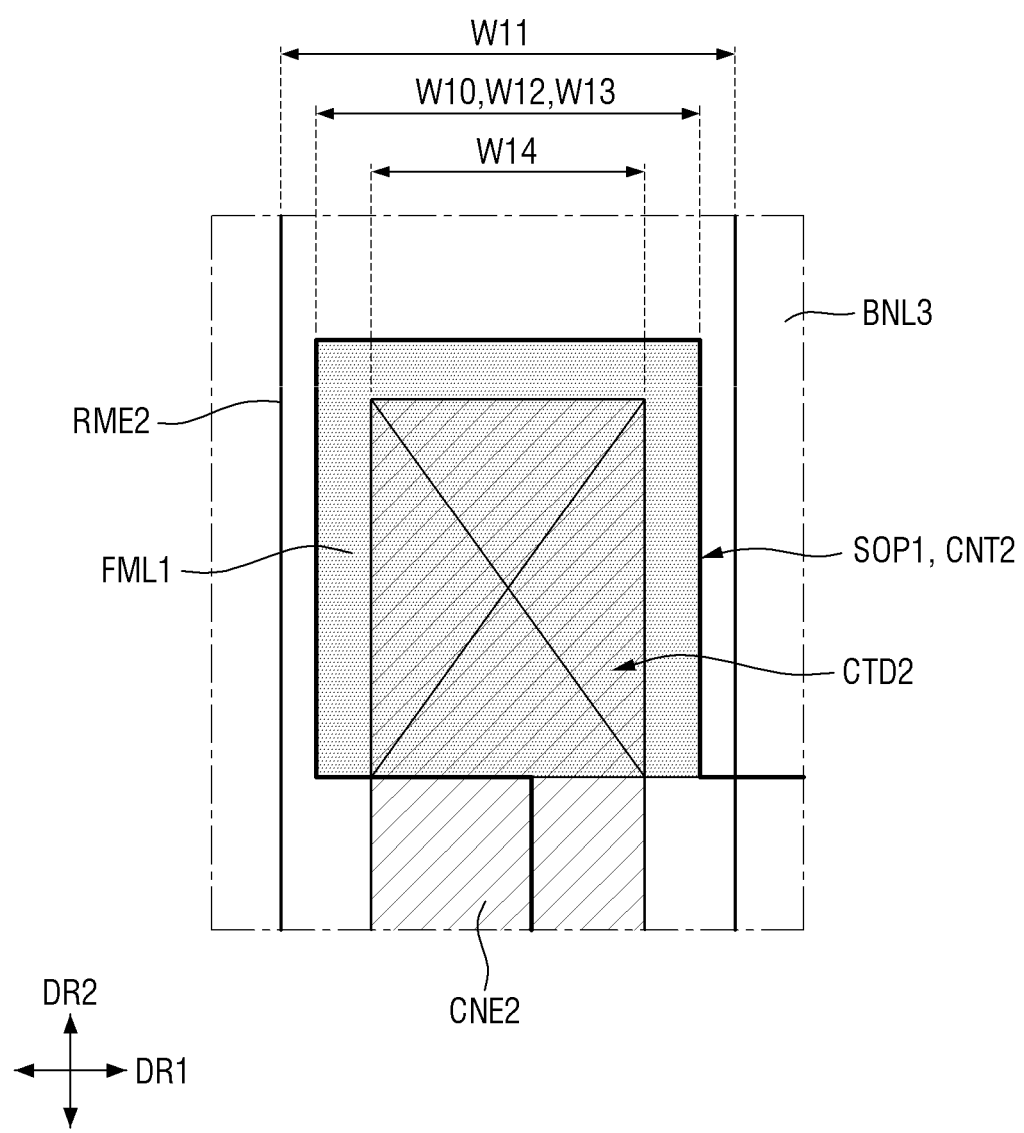
FIG. 20 is an enlarged plan view of a first sub-opening of a display device according to an embodiment.
Figure 21:
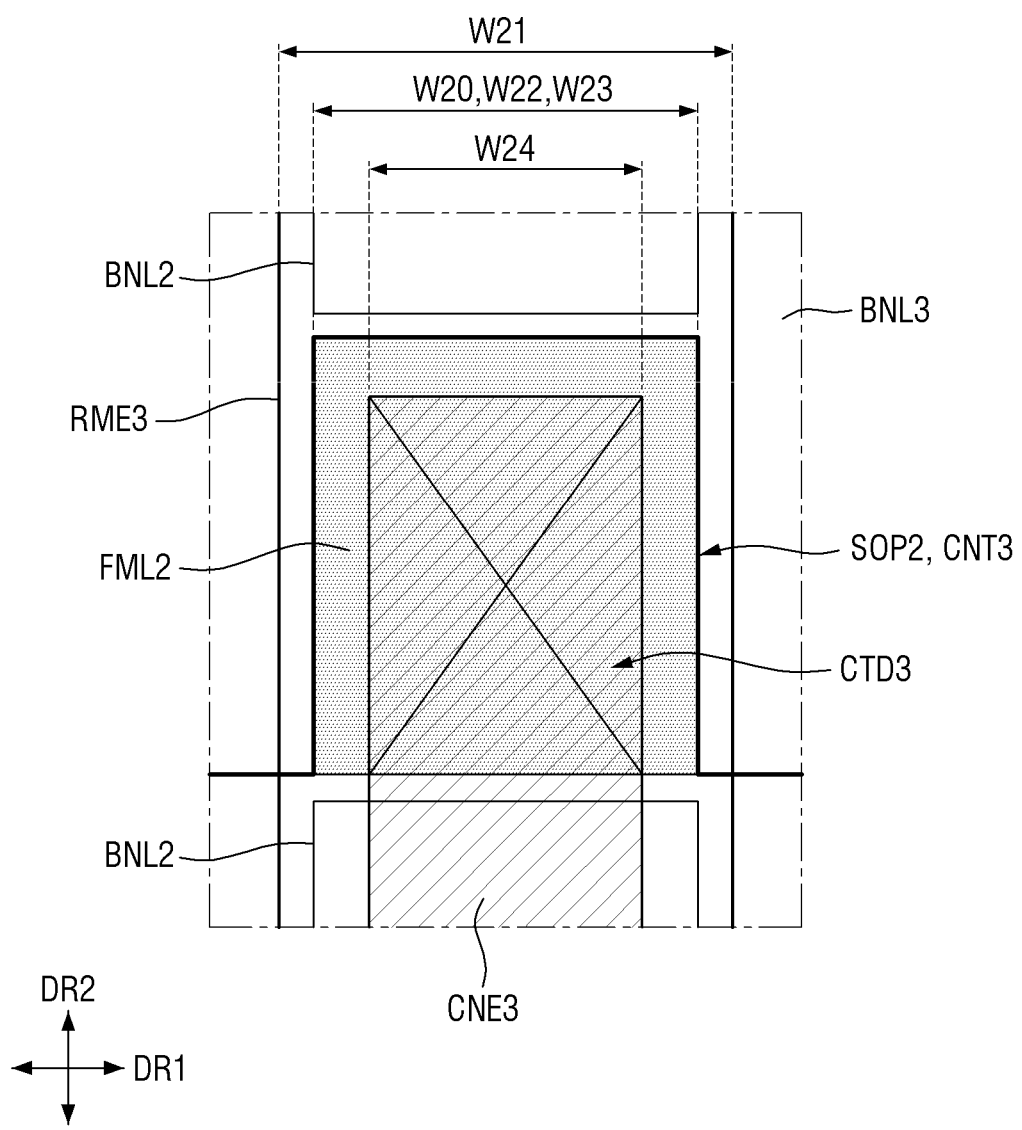
FIG. 21 is an enlarged plan view of a second sub-opening of a display device according to an embodiment.
Figure 22:
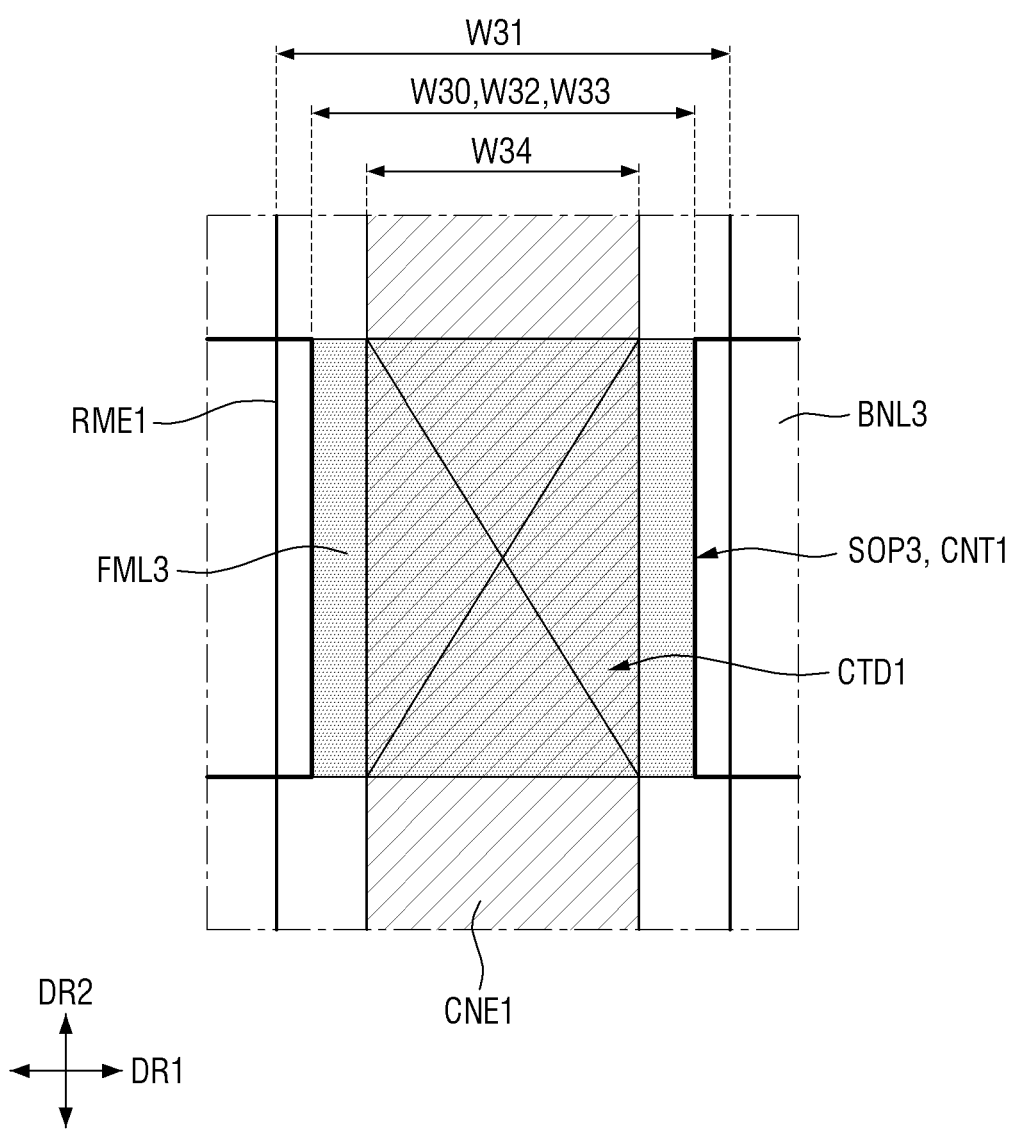
FIG. 22 is an enlarged plan view of a third sub-opening of a display device according to an embodiment.
Figure 23:
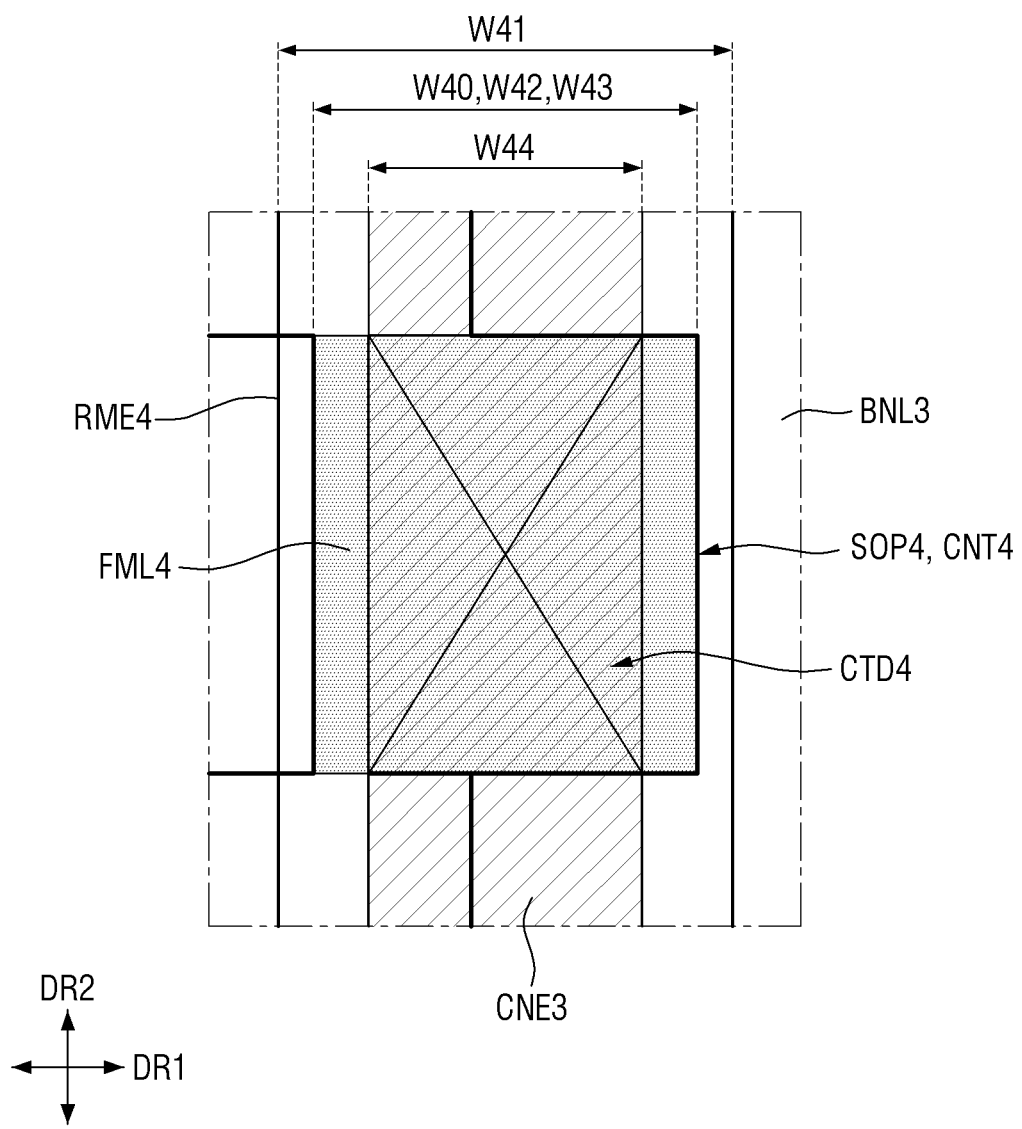
FIG. 23 is an enlarged plan view of a fourth sub-opening of a display device according to an embodiment.

FIG. 17 is a cross-sectional view taken along the line Q8-Q8' of FIG. 15, and FIG. 18 is a cross-sectional view taken along the line Q9-Q9' of FIG. 15. FIG. 19 is a plan view showing a second bank and a third bank of a display device according to an embodiment, FIG. 20 is an enlarged plan view of a first sub-opening of a display device according to an embodiment, FIG. 21 is an enlarged plan view of a second sub-opening of a display device according to an embodiment, FIG. 22 is an enlarged plan view of a third sub-opening of a display device according to an embodiment, and FIG. 23 is an enlarged plan view of a fourth sub-opening of a display device according to an embodiment.

Referring to FIGS. 17 to 23 in conjunction with FIGS. 15 and 16, the electrodes RME may be extended in the second direction DR2, and the connection electrodes CNE may overlap the electrodes RME. The first electrode RME1 may overlap the first connection electrode CNE1 to be connected to it, the second electrode RME2 may overlap the second connection electrode CNE2 to be connected to it, and the third electrode RME3 and the fourth electrode RME4 may overlap the third connection electrode CNE3 to be connected to it.

The third bank BNL3 may include a first main opening MOP1 defining the emission area EMA and a second main opening MOP2 defining the cut area CBA. The third bank BNL3 is not formed in the first main opening MOP1 and the second main opening MOP2, and the first insulating layer PAS1 and the first bank BNL1 disposed on the first substrate SUB may be exposed. The first main opening MOP1 may be substantially identical to the emission area EMA, and the second main opening MOP2 may be substantially identical to the cut area CBA.

According to an embodiment of the present disclosure, the third bank BNL3 may include a plurality of sub-openings SOP1, SOP2, SOP3, and SOP4 extended from the first main opening MOP1. The plurality of sub-openings SOP1, SOP2, SOP3, and SOP4 may be extended from the first main opening MOP1 in the second direction DR2 and may be spaced apart from one another in the first direction DR1. The first sub-opening SOP1 and the second sub-opening SOP2 may be disposed adjacent to an adjacent sub-pixel PXn in the second direction DR2 and may be disposed adjacent to each other. The third sub-opening SOP3 and the fourth sub-opening SOP4 may be located between the first main opening MOP1 and the second main opening MOP2, and they may be disposed adjacent to each other.

Each of the first sub-opening SOP1 and the second sub-opening SOP2 may have a closed shape except for the side extended from the first main opening MOP1. The third sub-opening SOP3 may have a shape connecting the first main opening MOP1 and the second main opening MOP2 continuously in the second direction DR2 and may contact the first main opening MOP1 and the second main opening MOP2. The fourth sub-opening SOP4 may also have a shape connecting the first main opening MOP1 and the second main opening MOP2 continuously and may contact the first main opening MOP1 and the second main opening MOP2. For example, the fourth sub-opening SOP4 may protrude in the first direction DR1 and may have a closed shape except the side connected to the first main opening MOP1 and the side connected to the second main opening MOP2.

The second bank BNL2 may be extended in the second direction DR2 crossing the emission area EMA and the cut area CBA. The second bank BNL2 may be extended while generally overlapping the third electrode RME3, with a portion partially overlapping the first electrode RME1. The second bank BNL2 may have a bank cut portion BNC cut by the second sub-opening SOP2. The bank cut portion BNC may be formed via an etching process of sequentially forming the second bank BNL2 and the third bank BNL3 and forming the second sub-opening SOP2. The bank cut portion BNC may expose the third electrode RME3 thereunder and may overlap the second sub-opening SOP2.

A contact CTD connected to the electrodes RME may be located in some of the plurality of sub-openings SOP. In the first sub-opening SOP1, a second contact CTD2 may be located where the second electrode RME2 and the second connection electrode CNE2 are connected with each other. In the second sub-opening SOP2, a third contact CTD3 may be located where the third electrode RME3 and the third connection electrode CNE3 are connected with each other. In the fourth sub-opening SOP4, a fourth contact CTD4 may be located where the fourth electrode RME4 and the third connection electrode CNE3 are connected with each other. In the third sub-opening SOP3, unlike the contacts CTD2, CTD3, and CTD4 described above, the first contact CTD1 where the first electrode RME1 and the first connection electrode CNE1 are connected with each other is not disposed and may not overlap the first contact CTD1.

According to an embodiment of the present disclosure, metal layers FML may be disposed between the first electrode RME1 and the first connection electrode CNE1, between the second electrode RME2 and the second connection electrode CNE2, between RME3 and the third connection electrode CNE3, and between the fourth electrode RME4 and the third connection electrode CNE3, in which a plurality of sub-openings SOP is disposed. The metal layers FML may be disposed on the surfaces of the electrodes RME, respectively, to impart hydrophobicity to the surfaces of the electrodes RME.

For example, in the first sub-opening SOP1, a first metal layer FML1 may be disposed on the surface of the second electrode RME2 exposed by the first sub-opening SOP1. In the second sub-opening SOP2, a second metal layer FML2 may be disposed on the surface of the third electrode RME3 exposed by the second sub-opening SOP2. In the third sub-opening SOP3, a third metal layer FML3 may be disposed on the surface of the first electrode RME1 exposed by the third sub-opening SOP3. In the fourth sub-opening SOP4, a fourth metal layer FML4 may be disposed on the surface of the fourth electrode RME4 exposed by the fourth sub-opening SOP4.

The metal layers FML may be formed by performing plasma treatment on the entire first substrate SUB after the first insulating layer PAS2, which exposes the electrodes RME, has been formed and the third bank BNL3 having the sub-openings SOP has been formed. Fluorine (F) may be injected onto the exposed surfaces of the electrodes RME by the plasma treatment so that the metal layers FML may be formed.

When the ink containing the light-emitting diodes ED is applied to the emission area EMA, the ink spreads in the emission area EMA, and the ink may spread to the plurality of sub-openings SOP extended from the third bank BNL3. According to an embodiment of the present disclosure, the metal layers FML having hydrophobicity is formed on the surfaces of the electrodes RME exposed at the plurality of sub-openings SOP so that the ink may not spread to the plurality of sub-openings SOP. By doing so, even if an electric field is strongly applied at the contacts CTD, the ink containing the light-emitting diodes ED may not spread to the sub-openings SOP in which the contacts CTD are located, thereby preventing or substantially preventing the light-emitting diodes ED from deviating. For example, for the first contact CTD1 located at the second main opening MOP2, the ink spreads from the emission area EMA (e.g., the first main opening MOP1) and then is blocked at the third sub-opening SOP3. Accordingly, the ink may not spread to the first contact CTD1.

The metal layers FML may have different thicknesses depending on the process conditions. According to an embodiment of the present disclosure, the metal layers FML may have a thickness in a range of about 0.1 nm to about 10 nm to exhibit hydrophobic properties effectively.

According to an embodiment of the present disclosure, the plurality of sub-openings SOP may have a shape extended from the first main opening MOP1. As described above, in the first sub-opening SOP1, the second sub-opening SOP2, and the fourth sub-opening SOP4, the second contact CTD2, the third contact CTD3 and the fourth contact CTD4 may be located, respectively. The connection electrodes CNE1, CNE2, and CNE3 may be extended to the sub-openings SOP to be connected to the electrodes RME at the contacts CTD. When the plurality of sub-openings SOP has a shape extended from the first main opening MOP1, it is possible to prevent or substantially prevent the connection electrodes CNE from being disconnected due to the level difference of the thick third bank BNL3.

The widths of the plurality of sub-openings SOP may be equal to or less than the widths of the electrodes RME, respectively. The metal layers FML may be disposed at the bottom of the plurality of sub-openings SOP in order to prevent or substantially prevent the spread of the ink containing the light-emitting diodes ED. To this end, the plurality of sub-openings SOP1 may completely overlap the electrodes RME to form the metal layers FML in the plurality of sub-openings SOP, respectively. If the widths of the plurality of sub-openings SOP are larger than the widths of the electrodes RME, the metal layers FML may not be formed at some locations of the sub-openings SOP, and thus, the ink may spread. Accordingly, the widths of the plurality of sub-openings SOP may be equal to or less than the widths of the electrodes RME.

For example, a width W10 of the first sub-opening SOP1 may be smaller than a width W11 of the second electrode RME2. In another embodiment, the width W10 of the first sub-opening SOP1 may be equal to the width W11 of the second electrode RME2. A width W20 of the second sub-opening SOP2 may be smaller than a width W21 of the third electrode RME3. In another embodiment, the width W20 of the second sub-opening SOP2 may be equal to the width W21 of the third electrode RME3. A width W30 of the third sub-opening SOP3 may be smaller than a width W31 of the first electrode RME1. In another embodiment, the width W30 of the third sub-opening SOP3 may be equal to the width W31 of the first electrode RME1. A width W40 of the fourth sub-opening SOP4 may be smaller than a width W41 of the fourth electrode RME4. In another embodiment, the width W40 of the fourth sub-opening SOP4 may be equal to the width W41 of the fourth electrode RME4.

The first insulating layer PAS1 may include a plurality of contact openings (e.g., contact holes) CNT exposing the electrodes RME thereunder in the plurality of sub-openings SOP, respectively. The plurality of contact openings CNT may include a first contact opening CNT1 overlapping the first electrode RME1, a second contact opening CNT2 overlapping the second electrode RME2, a third contact opening CNT3 overlapping the third electrode RME3, and a fourth contact opening CNT4 overlapping the fourth electrode RME4. The first contact opening CNT1 may overlap the third sub-opening SOP3, the second contact opening CNT2 may overlap the first sub-opening SOP1, the third contact opening CNT3 may overlap the second sub-opening SOP2, and the fourth contact opening CNT4 may overlap the fourth sub-opening SOP4. The width of the plurality of contact openings CNT may be equal to or less than the width of the plurality of sub-openings SOP in order to form the metal layers FML on the electrodes RME under the first insulating layer PAS1.

For example, a width W33 of the first contact opening CNT1 may be smaller than the width W30 of the third sub-opening SOP3. In another embodiment, the width W33 of the first contact opening CNT1 may be equal to the width W30 of the third sub-opening SOP3. The width W13 of the second contact opening CNT2 may be smaller than the width W10 of the first sub-opening SOP1. In another embodiment, the width W13 of the second contact hole CNT2 may be equal to the width W10 of the first sub-opening SOP1. A width W23 of the third contact opening CNT3 may be smaller than the width W20 of the second sub-opening SOP2. In another embodiment, the width W23 of the third contact opening CNT3 may be equal to the width W20 of the second sub-opening SOP2. A width W43 of the fourth contact opening CNT4 may be smaller than the width W40 of the fourth sub-opening SOP4. In another embodiment, the width W43 of the fourth contact opening CNT4 may be equal to the width W40 of the fourth sub-opening SOP4.

Also, the widths of the plurality of sub-openings SOP may be equal to the widths of the metal layers FML, respectively. In addition, because the metal layers FML are formed on the electrodes RME exposed by the plurality of contact openings CNT, the widths of the plurality of contact openings CNT may be substantially equal to the widths of the metal layers FML.

For example, the width W10 of the first sub-opening SOP1 may be equal to the width W12 of the first metal layer FML1, and the width W13 of the second contact opening CNT2 may be equal to the width W12 of the first metal layer FML1. The width W20 of the second sub-opening SOP2 may be equal to the width W22 of the second metal layer FML2, and the width W23 of the third contact opening CNT3 may be equal to the width W22 of the second metal layer FML2. The width W30 of the third sub-opening SOP3 may be equal to the width W32 of the third metal layer FML3, and the width W33 of the first contact opening CNT1 may be equal to the width W32 of the third metal layer FML3. The width W40 of the fourth sub-opening SOP4 may be equal to the width W42 of the fourth metal layer FML4, and the width W43 of the fourth contact opening CNT4 may be equal to the width W42 of the fourth metal layer FML4.

The widths of the second contact CTD2, the third contact CTD3, and the fourth contact CTD4 may be equal to or smaller than the widths of the first sub-opening SOP1, the second sub-opening SOP2, and the fourth sub-opening SOP4, respectively. In addition, the widths of the second contact CTD2, the third contact CTD3, and the fourth contact CTD4 may be equal to or smaller than the widths of the first metal layer FML1, the second metal layer FML2, and the fourth metal layer FML4, respectively. Even though the widths of the contacts CTD2, CTD3, and CTD4 are less than the widths of the sub-openings SOP1, SOP2, and SOP4 and the widths of the metal layers FML1, FML2, and FML4, respectively, the exposed metal layers FML1, FML2, and FML4 are covered by the second insulating layer PAS2 and the third insulating layer PAS3 and are protected against from the outside.

For example, the width W14 of the second contact CTD2 may be smaller than each of the width W10 of the first sub-opening SOP1 and the width W12 of the first metal layer FML1. In another embodiment, the width W14 of the second contact CTD2 may be equal to each of the width W10 of the first sub-opening SOP1 and the width W12 of the first metal layer FML1. The width W24 of the third contact CTD3 may be smaller than each of the width W20 of the second sub-opening SOP2 and the width W22 of the second metal layer FML2. In another embodiment, the width W24 of the third contact CTD3 may be equal to each of the width W20 of the second sub-opening SOP2 and the width W22 of the second metal layer FML2. The width W44 of the fourth contact CTD4 may be smaller than each of the width W40 of the fourth sub-opening SOP4 and the width W42 of the fourth metal layer FML4. In another embodiment, the width W44 of the fourth contact CTD4 may be equal to each of the width W40 of the fourth sub-opening SOP4 and the width W42 of the fourth metal layer FML4.

In the display device 10 according to an embodiment of the present disclosure, in order to arrange the contacts CTD possibly causing the deviation of the light-emitting diodes ED outside the emission area EMA, the plurality of sub-openings SOP extended from the first main opening MOP1 may be located in the third bank BNL3. To prevent or substantially prevent the ink containing the light-emitting diodes ED from spreading to the sub-openings SOP, the metal layers FML may be formed on the electrodes RME exposed via the sub-openings SOP. In this manner, it is possible to prevent or substantially prevent the light-emitting diodes ED from deviating out of the emission area EMA during the process of applying the ink containing the light-emitting diodes ED.

Hereinafter, display devices according to other embodiments of the present disclosure will be described reference to other drawings.

Figure 24:
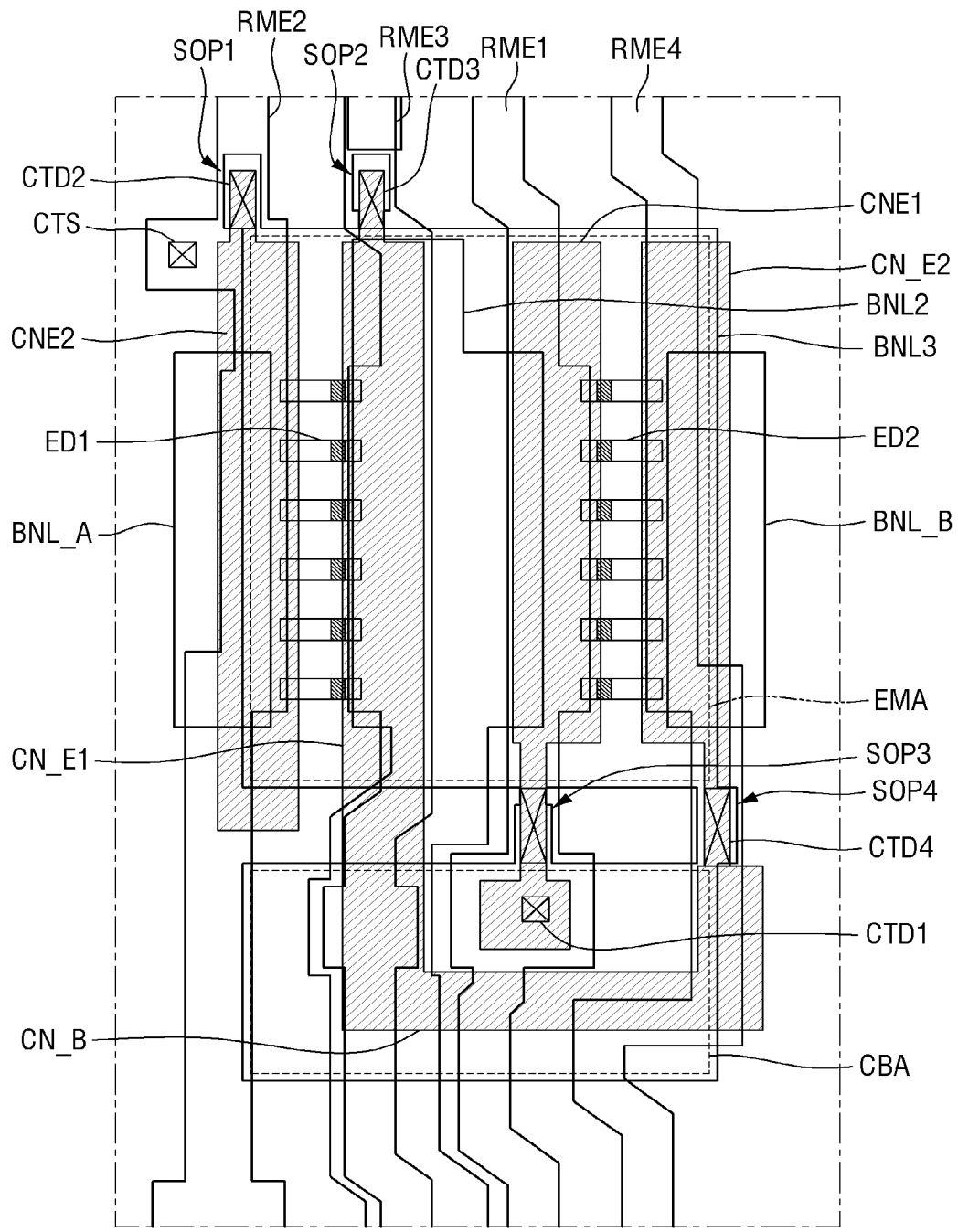
FIG. 24 is a plan view showing a sub-pixel of a display device according to an embodiment of the present disclosure.
Figure 25:
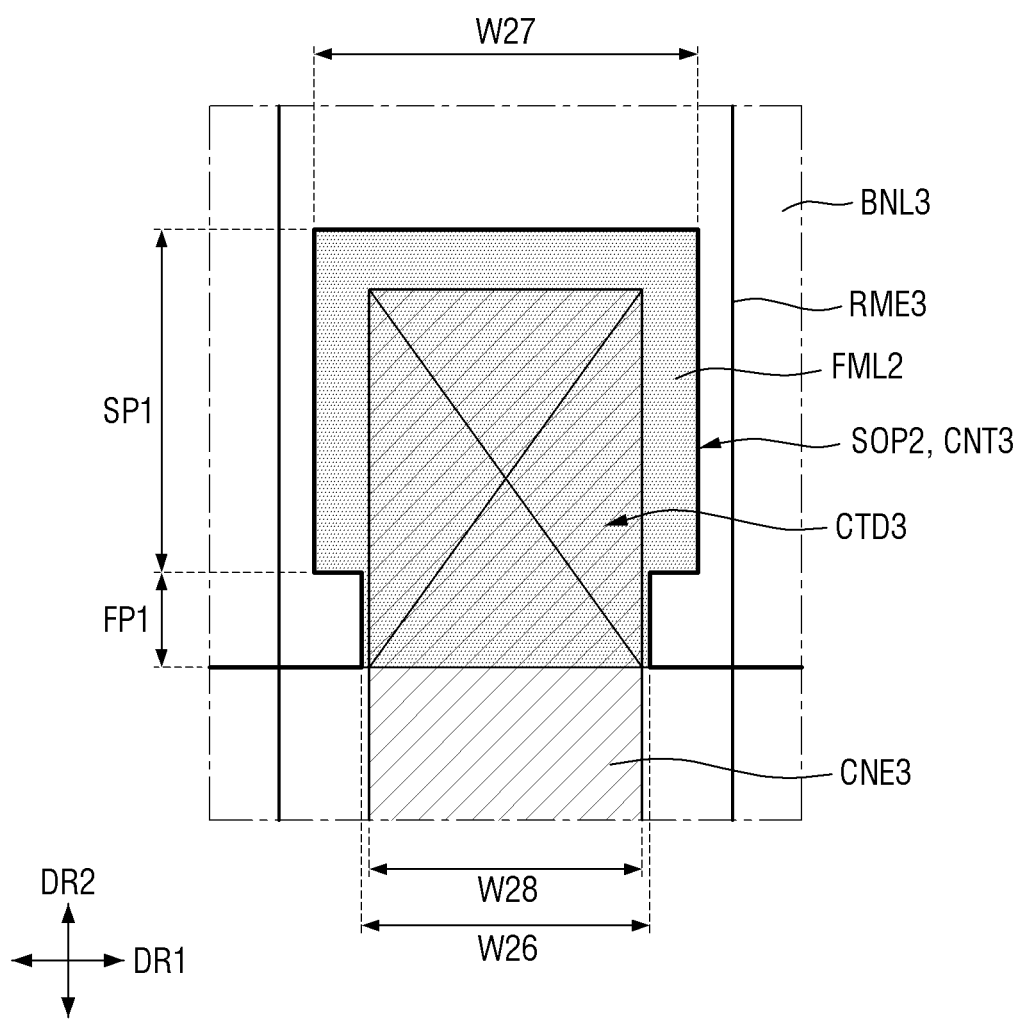
FIG. 25 is an enlarged plan view of a second sub-opening shown in FIG. 24.
Figure 26:
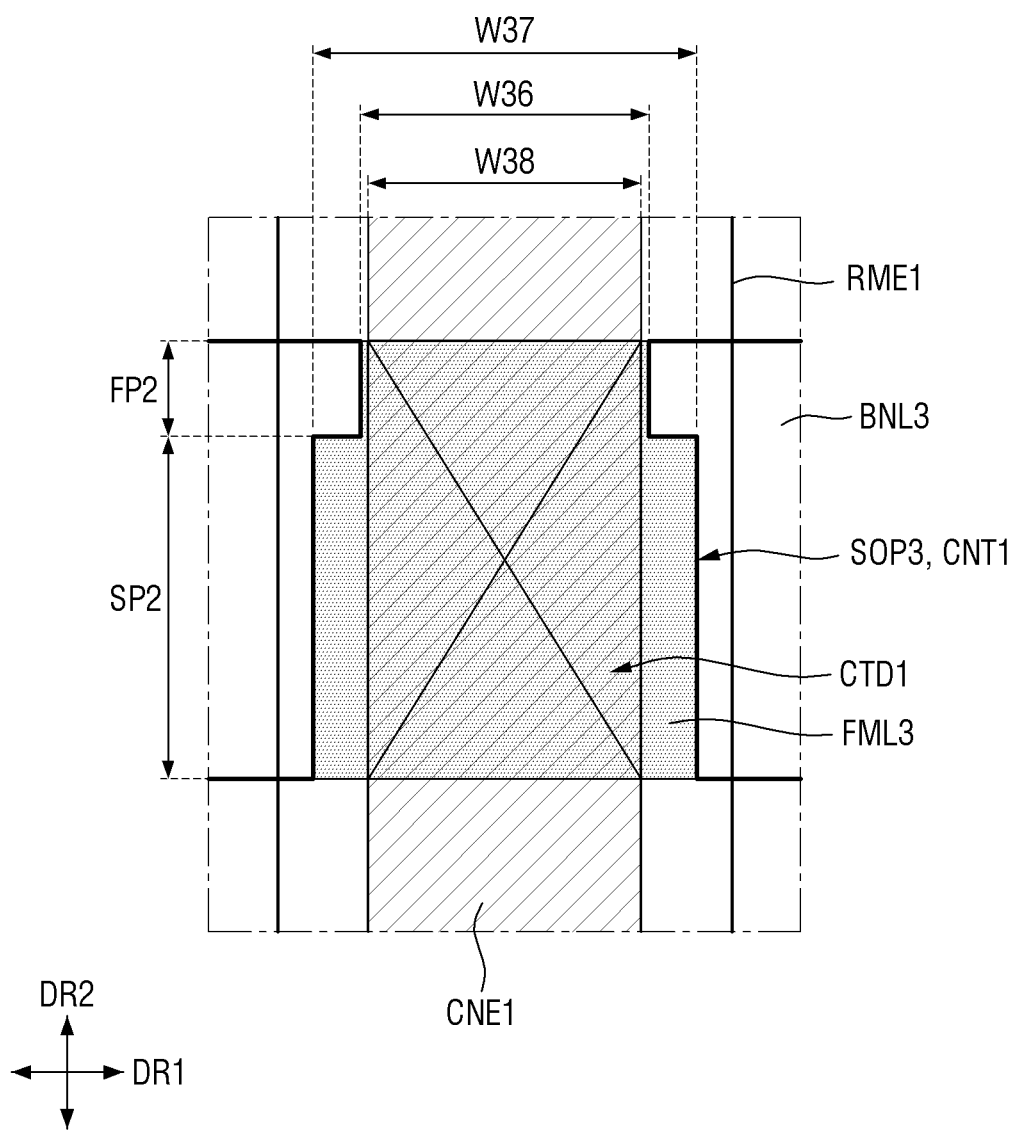
FIG. 26 is an enlarged plan view of a third sub-opening shown in FIG. 24.

FIG. 24 is a plan view showing a sub-pixel of a display device according to another embodiment of the present disclosure, FIG. 25 is an enlarged plan view of a second sub-opening shown in FIG. 24, and FIG. 26 is an enlarged plan view of a third sub-opening shown in FIG. 24.

Referring to FIGS. 24 to 26, the display device 10 according to another embodiment is different from the embodiment shown in FIGS. 15 to 23 in that the shapes of a second sub-opening SOP2 and a third sub-opening SOP3 are different when viewed from the top. In the following description, redundant descriptions will be omitted, and the second sub-opening SOP2 and the third sub-opening SOP3 will be primarily described.

According to an embodiment of the present disclosure, the second sub-opening SOP2 may be extended from the first main opening MOP1 in the second direction DR2. The second sub-opening SOP2 may include a first sub-region FP1 in contact with (e.g., open to) the first main opening MOP1 and a second sub-region SP1 extended from the first sub-region FP1 in the second direction DR2. The first sub-region FP1 may correspond to the inlet of the second sub-opening SOP2, and the second sub-region SP1 may correspond to the inner space of the second sub-opening SOP2.

Each of the first sub-region FP1 and the second sub-region SP1 may have a width in the first direction DR1. A width W26 of the first sub-region FP1 may be less than a width W27 of the second sub-region SP1. As described above, the second metal layer FML2 may be formed in the second sub-opening SOP2 to prevent or substantially prevent the spread of the ink containing the light-emitting diodes ED. According to an embodiment of the present disclosure, it is possible to prevent or substantially prevent the spread of the ink by reducing the width of the second sub-opening SOP2 in contact with (or open to) the first main opening MOP1. To this end, the width W26 of the first sub-region FP1 may be smaller than the width W27 of the second sub-region SP1.

The second sub-opening SOP2 may overlap the third connection electrode CNE3. The width W26 of the first sub-region FP1 may be equal to or larger than the width W28 of the third connection electrode CNE3. When the width W26 of the first sub-region FP1 is equal to or larger than the width W28 of the third connection electrode CNE3, it is possible to prevent or substantially prevent the third connection electrode CNE3 from being disconnected or deposited improperly due to the level difference of the third bank BML3.

The third sub-opening SOP3 may be extended from the first main opening MOP1 in the second direction DR2 to be connected to the second main opening MOP2. The third sub-opening SOP3 may include a third sub-region FP2 in contact with (e.g., open to) the first main opening MOP1 and a fourth sub-region SP2 extended from the third sub-region FP2 in the second direction DR2. The third sub-region FP2 may correspond to the inlet of the third sub-opening SOP3, and the fourth sub-region SP2 may correspond to the outlet of the third sub-opening SOP3.

Each of the third sub-region FP2 and the fourth sub-region SP2 may have a width in the first direction DR1. A width W36 of the third sub-region FP2 may be less than a width W37 of the fourth sub-region SP2. As described above, the third metal layer FML3 may be formed in the third sub-opening SOP3 to prevent or substantially prevent the spread of the ink containing the light-emitting diodes ED. According to an embodiment of the present disclosure, it is possible to prevent or substantially prevent the spread of the ink by reducing the width of the third sub-opening SOP3 in contact with (or open to) the first main opening MOP1. To this end, the width W36 of the third sub-region FP2 may be smaller than the width W37 of the fourth sub-region SP2.

The third sub-opening SOP3 may overlap the first connection electrode CNE1. The width W36 of the third sub-region FP2 may be larger than or equal to the width W38 of the first connection electrode CNE1. When the width W36 of the third sub-region FP2 is equal to or larger than the width W38 of the first connection electrode CNE1, it is possible to prevent or substantially prevent the first connection electrode CNE1 from being disconnected or deposited improperly due to the level difference of the third bank BML3.

Figure 27:
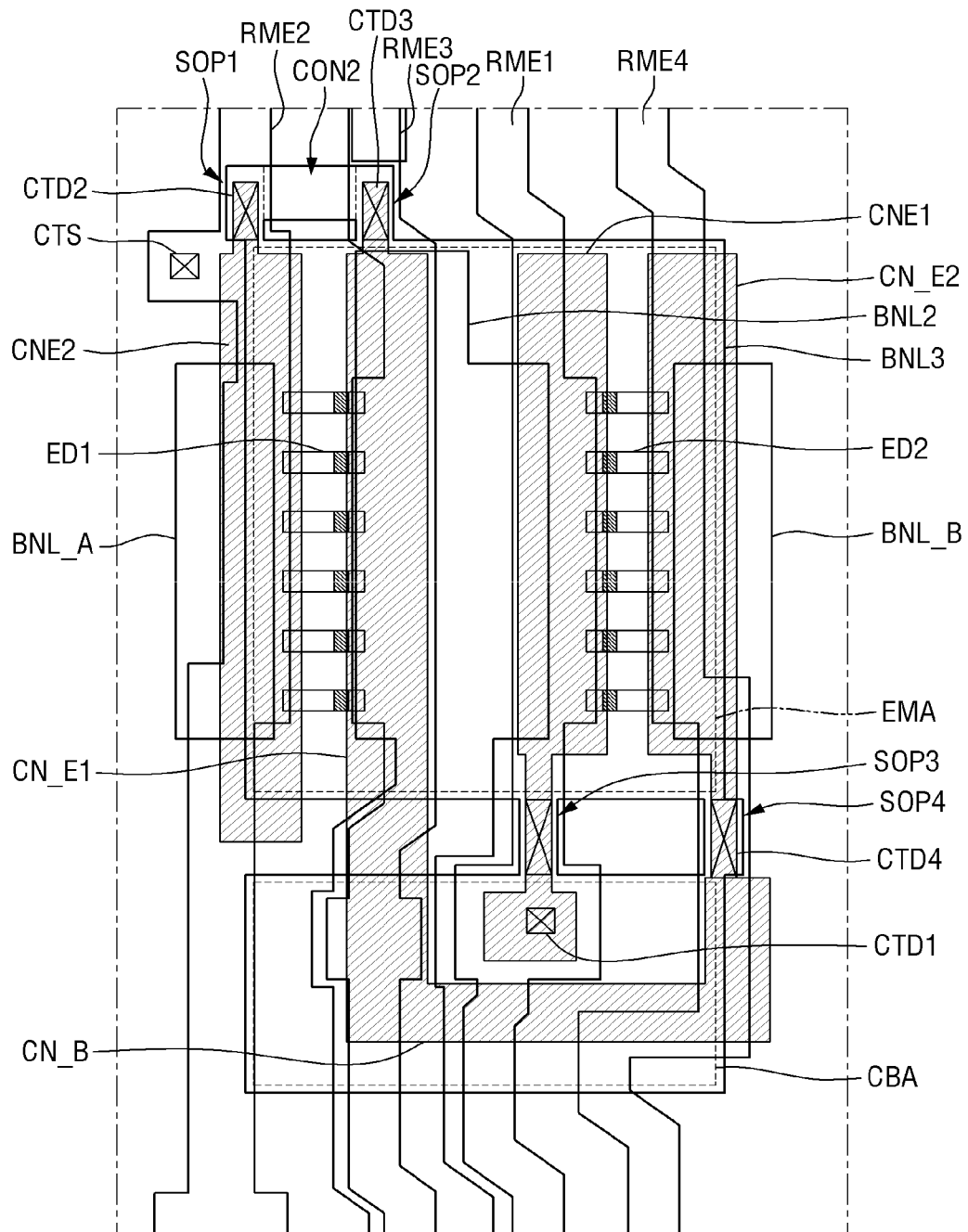
FIG. 27 is a plan view showing a sub-pixel of a display device according to an embodiment of the present disclosure.
Figure 28:
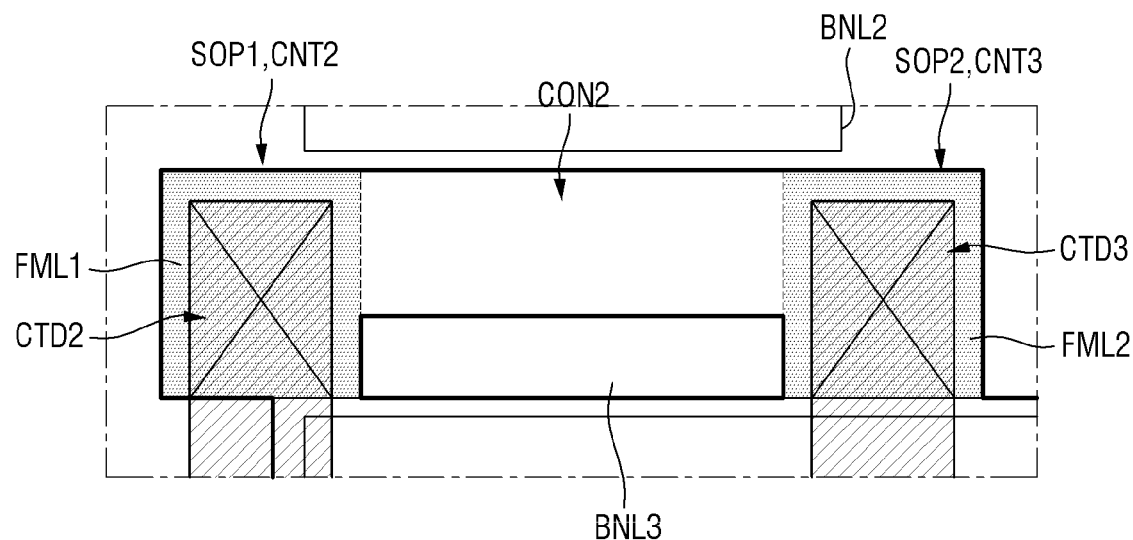
FIG. 28 is an enlarged plan view of a first sub-opening and a second sub-opening shown in FIG. 27.
Figure 28:
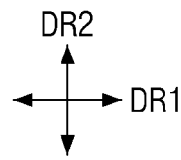

FIG. 27 is a plan view showing a sub-pixel of a display device according to another embodiment of the present disclosure, and FIG. 28 is an enlarged plan view of a first sub-opening and a second sub-opening shown in FIG. 27.

Referring to FIGS. 27 and 28, a display device according to another embodiment is different from the display devices according to the embodiments shown in FIGS. 15 to 26 in that the shapes of first and second sub-openings SOP1 and SOP2 are different when viewed from the top. In the following description, redundant descriptions will be omitted and the different first and second sub-openings SOP1 and SOP2 will be primarily described.

According to an embodiment of the present disclosure, the first and second sub-openings SOP1 and SOP2 may be connected to each other by a second connection opening CON2 at a position spaced apart from the first main opening MOP1. The second connection opening CON2 may be disposed to be spaced apart from the first main opening MOP1 in the second direction DR2 and may be extended in the first direction DR1. The second connection opening CON2 may be formed by removing a part of the second bank BL2 and the third bank BNL3 and may expose the first insulating layer PAS1 thereunder.

The first sub-opening SOP1 may overlap the second contact opening CNT2 in the first insulating layer PAS1, and the second sub-opening SOP2 may overlap the third contact opening CNT3 in the first insulating layer PAS1. On the other hand, the second connection opening CON2 may overlap the first insulating layer PAS1 and may be spaced apart from the second contact opening CNT2 and the third contact opening CNT3. The second connection opening CON2 may be located between the second contact opening CNT2 and the third contact opening CNT3.

In addition, the metal layers FML1 and FML2 may be disposed in the contact openings CNT2 and CNT3 of the first and second sub-openings SOP1 and SOP2, respectively. On the other hand, no contact opening is formed in the second connection opening CON2 but the first insulating layer PAS1 is disposed, and thus, it may not overlap the metal layers FML1 and FML2. Because it is possible to prevent or substantially prevent the ink containing the light-emitting diodes ED from spreading by the metal layers FML1 and FML2 of the first and second sub-openings SOP1 and SOP2, the ink does not spread to the second connection opening CON2. Accordingly, the metal layers FML1 and FML2 may be omitted from (e.g., may not extend into) the second connection opening CON2.

According to an embodiment of the present disclosure, by connecting the first and second sub-openings SOP1 and SOP2 by using the second connection opening CON2, the patterning size of the first and second sub-openings SOP1 and SOP2 can be increased so that the process can made easier.

Hereinafter, a method of fabricating the display device 10 will be described in detail with reference to other drawings.

FIGS. 29 to 34 are cross-sectional views showing some of processing steps of fabricating a display device according to an embodiment of the present disclosure. In the following description, the display device according to the embodiment shown in FIG. 5 will be described as an example.

Figure 29:
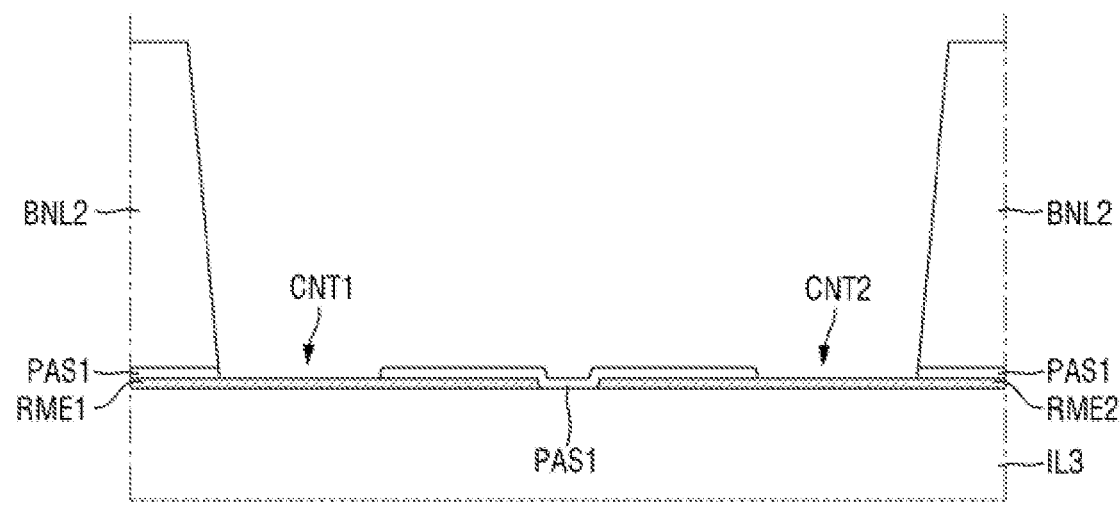
FIGS. 29 to 34 are cross-sectional views showing some processing steps of fabricating a display device according to an embodiment of the present disclosure.

Initially, referring to FIG. 29, a target substrate on which a third interlayer dielectric layer IL3 has been formed is prepared. A plurality of transistors and a plurality of lines may be disposed under the third interlayer dielectric layer IL3. A first electrode RME1 and a second electrode RME2 are formed on the third interlayer dielectric layer IL3. The first electrode RME1 and the second electrode RME2 may include (or may be made of) a metal, such as aluminum.

A first insulating layer PAS1 is stacked on the first electrode RME1 and the second electrode RME2 formed on the third interlayer insulating layer IL3. The first insulating layer PAS1 is then patterned to form a first contact opening CNT1 and a second contact opening CNT2. The first contact opening CNT1 overlaps the first electrode RME1 to expose the first electrode RME1, and the second contact opening CNT2 overlaps the second electrode RME2 to expose the second electrode RME2.

Figure 30:
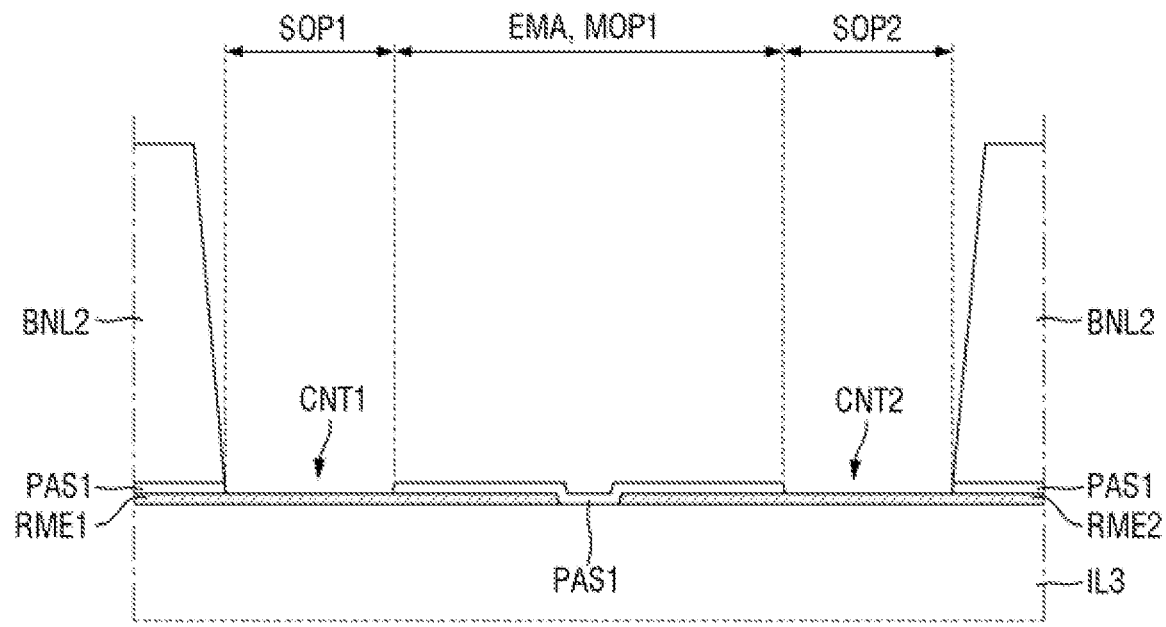

Subsequently, referring to FIG. 30, an organic material is coated over the first insulating layer PAS1 on the first interlayer dielectric layer IL3 and is then patterned to form a second bank BNL2 having a first main opening MOP1, a first sub-opening SOP1, and a second sub-opening SOP2. The first main opening MOP1 may be an emission area EMA in which light-emitting diodes are aligned. The first sub-opening SOP1 and the second sub-opening SOP2 are extended from the first main opening MOP1 to expose the first contact opening CNT1 and the second contact opening CNT2, respectively. The second bank BNL2 may be formed after a first bank has been formed.

Figure 31:
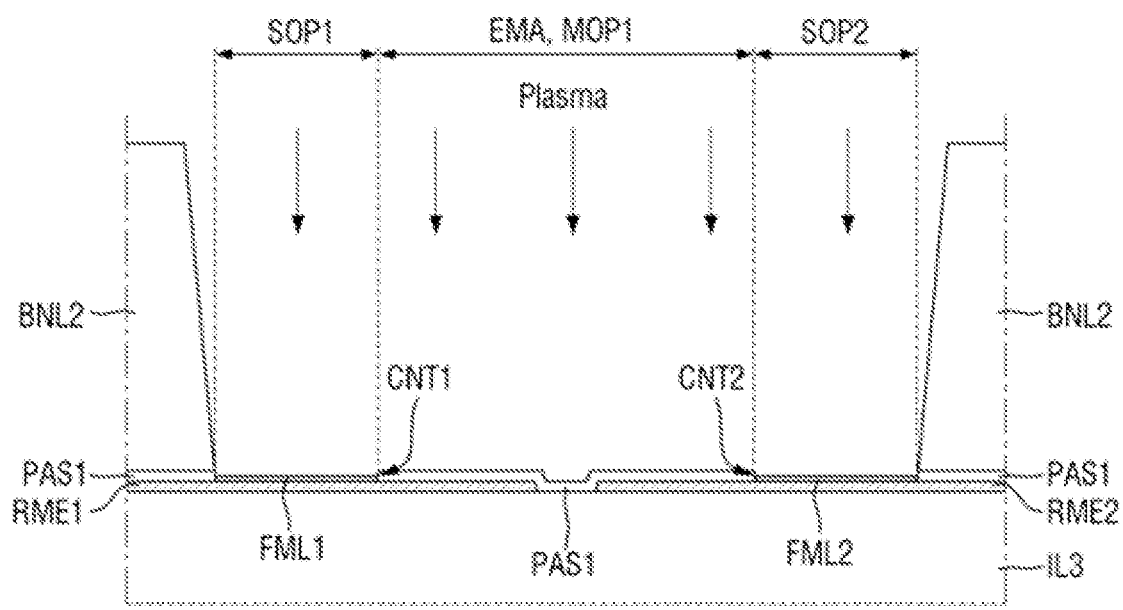

Subsequently, referring to FIG. 31, the target substrate, on which the second bank BNL2 is formed, is subjected to plasma treatment (e.g., is plasma treated). The plasma treatment may be carried out by injecting a reactive gas including (or containing) fluorine (F). For example, the plasma treatment may be carried out by using a reactive gas including (or containing) fluorine (F), such as carbon tetrafluoride ($CF_4$), nitrogen trifluoride ($NF_3$), and sulfur hexafluoride ($SF_6$). The surface of the first electrode RME1 exposed via the first contact opening CNT1 and the surface of the second electrode RME2 exposed via the second contact opening CNT2 are combined with the reactive gas (e.g., fluorine) to form metal layers. For example, the first metal layer FML1 is formed on the first electrode RME1, and the second metal layer FML2 is formed on the second electrode RME2. The components of the metal layers FML1 and FML2 may vary depending on the metal material (e.g., the material of the metal layers) combined with the reactive gas (e.g., fluorine). According to an embodiment of the present disclosure, the first electrode RME1 and the second electrode RME2 may include (or may be made of) aluminum (Al), and the first metal layer FML1 and the second metal layer FML2 may be made of aluminum fluoride ($AlF_3$).

Figure 32:
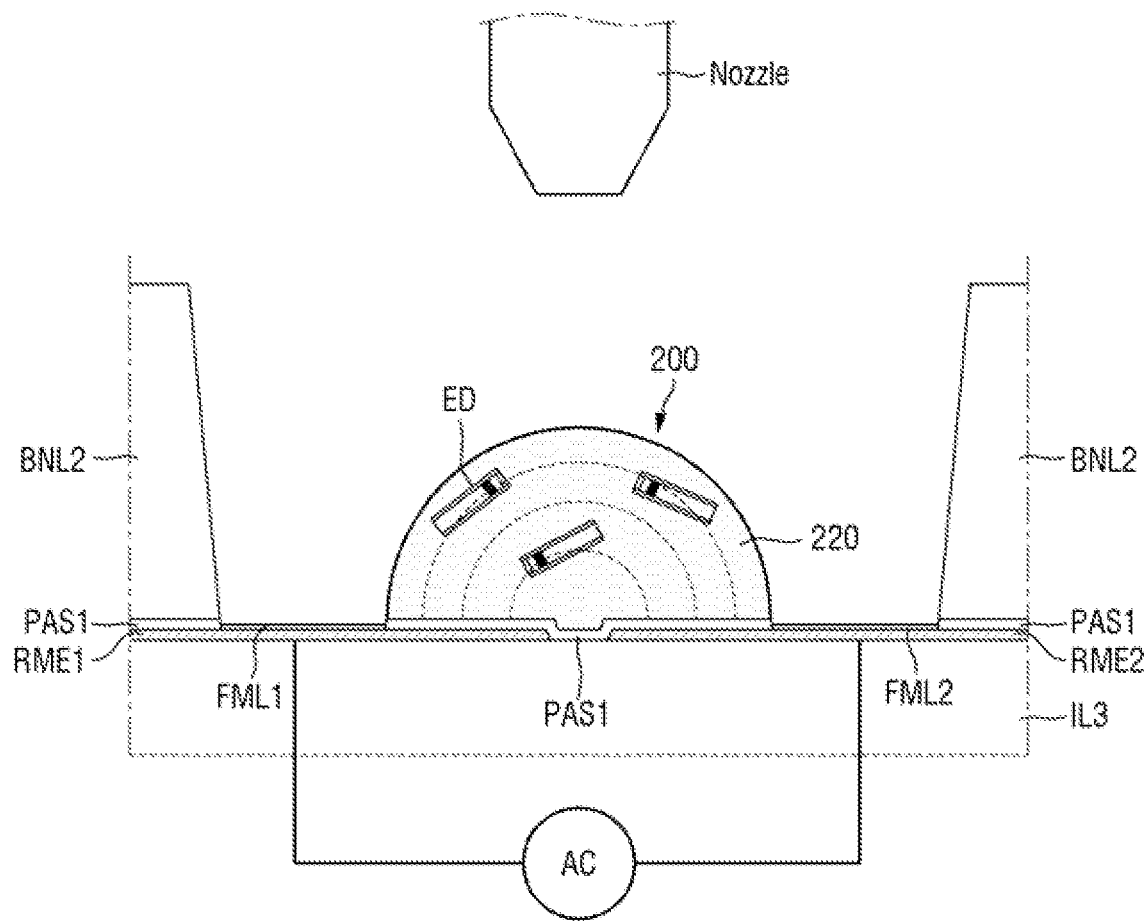
Figure 33:
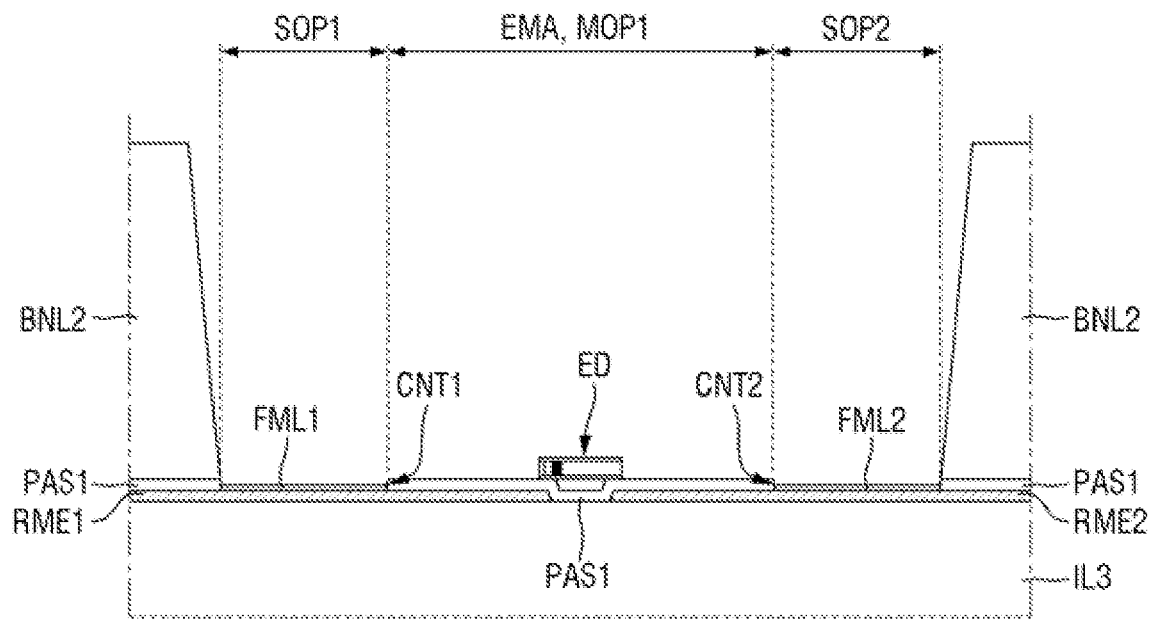

Subsequently, referring to FIGS. 32 and 33, the ink 200 containing the light-emitting diodes ED is ejected onto the target substrate. According to an embodiment of the present disclosure, droplets of the ink 200 may be ejected onto the first insulating layer PAS1 via a printing process using an inkjet printing apparatus. The droplets of the ink 200 may be ejected through a nozzle of an inkjet head included in the inkjet printing apparatus. The ink 200 may flow along an internal path formed in the inkjet head and may be discharged onto the target substrate through the nozzle. The droplets of the ink 200 discharged from the nozzle may sit on the first insulating layer PAS1 where the electrodes RME1 and RME2 are formed. The light-emitting diodes ED may have a shape extending in a direction, and may be dispersed in the ink 200 to be randomly oriented.

When the droplets of the ink 200 are ejected onto the first insulating layer PAS1, the ink 200 may evenly spread to the second bank BNL2 without overflowing the second bank BNL2. Accordingly, the light-emitting diodes ED dispersed in the ink 200 may be evenly distributed in the second bank BNL2.

According to an embodiment of the present disclosure, the metal layers FML1 and FML2 may have hydrophobicity. Because the metal layers FML1 and FML2 formed in the first sub-opening SOP1 and the second sub-opening SOP2 are hydrophobic, the ink 200 spreads only in the emission area EMA and not onto the metal layers FML1 and FML2.

Subsequently, an electric field is generated in the target substrate SUB to align the light-emitting diodes ED over the electrodes RME1 and RME2. When the ink 200 containing the light-emitting diodes ED is ejected, the electric field is generated by applying an alignment signal to the electrodes RME1 and RME2. The light-emitting diodes ED dispersed in a solvent 220 may receive a dielectrophoretic force by the electric field and may be disposed on the electrodes RME1 and RME2 with their orientations and locations changed.

When the electric field is generated, the light-emitting diodes ED may receive a dielectrophoretic force. When the electric field EL is generated parallel to the upper surface of the target substrate, the light-emitting diodes ED are aligned so that they are extended in parallel to the target substrate, such that they may be disposed on the first electrode RME1 and the second electrode RME2. The light-emitting diodes ED may move toward the electrodes RME1 and RME2 from their initially dispersed locations by the dielectrophoretic force. Opposite ends of each of the light-emitting diodes ED may be disposed on the first electrode RME1 and the second electrode RME2, respectively, while their locations and orientations are changed by the electric field. Each of the light-emitting diodes ED may include semiconductor layers doped with impurities of different conductivity types and may have a dipole moment within therein. The light-emitting diodes ED having the dipole moment may receive the dielectrophoretic force so that the opposite ends are disposed on the electrodes RME1 and RME2, respectively, when they are placed under the electric field.

After the light-emitting diodes ED have been disposed (e.g., aligned) between the electrodes RME1 and RME2, heat is applied to the target substrate to remove (e.g., to evaporate) the solvent 220. The process of removing the solvent 220 may be performed in a chamber with adjustable internal pressure. The internal pressure of the chamber can be adjusted, and the solvent 220 can be removed by irradiating heat on the target substrate with the pressure adjusted.

Figure 34:
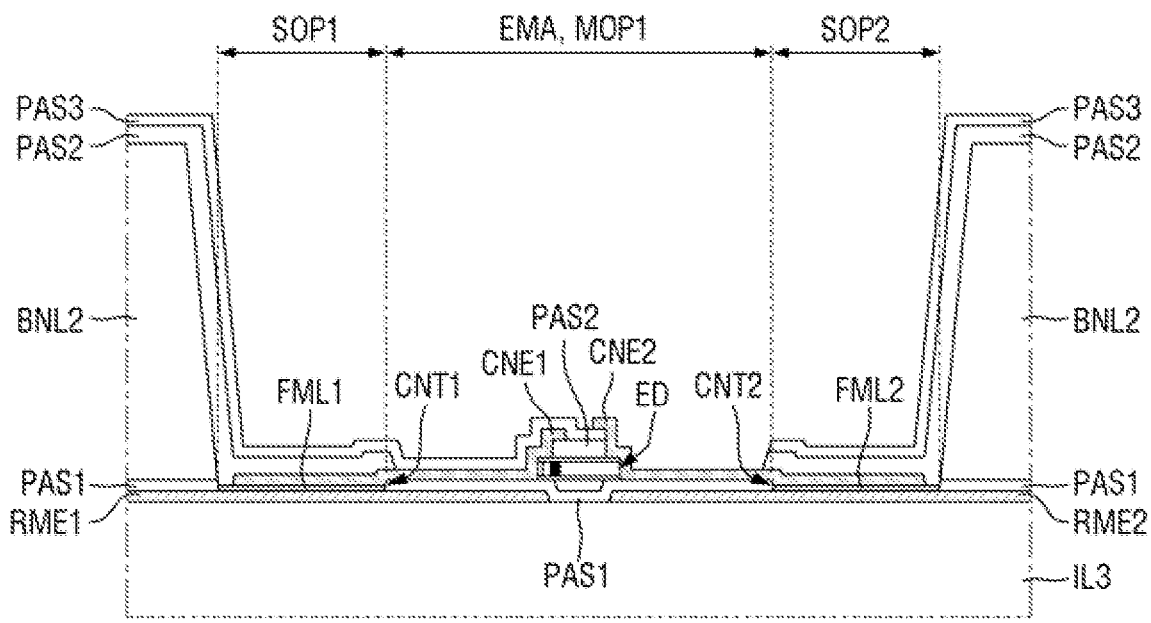

Subsequently, referring to FIG. 34, a second insulating layer PAS2, a first connection electrode CNE1, a third insulating layer PAS3, and a second connection electrode CNE2 may be formed in this order (e.g., may be sequentially formed) on the target substrate on which the light-emitting diodes ED are aligned. In this manner, a display device can be fabricated.

In concluding the detailed description, those skilled in the art will appreciate that many variations and modifications can be made to the example embodiments without departing from the spirit of the present disclosure. Therefore, the disclosed embodiments of the disclosure are to be understood in a generic and descriptive sense and not for purposes of limitation.

What is claimed is:

1. A display device comprising:
 a first substrate;
 a bank on the first substrate, the bank having a first main opening defining an emission area and a plurality of sub-openings extending from and open to the first main opening, the first main opening and the sub-openings together forming a closed shape surrounded by the bank in a plan view;
 a first electrode and a second electrode on the first substrate, the first and second electrodes being spaced apart from each other in a first direction and extending in a second direction;

a plurality of light-emitting elements on the first electrode and the second electrode, the light-emitting elements being spaced apart from each other in the second direction;

a first connection electrode on the first electrode and contacting first ends of the light-emitting elements; and a second connection electrode on the second electrode and contacting second ends of the light-emitting elements, wherein the first connection electrode is connected to the first electrode through a first contact on the first electrode, and the second connection electrode is connected to the second electrode through a second contact on the second electrode, and wherein the first contact and the second contact overlap the plurality of sub-openings.

2. The display device of claim 1, wherein the plurality of sub-openings comprises a first sub-opening overlapping the first contact and a second sub-opening overlapping the second contact.

3. The display device of claim 2, wherein a width of the first sub-opening is equal to or less than a width of the first electrode, and a width of the second sub-opening is equal to or less than a width of the second electrode.

4. The display device of claim 2, further comprising:
a first metal layer overlapping the first sub-opening and being between the first electrode and the first connection electrode; and
a second metal layer overlapping the second sub-opening and being between the second electrode and the second connection electrode.

5. The display device of claim 4, wherein a width of the first sub-opening is equal to or less than a width of the first metal layer, and a width of the second sub-opening is equal to or less than a width of the second metal layer.

6. The display device of claim 5, further comprising a first insulating layer between the first electrode and the first connection electrode and between the second electrode and the second connection electrode,
wherein the first insulating layer has a first contact opening overlapping the first sub-opening and exposing the first electrode and a second contact opening overlapping the second sub-opening and exposing the second electrode.

7. The display device of claim 6, wherein the first metal layer and the first contact opening overlap each other and have a same width, and the second metal layer and the second contact opening overlap each other and have a same width.

8. The display device of claim 7, wherein a width of the first contact is equal to or less than the width of the first sub-opening, the width of the first metal layer, and a width of the first contact opening, and
wherein a width of the second contact is equal to or less than the width of the second sub-opening, the width of the second metal layer, and a width of the second contact opening.

9. The display device of claim 2, further comprising a first connection opening spaced apart from the first main opening in the second direction and extending between the first sub-opening and the second sub-opening to connect the first sub-opening with the second sub-opening.

10. The display device of claim 9, wherein the first connection opening is between the first contact and the second contact and overlaps neither the first contact nor the second contact.

11. The display device of claim 1, wherein each of the plurality of sub-openings has a first region contacting the first main opening and a second region extending from the first region.

12. The display device of claim 11, wherein a width of the first region is smaller than a width of the second region.

13. The display device of claim 11, wherein a width of the first region is equal to or less than a width of the first electrode or the second electrode.

14. A display device comprising:
a first substrate;
a first electrode and a second electrode on the first substrate, the first and second electrode being spaced apart from each other in a first direction and extending in a second direction;
a plurality of light-emitting elements on the first electrode and the second electrode and spaced apart from each other in the second direction;
a first connection electrode on the first electrode and contacting first ends of the light-emitting elements;
a second connection electrode on the second electrode and contacting second ends of the light-emitting elements;
a first metal layer between the first electrode and the first connection electrode and contacting each of the first electrode and the first connection electrode; and
a second metal layer between the second electrode and the second connection electrode and contacting each of the second electrode and the second connection electrode,
wherein the first metal layer covers only a portion of the first electrode, and the second metal layer covers only a portion of the second electrode.

15. The display device of claim 14, wherein the first metal layer overlaps a first contact connecting the first electrode with the first connection electrode, and
wherein the second metal layer overlaps a second contact connecting the second electrode with the second connection electrode.

16. The display device of claim 15, further comprising a bank on the first substrate, the bank having a first main opening defining an emission area and a plurality of sub-openings extending from the first main opening.

17. The display device of claim 16, wherein the plurality of sub-openings does not overlap the emission area and overlaps the first metal layer and the second metal layer.

18. The display device of claim 16, wherein the bank has a second main opening spaced apart from the first main opening in the second direction, and
wherein at least one of the plurality of sub-openings connects the first main opening with the second main opening.

19. The display device of claim 14, wherein the first metal layer comprises fluorine, and
wherein the second metal layer comprises fluorine.

20. A display device comprising:
a first substrate;
a first electrode and a second electrode on the first substrate, the first and second electrodes being spaced apart from each other in a first direction and extending in a second direction;
a third electrode spaced apart from the first electrode and the second electrode in the first direction and being between the first electrode and the second electrode;
a fourth electrode spaced apart from the first electrode in the first direction;
a bank on the first substrate, the bank having a first main opening defining an emission area and a plurality of sub-openings extending from the first main opening;

light-emitting elements comprising a first light-emitting element having opposite ends on the first electrode and the fourth electrode, respectively, and a second light-emitting element having one end on the second electrode;

a first connection electrode on the first electrode and contacting the first light-emitting element;

a second connection electrode on the second electrode and contacting the second light-emitting element; and a third connection electrode on the third electrode and contacting the first light-emitting element, wherein the first connection electrode is connected to the first electrode through a first contact on the first electrode, the second connection electrode is connected to the second electrode through a second contact on the second electrode, and a third connection electrode is connected to the third electrode through a third contact on the third electrode and a fourth contact on the fourth electrode, and wherein the second contact, the third contact, and the fourth contact overlap the plurality of sub-openings.

21. The display device of claim 20, wherein the plurality of sub-openings does not overlap the emission area and comprises a first sub-opening overlapping the second contact, a second sub-opening overlapping the third contact, a fourth sub-opening overlapping the fourth contact, and a third sub-opening spaced apart from the first contact.

22. The display device of claim 21, wherein the bank has a second main opening spaced apart from the first main opening in the second direction, and wherein the first contact is in the second main opening.

23. The display device of claim 22, wherein the third sub-opening and the fourth sub-opening continuously connect the first main opening with the second main opening.

* * * * *